US012391850B2

(12) United States Patent
Adamchuk et al.

(10) Patent No.: US 12,391,850 B2
(45) Date of Patent: Aug. 19, 2025

(54) DIELECTRIC SUBSTRATE AND METHOD OF FORMING THE SAME

(71) Applicant: VERSIV COMPOSITES LIMITED, Kilrush (IE)

(72) Inventors: Jennifer Adamchuk, Marlborough, MA (US); Dale Thomas, Rochdale (GB); Meghann White, Bedford, NH (US); Sethumadhavan Ravichandran, Shrewsbury, MA (US); Gerard T. Buss, Bedford, NH (US)

(73) Assignee: VERSIV COMPOSITES LIMITED, Kilrush (IE)

( * ) Notice: Subject to any disclaimer, the term of this patent is extended or adjusted under 35 U.S.C. 154(b) by 0 days.

(21) Appl. No.: 17/643,450

(22) Filed: Dec. 9, 2021

(65) Prior Publication Data
US 2022/0186082 A1 Jun. 16, 2022

Related U.S. Application Data

(60) Provisional application No. 63/126,109, filed on Dec. 16, 2020.

(51) Int. Cl.
*C09J 7/29* (2018.01)
*B32B 7/12* (2006.01)
(Continued)

(52) U.S. Cl.
CPC ............... *C09J 7/29* (2018.01); *B32B 7/12* (2013.01); *B32B 15/08* (2013.01); *B32B 15/20* (2013.01);
(Continued)

(58) Field of Classification Search
CPC ............... H05K 2201/00; H05K 2201/0154
See application file for complete search history.

(56) References Cited

U.S. PATENT DOCUMENTS

| 4,335,180 A | 6/1982 | Traut |
| 4,634,631 A | 1/1987 | Gazit et al. |
(Continued)

FOREIGN PATENT DOCUMENTS

| CN | 101365294 B | 6/2010 |
| CN | 102471590 B | 5/2012 |
(Continued)

OTHER PUBLICATIONS

International Search Report and Written Opinion for PCT Application No. PCT/US2021/070953, dated Nov. 16, 2021, 9 pages.
(Continued)

*Primary Examiner* — Ian A Rummel
(74) *Attorney, Agent, or Firm* — CANTOR COLBURN LLP

(57) ABSTRACT

The present disclosure relates to a dielectric substrate that may include a first fluoropolymer based adhesive layer, a polyimide layer overlying the fluoropolymer based adhesive layer, and a first filled polymer layer overlying the polyimide layer. The first filled polymer layer may include a resin matrix component, and a first ceramic filler component. The first ceramic filler component may include a first filler material. The first filler material may further have a mean particle size of at not greater than about 10 microns.

17 Claims, 9 Drawing Sheets

(51) Int. Cl.

| | | |
|---|---|---|
| *B32B 15/08* | (2006.01) | |
| *B32B 15/20* | (2006.01) | |
| *B32B 27/28* | (2006.01) | |
| *C09J 5/00* | (2006.01) | |
| *C09J 7/38* | (2018.01) | |
| *C09J 11/04* | (2006.01) | |
| *H05K 1/03* | (2006.01) | |
| *H05K 1/09* | (2006.01) | |
| *H05K 3/46* | (2006.01) | |

(52) U.S. Cl.
CPC ............... *B32B 27/281* (2013.01); *C09J 5/00* (2013.01); *C09J 7/381* (2018.01); *C09J 11/04* (2013.01); *H05K 1/0373* (2013.01); *H05K 1/09* (2013.01); *H05K 3/4644* (2013.01); *B32B 2255/10* (2013.01); *B32B 2255/26* (2013.01); *B32B 2264/1021* (2020.08); *B32B 2307/204* (2013.01); *B32B 2307/732* (2013.01); *B32B 2457/08* (2013.01); *C09J 2203/326* (2013.01); *C09J 2301/41* (2020.08); *C09J 2400/166* (2013.01); *C09J 2427/00* (2013.01); *C09J 2427/006* (2013.01); *C09J 2479/086* (2013.01); *H05K 2201/015* (2013.01); *H05K 2201/0154* (2013.01); *H05K 2201/0209* (2013.01)

(56) References Cited

U.S. PATENT DOCUMENTS

| | | | |
|---|---|---|---|
| 4,647,508 A | 3/1987 | Gazit et al. | |
| 4,661,301 A | 4/1987 | Okada et al. | |
| 4,784,901 A | 11/1988 | Hatakeyama et al. | |
| 4,849,284 A | 7/1989 | Arthur et al. | |
| 4,869,956 A * | 9/1989 | Bridges ................ | B32B 15/08 428/458 |
| 4,987,274 A | 1/1991 | Miller et al. | |
| 5,055,342 A | 10/1991 | Markovich et al. | |
| 5,061,548 A | 10/1991 | Arthur et al. | |
| 5,075,065 A | 12/1991 | Effenberger et al. | |
| 5,194,326 A | 3/1993 | Arthur et al. | |
| 5,281,466 A | 1/1994 | Arthur et al. | |
| 5,312,576 A | 5/1994 | Swei et al. | |
| 5,354,611 A | 10/1994 | Arthur et al. | |
| 5,374,453 A | 12/1994 | Swei et al. | |
| 5,384,181 A | 1/1995 | Arthur et al. | |
| 5,440,805 A | 8/1995 | Daigle et al. | |
| 5,506,049 A | 4/1996 | Swei et al. | |
| 5,607,744 A | 3/1997 | Diener et al. | |
| 5,879,794 A | 3/1999 | Korleski, Jr. | |
| 5,889,104 A | 3/1999 | Rosenmayer | |
| 5,922,453 A | 7/1999 | Horn, III et al. | |
| 6,172,139 B1 | 1/2001 | Swei et al. | |
| 6,373,717 B1 | 4/2002 | Downes, Jr. et al. | |
| 6,500,529 B1 | 12/2002 | McCarthy et al. | |
| 7,981,504 B2 | 7/2011 | Nelson | |
| 8,187,696 B2 | 5/2012 | Paul et al. | |
| 8,314,005 B2 | 11/2012 | Purushothaman et al. | |
| 8,530,746 B2 | 9/2013 | Zheng et al. | |
| 8,652,641 B2 | 2/2014 | Yang et al. | |
| 8,835,770 B2 | 9/2014 | Oyama et al. | |
| 9,258,892 B2 | 2/2016 | Crosley | |
| 9,462,688 B2 | 10/2016 | Park et al. | |
| 9,468,097 B2 | 10/2016 | Matsuda | |
| 9,485,877 B2 | 11/2016 | Hayashi | |
| 9,962,907 B2 | 5/2018 | Price et al. | |
| 10,096,398 B2 | 10/2018 | Janah et al. | |
| 10,164,326 B2 | 12/2018 | Urcia et al. | |
| 10,194,528 B2 | 1/2019 | Su | |
| 10,236,092 B2 | 3/2019 | Restuccia et al. | |
| 10,485,102 B2 | 11/2019 | Kaimori et al. | |
| 11,549,035 B2 | 1/2023 | Adamchuk et al. | |
| 11,818,838 B2 | 11/2023 | Chen et al. | |
| RE49,929 E | 4/2024 | Kaimori et al. | |
| 2004/0109298 A1 | 6/2004 | Hartman et al. | |
| 2005/0244662 A1 | 11/2005 | Horn, III et al. | |
| 2006/0062976 A1 | 3/2006 | Sohn et al. | |
| 2006/0180936 A1 | 8/2006 | Japp et al. | |
| 2007/0206364 A1 | 9/2007 | Swei et al. | |
| 2009/0038828 A1 | 2/2009 | Hou et al. | |
| 2009/0128912 A1 | 5/2009 | Okada et al. | |
| 2010/0015404 A1 | 1/2010 | Paul et al. | |
| 2012/0069288 A1 | 3/2012 | Das et al. | |
| 2012/0123021 A1 | 5/2012 | Yano et al. | |
| 2012/0189826 A1* | 7/2012 | Hayashi ............ | H01L 23/49894 428/212 |
| 2013/0163253 A1 | 6/2013 | Saito et al. | |
| 2015/0030824 A1 | 1/2015 | Crosley | |
| 2015/0195921 A1 | 7/2015 | Onodera et al. | |
| 2015/0366056 A1 | 12/2015 | Matsuda | |
| 2016/0007452 A1 | 1/2016 | Yan et al. | |
| 2016/0113113 A1 | 4/2016 | Sethumadhavan et al. | |
| 2016/0242274 A1 | 8/2016 | Hosoda et al. | |
| 2016/0280979 A1 | 9/2016 | Uchiyama et al. | |
| 2017/0145182 A1 | 5/2017 | Horn, III et al. | |
| 2017/0273188 A1 | 9/2017 | Su | |
| 2017/0275453 A1* | 9/2017 | Nakamata ........... | H01L 29/2003 |
| 2018/0019177 A1 | 1/2018 | Harada et al. | |
| 2018/0052488 A1 | 2/2018 | Posner et al. | |
| 2018/0339493 A1 | 11/2018 | Chen et al. | |
| 2019/0104612 A1 | 4/2019 | Amla | |
| 2019/0136109 A1 | 5/2019 | Agapov et al. | |
| 2019/0215947 A1 | 7/2019 | Du et al. | |
| 2020/0053877 A1 | 2/2020 | Liu et al. | |
| 2020/0270413 A1 | 8/2020 | Koes et al. | |
| 2020/0307162 A1 | 10/2020 | Remy et al. | |
| 2020/0323078 A1 | 10/2020 | Tosaka et al. | |
| 2020/0404782 A1 | 12/2020 | Chen et al. | |
| 2020/0413536 A1 | 12/2020 | Amla et al. | |
| 2021/0059048 A1 | 2/2021 | Wang et al. | |
| 2021/0060900 A1 | 3/2021 | Huang et al. | |
| 2021/0101366 A1 | 4/2021 | Nagata et al. | |
| 2022/0033617 A1 | 2/2022 | Adamchuk et al. | |
| 2022/0039254 A1 | 2/2022 | Adamchuk et al. | |
| 2022/0039256 A1 | 2/2022 | Adamchuk et al. | |
| 2022/0186081 A1 | 6/2022 | Adamchuk et al. | |
| 2022/0195253 A1 | 6/2022 | Adamchuk et al. | |
| 2023/0191750 A1 | 6/2023 | Adamchuk et al. | |
| 2023/0191761 A1 | 6/2023 | Adamchuk et al. | |

FOREIGN PATENT DOCUMENTS

| | | |
|---|---|---|
| CN | 102719043 A | 10/2012 |
| CN | 101838431 B | 11/2012 |
| CN | 102275341 B | 11/2013 |
| CN | 104053302 A | 9/2014 |
| CN | 104149420 A | 11/2014 |
| CN | 104476847 A | 4/2015 |
| CN | 105453705 A | 3/2016 |
| CN | 105802186 A | 7/2016 |
| CN | 105820481 A | 8/2016 |
| CN | 106188998 A | 12/2016 |
| CN | 106604536 A | 4/2017 |
| CN | 106671517 A | 5/2017 |
| CN | 106928744 A | 7/2017 |
| CN | 104647868 B | 9/2017 |
| CN | 107172819 A | 9/2017 |
| CN | 107177245 A | 9/2017 |
| CN | 107278031 A | 10/2017 |
| CN | 107429028 A | 12/2017 |
| CN | 107493653 A | 12/2017 |
| CN | 107509308 A | 12/2017 |
| CN | 106009428 B | 2/2018 |
| CN | 107722518 A | 2/2018 |
| CN | 207083283 U | 3/2018 |
| CN | 106113802 B | 4/2018 |
| CN | 106313840 A | 4/2018 |
| CN | 108456387 A | 8/2018 |
| CN | 106633180 A | 10/2018 |
| CN | 107474312 B | 2/2019 |
| CN | 106800733 B | 4/2019 |
| CN | 112519357 A | 3/2021 |

(56) References Cited

FOREIGN PATENT DOCUMENTS

| | | |
|---|---|---|
| EP | 0211979 A1 | 3/1987 |
| EP | 0279769 A2 | 8/1988 |
| EP | 0442363 A1 | 8/1991 |
| EP | 0769788 A2 | 4/1997 |
| EP | 1529812 A1 | 5/2005 |
| EP | 2179631 A2 | 4/2010 |
| EP | 2706088 A1 | 3/2014 |
| EP | 3028851 A1 | 6/2016 |
| EP | 3162561 A1 | 5/2017 |
| JP | H0349291 A | 3/1991 |
| JP | H08153940 A | 6/1996 |
| JP | 10017838 A | 1/1998 |
| JP | 2890747 B2 | 5/1999 |
| JP | 2002151844 A | 5/2002 |
| JP | 2005001274 A | 1/2005 |
| JP | 4129627 B2 | 8/2008 |
| JP | 2009152489 A | 7/2009 |
| JP | 4598408 B2 | 12/2010 |
| JP | 4815209 B2 | 11/2011 |
| JP | 2016003260 A | 1/2016 |
| JP | 2016020488 A | 2/2016 |
| JP | 2016102563 A | 6/2016 |
| JP | 2018039260 A | 3/2018 |
| JP | 6564517 B1 | 8/2019 |
| JP | 2020084038 A | 6/2020 |
| KR | 20050090560 A | 9/2005 |
| KR | 20060027666 A | 3/2006 |
| KR | 20060127172 A | 12/2006 |
| KR | 100823998 B1 | 4/2008 |
| KR | 20130074955 A | 7/2013 |
| KR | 20150006713 A | 1/2015 |
| KR | 20150113050 A | 10/2015 |
| KR | 101775287 B1 | 9/2017 |
| KR | 20170134610 A | 12/2017 |
| TW | I268859 B | 12/2006 |
| TW | I590722 | 7/2017 |
| TW | 201922905 A | 6/2019 |
| TW | 202100354 A | 1/2021 |
| WO | 9609339 A1 | 3/1996 |
| WO | 9845880 A1 | 10/1998 |
| WO | 2006078889 A2 | 7/2006 |
| WO | 2008004399 A2 | 1/2008 |
| WO | 2015182696 A1 | 12/2015 |
| WO | 2016104297 A1 | 6/2016 |
| WO | 2016201076 A1 | 12/2016 |
| WO | 2020091026 A1 | 5/2020 |
| WO | 2020137879 A1 | 7/2020 |
| WO | 20158604 A1 | 12/2021 |
| WO | 2022026989 A1 | 2/2022 |
| WO | 2022026990 A1 | 2/2022 |
| WO | 2022026991 A1 | 2/2022 |
| WO | 2022133402 A1 | 6/2022 |
| WO | 2022133403 A1 | 6/2022 |
| WO | 2022133404 A1 | 6/2022 |
| WO | 2023114838 A1 | 6/2023 |
| WO | 2023114843 A1 | 6/2023 |

OTHER PUBLICATIONS

International Search Report and Written Opinion for PCT Application No. PCT/US2021/070954, dated Nov. 16, 2021, 9 pages.
International Search Report and Written Opinion for PCT Application No. PCT/US2021/070955, dated Nov. 16, 2021, 9 pages.
Jawitz, M.W. et al., "Chapter 6: High-Speed/High-Frequency Laminates," In Materials for Rigid and Flexible Printed Wiring Boards, First Edition. CRC Press: New York, NY, pp. 113-131, dated 2006.
Murali, K.P. et al., "Preparation and properties of silica filled PTFE flexible laminates for microwave circuit applications," Elsevier, Composites: Part A, vol. 40, pp. 1179-1185, dated 2009.
Ratheesh, R. et al., "Chapter 11: Polymer-Ceramic Composites for Microwave Applications," In Microwave Materials and Applications, First Edition. Sebastian, M. T.; Ubic, R.; Jantunen, H.; John Wiley & Sons: Chichester, UK; Hoboken, NJ, pp. 481-535, dated 2017.
Sebastian, Mailadil T. et al., "Polymer-Ceramic Composites of 0-3 Connectivity for Circuits in Electronics: A Review," International Journal of Applied Ceramic Technology, vol. 7, No. 4, pates 415-434, dated 2010.
Zhuravlev, L.T., "The Surface Chemistry of Amorphous Silica. Zhuravlev Model," Colloids and Surfaces, A: Physiochemical and Engineering Aspects, vol. 173, pp. 1-38, dated Feb. 21, 2000.
Tsai, I-Shou et al., "A Study on the Fabrication Parameters and Dielectric Properties of PTFE Composites Filled with Al2O3 and Si)2 Nanoparticles," Journal of Industrial Textiles, vol. 40, No. 4, Apr. 20, 2011, pp. 361-379.
Yuan, Y. et al., "TiO2 and SiO2 Filled PTFE Composites for Microwave Substrate Applications," Journal of Polymer Research, vol. 21, Jan. 31, 2014, 6 pages.
Han, Kunkun et al., "Effect of Filler Structure on the Dielectric and Thermal Properties of SiO2/PTFE Composites," Journal of Materials Science: Materials in Electronics, Apr. 25, 2020, 7 pages.
Yuan, Ying et al., "Effect of Sintering Temperature on the Crystallization Behavior and Properties of Silica Filled PTFE Composites," Journal of Materials Science: Materials in Electronics, vol. 27, Aug. 5, 2016, pp. 13288-13293.
Yuan, Ying et al., "Effects of Compound Coupling Agents on the Properties of PTFE/SiO2 Microwave Composites," Journal of Materials Science: Materials in Electronics, vol. 28, Oct. 25, 2016, pp. 3356-3363.
Jiang, Zehua et al., "Effects of Particle Size Distribution of Silica on Properties of PTFE/SiO2 Composites," Materials Research Express, vol. 5, Jun. 22, 2018, 10 pages.
Xiang, Pang et al., "Effects of SiO2 Content on the Properties of PTFE/SiO2 Composites," Piezoelectrics & Acoustooptics, vol. 34, No. 4, Aug. 2012, pp. 577-580.
Yong, Xiao et al., "Effects of TiO2 Content on the Properties of PTFE/TiO2 Microwave Dielectric Composites," Piezoelectrics & Acoustooptics, vol. 34, No. 5, Oct. 2012, pp. 768-771.
Fields, Jeffrey T. et al., "Fluoroalkylsilanes in Silica/Fluoropolymer Composites," Polymer Composites, vol. 17, No. 2, Apr. 1996, pp. 242-250.
Chen-Yang, Yui Whei et al., "High-Performance Circuit Boards Based on Mesoporous Silica Filled PTFE Composite Materials," Electrochemical and Solid-State Letters, vol. 8, No. 1, dated 2005, pp. F1-F4.
Yuan, Ying et al., "Influence of SiO2 Addition on Properties of PTFE/TiO2 Microwave Composites," Journal of Electronic Materials, vol. 47, No. 1, Oct. 4, 2017, pp. 633-640.
Yan, Xiangyu et al., "Influences of Sintering Process on the Properties of SiO2—TiO2/PTFE Composites," Piezoelectrics & Acoustooptics, vol. 36, No. 2, Apr. 2014, pp. 270-274.
Rajesh, S. et al., "Microwave Dielectric Properties of PTFE/Rutile Nanocomposites," Journal of Alloys and Compounds, vol. 477, dated 2009, pp. 677-682.
Zhang, Dong-na et al., "Preparation and Characterization of PTFE-g-GMA modified PTFE/SiO2 Organic-Inorganic Hybrids," Journal of Polymer Research 19:9873, Apr. 25, 2012, 10 pages.
Zhang, Yao et al., "Preparation and Mechanical Properties of SiO2/Polytetrafluoroethylene Composite Films," Acta Materiae Compositae Sinica, vol. 36, No. 3, Mar. 2019, pp. 624-629.
Chen, Yung-Chih et al., "Preparation and properties of Silyated PTFE/SiO2 Organic-Inorganic Hybrids via Sol-Gel Process," Journal of Polymer Science: Part A: Polymer Chemistry, vol. 42, dated 2004, pp. 1789-1807.
Rajesh, S. et al., "Rutile Filled PTFE Composites for Flexible Microwave Substrate Applications," Materials Science and Engineering B, vol. 163, dated 2007, 7 pages.
Huang, Shi-Ing et al., "Study on the Composites of Two Sized Silica Filled in PTFE," Journal of Reinforced Plastics and Composites, vol. 25, No. 10, dated 2006, pp. 1053-1058.
Rajesh S. et al., "Temperature Stable Low Loss PTFE/Rutile Composites Using Secondary Polymer," Applied Physics A, Material Science & Processing, vol. 104, Nov. 4, 2010, pp. 159-164.
Chen, Yung-Chih et al., "The Effects of Filler Content and Size on the Properties of PTFE/SiO2 Composites," Journal of Polymer Research, vol. 10, dated 2003, pp. 247-258.

(56) References Cited

OTHER PUBLICATIONS

Chen, Yung-Chih et al., "The Effects of Phenyltrimethoxysilane Coupling Agents on the Properties of PTFE/Silica Composites," Journal of Polumer Research, vol. 11, dated 2004, pp. 1-7.
Luo, Fuchuan et al., "The Effects of TiO2 Particle Size on the Properties of PTFE/TiO2 Composites," Journal of Materials Science and Chemical Engineering, vol. 5, dated 2017, pp. 53-60.
Tsai, I-Shou et al., "The Study of the Low K of PTFE Composites with Hollow Glass Spheres," Journal of Industrial Textiles, vol. 40, No. 3, Jan. 2011, pp. 261-280.
International Search Report and Written Opinion for PCT Application No. PCT/US2021/072819, dated Mar. 31, 2022, 9 pages.
International Search Report and Written Opinion for PCT Application No. PCT/US2021/072820, dated Mar. 31, 2022, 10 pages.
International Search Report and Written Opinion for PCT Application No. PCT/US2021/072822, dated Apr. 5, 2022, 10 pages.
International Search Report and Written Opinion for PCT Application No. PCT/US2022/081548, dated Apr. 18, 2023, 9 pages.
International Search Report and Written Opinion for PCT Application No. PCT/US2022/081554, dated Apr. 26, 2023, 9 pages.
Extended European Search Report of the European Patent Office issued Oct. 25, 2024, for corresponding European Appl. No. 21908005.8, 9 pages.
Office Action and Search Report of the Taiwan IP Office issued Feb. 2, 2024 for corresponding Taiwan Appl. No. 112126876, English translations, 8 pages.
Office Action of the Japan Patent Office issued Jul. 5, 2024 in corresponding Japan Patent Appl. No. 2023-533294, English translation, 2 pages.

\* cited by examiner

DIELECTRIC SUBSTRATE AND METHOD OF FORMING THE SAME

CROSS-REFERENCE TO RELATED APPLICATION(S)

This application claims priority under 35 U.S.C. § 119(e) to U.S. Provisional Patent Application No. 63/126,109, entitled "DIELECTRIC SUBSTRATE AND METHOD OF FORMING THE SAME," by Jennifer ADAMCHUK et al., filed Dec. 16, 2020, which is assigned to the current assignee hereof and incorporated herein by reference in its entirety.

FIELD OF THE DISCLOSURE

The present disclosure relates to a dielectric substrate and methods of forming the same. In particular, the present disclosure related to a dielectric substrate for use in a copper-clad laminate structure and a method of forming the same.

BACKGROUND

Copper-clad laminates (CCLs) include a dielectric material laminated onto or between two layers of conductive copper foil. Subsequent operations transform such CCLs into printed circuit boards (PCBs). When used to form PCBs, the conductive copper foil is selectively etched to form circuitry with through holes that are drilled between layers and metalized, i.e. plated, to establish conductivity between layers in multilayer PCBs. CCLs must therefore exhibit excellence thermomechanical stability. PCBs are also routinely exposed to excessively high temperatures during manufacturing operations, such as soldering, as well as in service. Consequently, they must function at continuous temperatures above 200° C. without deforming and withstand dramatic temperature fluctuations while resisting moisture absorption. The dielectric layer of a CCL serves as a spacer between the conductive layers and can minimize electrical signal loss and crosstalk by blocking electrical conductivity. The lower the dielectric constant (permittivity) of the dielectric layer is, the higher the speed of the electrical signal through the layer will be. A low dissipation factor, which is dependent upon temperature and frequency, as well as the polarizability of the material, is therefore very critical for high-frequency applications. Accordingly, improved dielectric materials and dielectric layers that can be used in PCBs and other high-frequency applications are desired.

SUMMARY

According to a first aspect, a dielectric substrate may include a first fluoropolymer based adhesive layer, a polyimide layer overlying the fluoropolymer based adhesive layer, and a first filled polymer layer overlying the polyimide layer. The first filled polymer layer may include a resin matrix component, and a first ceramic filler component. The first ceramic filler component may include a first filler material. The first filler material may further have a mean particle size of at not greater than about 10 microns.

According to another aspect, a copper-clad laminate may include a copper foil layer and a dielectric substrate overlying the copper foil layer. The dielectric substrate may include a first fluoropolymer based adhesive layer, a polyimide layer overlying the fluoropolymer based adhesive layer, and a first filled polymer layer overlying the polyimide layer. The first filled polymer layer may include a resin matrix component, and a first ceramic filler component. The first ceramic filler component may include a first filler material. The first filler material may further have a mean particle size of at not greater than about 10 microns.

According to yet another aspect, a printed circuit board may include a copper foil layer and a dielectric substrate overlying the copper foil layer. The dielectric substrate may include a first fluoropolymer based adhesive layer, a polyimide layer overlying the fluoropolymer based adhesive layer, and a first filled polymer layer overlying the polyimide layer. The first filled polymer layer may include a resin matrix component, and a first ceramic filler component. The first ceramic filler component may include a first filler material. The first filler material may further have a mean particle size of at not greater than about 10 microns.

According to another aspect, a method of forming a dielectric substrate may include providing a first fluoropolymer based adhesive layer, providing a polyimide layer overlying the first fluoropolymer based adhesive layer, combining a first resin matrix precursor component and a first ceramic filler precursor component to form a first forming mixture, and forming the first forming mixture into a first filled polymer layer overlying the polyimide layer. The first ceramic filler precursor component may include a first filler precursor material. The first filler precursor material may further have a mean particle size of at not greater than about 10 microns.

According to still another aspect, a method of forming a copper-clad laminate may include providing a copper foil and forming a dielectric layer overlying the copper foil. Forming the dielectric layer may include providing a first fluoropolymer based adhesive layer, providing a polyimide layer overlying the first fluoropolymer based adhesive layer, combining a first resin matrix precursor component and a first ceramic filler precursor component to form a first forming mixture, and forming the first forming mixture into a first filled polymer layer overlying the polyimide layer. The first ceramic filler precursor component may include a first filler material. The first filler precursor material may further have a mean particle size of at not greater than about 10 microns.

According to yet another aspect, a method of forming a printed circuit board may include providing a copper foil and forming a dielectric layer overlying the copper foil. Forming the dielectric layer may include providing a first fluoropolymer based adhesive layer, providing a polyimide layer overlying the first fluoropolymer based adhesive layer, combining a first resin matrix precursor component and a first ceramic filler precursor component to form a first forming mixture, and forming the first forming mixture into a first filled polymer layer overlying the polyimide layer. The first ceramic filler precursor component may include a first filler material. The first filler precursor material may further have a mean particle size of at not greater than about 10 microns.

BRIEF DESCRIPTION OF THE DRAWINGS

Embodiments are illustrated by way of example and are not limited to the accompanying figures.

Skilled artisans appreciate that elements in the figures are illustrated for simplicity and clarity and have not necessarily been drawn to scale.

DETAILED DESCRIPTION

The following discussion will focus on specific implementations and embodiments of the teachings. The detailed description is provided to assist in describing certain embodiments and should not be interpreted as a limitation on the scope or applicability of the disclosure or teachings. It will be appreciated that other embodiments can be used based on the disclosure and teachings as provided herein.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Embodiments described herein are generally directed to a dielectric substrate that may include a first fluoropolymer based adhesive layer, a polyimide layer overlying the fluoropolymer based adhesive layer, and a first filled polymer layer overlying the polyimide layer, where the first filled polymer layer may include a first resin matrix component, and a first ceramic filler component.

Figure 1:
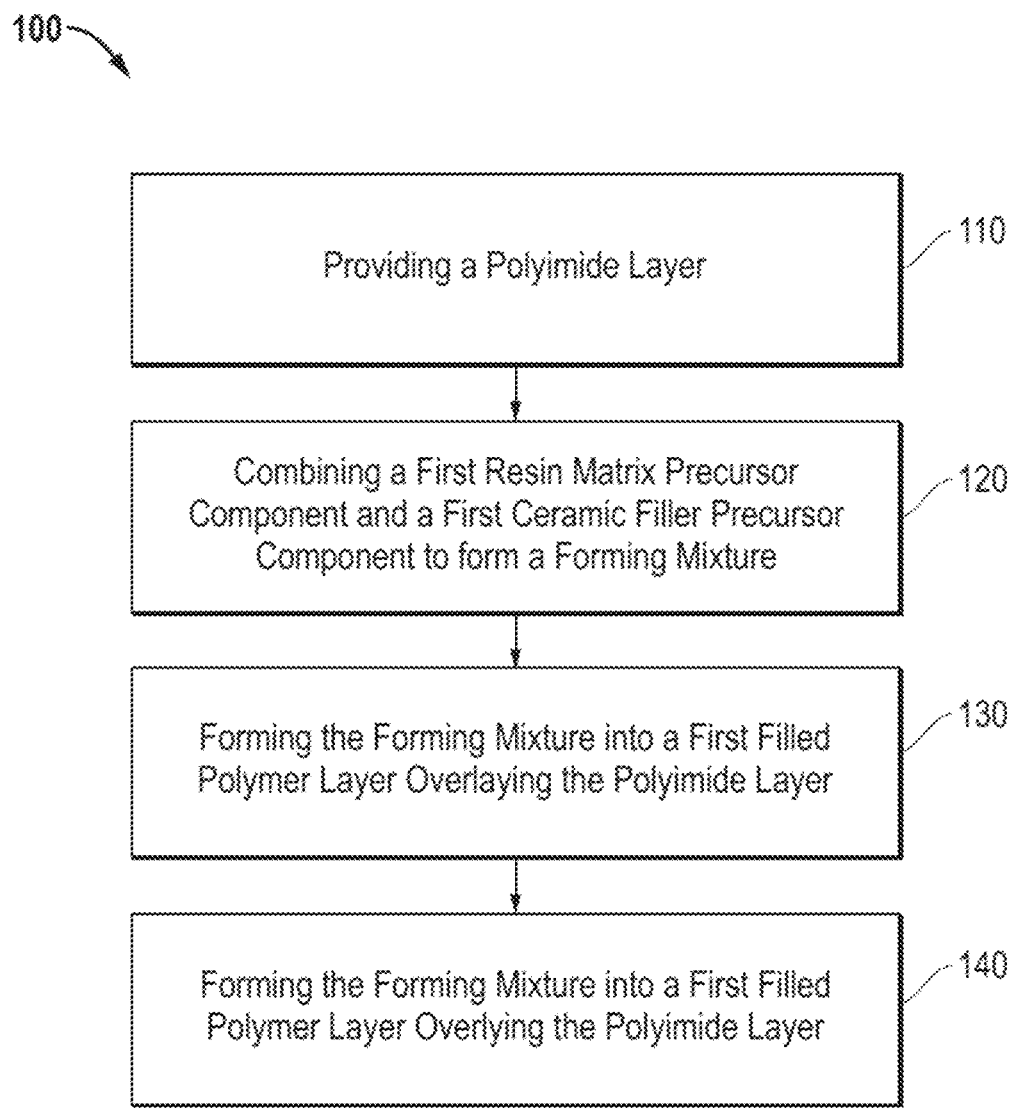
FIG. 1 includes a diagram showing a dielectric layer forming method according to embodiments described herein.

Referring first to a method of forming a dielectric substrate, FIG. 1 includes a diagram showing a forming method 100 for forming a dielectric substrate according to embodiments described herein. According to particular embodiments, the forming method 100 may include a first step 110 of providing a first fluoropolymer based adhesive layer, a second step 120 of providing a polyimide layer overlying the first fluoropolymer based adhesive layer, a third step 130 of combining a first resin matrix precursor component and a first ceramic filler precursor component to form a first forming mixture, and a fourth step 140 of forming the first forming mixture into a first filled polymer layer overlying the polyimide layer.

According to still other embodiments, the first fluoropolymer based adhesive layer may have a particular average thickness. For example, the first fluoropolymer based adhesive layer may be at least about 0.2 microns, such as, at least about 0.5 microns or at least about 1.0 microns or at least about 1.5 microns or at least about 2.0 microns or at least about 2.5 microns or even at least about 3.0 microns. According to yet other embodiments, the average thickness of the first fluoropolymer based adhesive layer may be not greater than about 7 microns, such as, not greater than about 6.5 or not greater than about 6.0 or not greater than about 5.5 or not greater than about 5.0 not greater than about 4.9 microns or not greater than about 4.8 microns or not greater than about 4.7 microns or not greater than about 4.6 microns or not greater than about 4.5 microns or not greater than about 4.4 microns or not greater than about 4.3 microns or not greater than about 4.2 microns or not greater than about 4.1 microns or not greater than about 4.1 microns or not greater than about 4.0 microns or not greater than about 3.9 microns or not greater than about 3.8 microns or not greater than about 3.7 microns or not greater than about 3.6 microns or even not greater than about 3.5 microns. It will be appreciated that the average thickness of the first fluoropolymer based adhesive layer may be any value between, and including, any of the minimum and maximum values noted above. It will be further appreciated that the average thickness of the first fluoropolymer based adhesive layer may be within a range between, and including, any of the minimum and maximum values noted above.

According to still other embodiments, the first fluoropolymer based adhesive layer may include a particular material. For example, the first fluoropolymer based adhesive layer may include may include, but is not limited to, fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the first fluoropolymer based adhesive layer may consist of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

According to particular embodiments, the first ceramic filler precursor component may include a first filler precursor material, which may have particular characteristics that may improve performance of the dielectric substrate formed by the forming method 100.

According to certain embodiments, the first filler precursor material may have a particular size distribution. For purposes of embodiments described herein, the particle size distribution of a material, for example, the particle size distribution of a first filler precursor material may be described using any combination of particle size distribution D-values $D_{10}$, $D_{50}$ and $D_{90}$. The $D_{10}$ value from a particle size distribution is defined as a particle size value where 10% of the particles are smaller than the value and 90% of the particles are larger than the value. The $D_{50}$ value from a particle size distribution is defined as a particle size value where 50% of the particles are smaller than the value and 50% of the particles are larger than the value. The $D_{90}$ value from a particle size distribution is defined as a particle size value where 90% of the particles are smaller than the value and 10% of the particles are larger than the value. For purposes of embodiments described herein, particle size measurements for a particular material are made using laser diffraction spectroscopy.

According to certain embodiments, the first filler precursor material may have a particular size distribution $D_{10}$ value. For example, the $D_{10}$ of the first filler precursor material may be at least about 0.2 microns, such as, at least about 0.3 or at least about 0.4 or at least about 0.5 or at least about 0.6 microns or at least about 0.7 microns or at least about 0.8 microns or at least about 0.9 microns or at least about 1.0 microns or at least about 1.1 microns or even at least about 1.2 microns. According to still other embodiments, the $D_{10}$ of the first filler material may be not greater than about 1.6 microns, such as, not greater than about 1.5 microns or even not greater than about 1.4 microns. It will be appreciated that the $D_{10}$ of the first filler precursor material may be any value between, and including, any of the minimum and maximum values noted above. It will be further appreciated that the $D_{10}$ of the first filler precursor material may be within a range between, and including, any of the minimum and maximum values noted above.

According to other embodiments, the first filler precursor material may have a particular size distribution $D_{50}$ value. For example, the $D_{50}$ of the first filler precursor material may be at least about 0.5 microns, such as, at least about 0.6 or at least about 0.7 or at least about 0.8 or at least about 0.9 microns or at least about 1.0 microns or at least about 1.1 microns or at least about 1.2 microns or at least about 1.3 microns or at least about 1.4 microns or at least about 1.5 microns or at least about 1.6 microns or at least about 1.7 microns or at least about 1.8 microns or at least about 1.9 microns or at least about 2.0 microns or at least about 2.1 microns or even at least about 2.2 microns. According to still other embodiments, the $D_{50}$ of the first filler material may be not greater than about 2.7 microns, such as, not greater than about 2.6 microns or not greater than about 2.5 microns or even not greater than about 2.4. It will be appreciated that the $D_{50}$ of the first filler precursor material may be any value between, and including, any of the minimum and maximum values noted above. It will be further appreciated that the $D_{50}$ of the first filler precursor material may be within a range between, and including, any of the minimum and maximum values noted above.

According to other embodiments, the first filler precursor material may have a particular size distribution $D_{90}$ value. For example, the $D_{90}$ of the first filler precursor material may be at least about 0.8 microns, such as, at least about 0.9 or at least about 1.0 or at least about 1.1 or at least about 1.2 or at least about 1.3 or at least about 1.4 or at least about 1.5 or at least about 1.6 microns or at least about 1.7 microns or at least about 1.8 microns or at least about 1.9 microns or at least about 2.0 microns or at least about 2.1 microns or at least about 2.2 microns or at least about 2.3 microns or at least about 2.4 microns or at least about 2.5 microns or at least about 2.6 microns or even at least about 2.7 microns. According to still other embodiments, the $D_{90}$ of the first filler material may be not greater than about 8.0 microns, such as, not greater than about 7.5 microns or not greater than about 7.0 microns or not greater than about 6.5 microns or not greater than about 6.0 microns or not greater than about 5.5 microns or not greater than about 5.4 microns or not greater than about 5.3 microns or not greater than about 5.2 or even not greater than about 5.1 microns. It will be appreciated that the $D_{90}$ of the first filler precursor material may be any value between, and including, any of the minimum and maximum values noted above. It will be further appreciated that the $D_{90}$ of the first filler precursor material may be within a range between, and including, any of the minimum and maximum values noted above.

According to still other embodiments, the first filler precursor material may have a particular mean particle size as measured using laser diffraction spectroscopy. For example, the mean particle size of the first filler precursor material may be not greater than about 10 microns, such as, not greater than about 9 microns or not greater than about 8 microns or not greater than about 7 microns or not greater than about 6 microns or not greater than about 5 microns or not greater than about 4 microns or not greater than about 3 microns or even not greater than about 2 microns. It will be appreciated that the mean particle size of the first filler precursor material may be any value between, and including, any of the values noted above. It will be further appreciated that the mean particle size of the first filler precursor material may be within a range between, and including, any of the values noted above.

According to still other embodiments, the first filler precursor material may be described as having a particular particle size distribution span (PSDS), where the PSDS of the first filler precursor material is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material. For example, the PSDS of the first filler precursor material may be not greater than about 5, such as, not greater than about 4.5 or not greater than about 4.0 or not greater than about 3.5 or not greater than about 3.0 or even not greater than about 2.5. It will be appreciated that the PSDS of the first filler precursor material may be any value between, and including, any of the values noted above. It will be further appreciated that the PSDS of the first filler precursor material may be within a range between, and including, any of the values noted above.

According to still other embodiments, the first filler precursor material may be described as having a particular average surface area as measured using Brunauer-Emmett-Teller (BET) surface area analysis (Nitrogen Adsorption). For example, the first filler precursor material may have an average surface area of not greater than about 10 $m^2/g$, such as, not greater than about 7.9 $m^2/g$ or not greater than about 7.5 $m^2/g$ or not greater than about 7.0 $m^2/g$ or not greater than about 6.5 $m^2/g$ or not greater than about 6.0 $m^2/g$ or not greater than about 5.5 $m^2/g$ or not greater than about 5.0 $m^2/g$ or not greater than about 4.5 $m^2/g$ or not greater than about 4.0 $m^2/g$ or even not greater than about 3.5 $m^2/g$. According to still other embodiments, the first filler precursor material may have an average surface area of at least about 1.2 $m^2/g$, such as, at least about 2.2 $m^2/g$. It will be appreciated that the average surface area of the first filler precursor material may be any value between, and including, any of the minimum and maximum values noted above. It will be further appreciated that the average surface area of the first filler precursor material may be within a range between, and including, any of the minimum and maximum values noted above.

According to other embodiments, the first filler precursor material may include a particular material. According to particular embodiments, the first filler precursor material may include a silica based compound. According to still other embodiments, the first filler precursor material may consist of a silica based compound. According to other embodiments, the first filler precursor material may include silica. According to still other embodiments, the first filler precursor material may consist of silica.

According to yet other embodiments, the first forming mixture may include a particular content of the first ceramic filler precursor component. For example, the content of the first ceramic filler precursor component may be at least about 30 vol. % for a total volume of the first forming mixture, such as, at least about 31 vol. % or at least about 32 vol. % or at least about 33 vol. % or at least about 34 vol. % or at least about 35 vol. % or at least about 36 vol. % or at least about 37 vol. % or at least about 38 vol. % or at least about 39 vol. % or at least about 40 vol. % or at least about 41 vol. % or at least about 42 vol. % or at least about 43 vol. % or at least about 44 vol. % or at least about 45 vol. % or at least about 46 vol. % or at least about 47 vol. % or at least about 48 vol. % or at least about 49 vol. % or at least about 50 vol. % or at least about 51 vol. % or at least about 52 vol. % or at least about 53 vol. % or even at least about 54 vol. %. According to still other embodiments, the content of the first ceramic filler precursor component may be not greater than about 57 vol. % for a total volume of the first forming mixture, such as, not greater than about 56 vol. % or even not greater than about 55 vol. %. It will be appreciated that the content of the first ceramic filler precursor component may be any value between, and including, any of the minimum and maximum values noted above. It will be further appreciated that the content of the first ceramic filler precursor component may be within a range between, and including, any of the minimum and maximum values noted above.

According to still other embodiments, the first ceramic filler precursor component may include a particular content of the first filler precursor material. For example, the content of the first filler precursor material may be at least about 80 vol. % for a total volume of the first ceramic filler precursor component, such as, at least about 81 vol. % or at least about 82 vol. % or at least about 83 vol. % or at least about 84 vol. % or at least about 85 vol. % or at least about 86 vol. % or at least about 87 vol. % or at least about 88 vol. % or at least about 89 vol. % or even at least about 90 vol. %. According to still other embodiments, the content of the first filler precursor material may be not greater than about 100 vol. % for a total volume of the first ceramic filler precursor component, such as, not greater than about 99 vol. % or not greater than about 98 vol. % or not greater than about 97 vol. % or not greater than about 96 vol. % or not greater than about 95 vol. % or not greater than about 94 vol. % or not greater than about 93 vol. % or even not greater than about 92 vol. %. It will be appreciated that the content of the first filler precursor material may be any value between, and including, any of the minimum and maximum values noted above. It will be further appreciated that the content of the first filler precursor material may be within a range between, and including, any of the minimum and maximum values noted above.

According to still other embodiments, the first ceramic filler precursor component may include a second filler precursor material.

According to yet other embodiments, the second filler precursor material may include a particular material. For example, the second filler precursor material may include a high dielectric constant ceramic material, such as, a ceramic material having a dielectric constant of at least about 14. According to particular embodiments, the second filler precursor material may include any high dielectric constant ceramic material, such as, $TiO_2$, $SrTiO_3$, $ZrTi_2O_6$, $MgTiO_3$, $CaTiO_3$, $BaTiO_4$ or any combination thereof.

According to yet other embodiments, the second filler precursor material may include $TiO_2$. According to still other embodiments, the second filler precursor material may consist of $TiO_2$.

According to still other embodiments, the first ceramic filler precursor component may include a particular content of the second filler precursor material. For example, the content of the second filler precursor material may be at least about 1 vol. % for a total volume of the first ceramic filler precursor component, such as, at least about 2 vol. % or at least about 3 vol. % or at least about 4 vol. % or at least about 5 vol. % or at least about 6 vol. % or at least about 7 vol. % or at least about 8 vol. % or at least about 9 vol. % or at least about 10 vol. %. According to still other embodiments, the content of the second filler precursor material may be not greater than about 20 vol. % for a total volume of the first ceramic filler precursor component, such as, not greater than about 19 vol. % or not greater than about 18 vol. % or not greater than about 17 vol. % or not greater than about 16 vol. % or not greater than about 15 vol. % or not greater than about 14 vol. % or not greater than about 13 vol. % or not greater than about 12 vol. %. It will be appreciated that the content of the second filler precursor material may be any value between, and including, any of the minimum and maximum values noted above. It will be further appreciated that the content of the second filler precursor material may be within a range between, and including, any of the minimum and maximum values noted above.

According to yet other embodiments, the first ceramic filler precursor component may include a particular content of amorphous material. For example, the first ceramic filler precursor component may include at least about 97% amorphous material, such as, at least about 98% or even at least about 99%. It will be appreciated that the content of amorphous material may be any value between, and including, any of the values noted above. It will be further appreciated that the content of the content of amorphous material may be within a range between, and including, any of the values noted above.

According to other embodiments, the first resin matrix precursor component may include a particular material. For example, the first resin matrix precursor component may include a perfluoropolymer. According to still other embodiments, the first resin matrix precursor component may consist of a perfluoropolymer.

According to yet other embodiments, the perfluoropolymer of the first resin precursor matrix component may include a copolymer of tetrafluoroethylene (TFE); a copolymer of hexafluoropropylene (HFP); a terpolymer of tetrafluoroethylene (TFE); or any combination thereof. According to other embodiments, the perfluoropolymer of the first resin matrix precursor component may consist of a copolymer of tetrafluoroethylene (TFE); a copolymer of hexafluoropropylene (HFP); a terpolymer of tetrafluoroethylene (TFE); or any combination thereof.

According to yet other embodiments, the perfluoropolymer of the first resin matrix precursor component may include polytetrafluoroethylene (PTFE), perfluoroalkoxy polymer resin (PFA), fluorinated ethylene propylene (FEP), or any combination thereof. According to still other embodiments, the perfluoropolymer of the first resin matrix precursor component may consist of polytetrafluoroethylene (PTFE), perfluoroalkoxy polymer resin (PFA), fluorinated ethylene propylene (FEP), or any combination thereof.

According to yet other embodiments, the first forming mixture may include a particular content of the first resin matrix precursor component. For example, the content of the first resin matrix precursor component may be at least about 45 vol. % for a total volume of the forming mixture, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the first resin matrix precursor component is not greater than about 63 vol. % for a total volume of the first forming mixture or not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the first resin matrix precursor component may be any value between, and including, any of the minimum and maximum values noted above. It will be further appreciated that the content of the first resin matrix precursor component may be within a range between, and including, any of the minimum and maximum values noted above.

According to yet other embodiments, the first forming mixture may include a particular content of the perfluoropolymer. For example, the content of the perfluoropolymer may be at least about 45 vol. % for a total volume of the forming mixture, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the perfluoropolymer may be not greater than about 63 vol. % for a total volume of the first forming mixture, such as, not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the perfluoropolymer may be any value between, and including, any of the minimum and maximum values noted above. It will be further appreciated that the content of the perfluoropolymer may be within a range between, and including, any of the minimum and maximum values noted above.

According to yet other embodiment, the second step 120 may further include combining a second resin matrix precursor component and a second ceramic filler precursor component to for a second forming mixture. The third step 130 may further include forming the second forming mixture into a second filled polymer layer underlying the polyimide layer, and providing a second fluoropolymer based adhesive layer underlying the second filled polymer layer.

According to still other embodiments, the second fluoropolymer based adhesive layer may have a particular average thickness. For example, the second fluoropolymer based adhesive layer may be at least about at least about 0.2 microns, such as, at least about 0.5 microns or at least about 1.0 microns or at least about 1.5 microns or at least about 2.0 microns or at least about 2.5 microns or even at least about 3.0 microns. According to yet other embodiments, the average thickness of the second fluoropolymer based adhesive layer may be not greater than about not greater than about 7 microns, such as, not greater than about 6.5 or not greater than about 6.0 or not greater than about 5.5 or not greater than about 5.0 not greater than about 4.9 microns or not greater than about 4.8 microns or not greater than about 4.7 microns or not greater than about 4.6 microns or not greater than about 4.5 microns or not greater than about 4.4 microns or not greater than about 4.3 microns or not greater than about 4.2 microns or not greater than about 4.1 microns or not greater than about 4.1 microns or not greater than about 4.0 microns or not greater than about 3.9 microns or not greater than about 3.8 microns or not greater than about 3.7 microns or not greater than about 3.6 microns or even not greater than about 3.5 microns. It will be appreciated that the average thickness of the second fluoropolymer based adhesive layer may be any value between, and including, any of the minimum and maximum values noted above. It will be further appreciated that the average thickness of the second fluoropolymer based adhesive layer may be within a range between, and including, any of the minimum and maximum values noted above.

According to still other embodiments, the second fluoropolymer based adhesive layer 207 may include a particular material. For example, the second fluoropolymer based adhesive layer 207 may include fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the second fluoropolymer based adhesive layer 207 may consist of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

According to particular embodiments, the second ceramic filler precursor component may include a third filler precursor material, which may have particular characteristics that may improve performance of the dielectric substrate formed by the forming method 100.

According to certain embodiments, the third filler precursor material may have a particular size distribution. For purposes of embodiments described herein, the particle size distribution of a material, for example, the particle size distribution of a third filler precursor material may be described using any combination of particle size distribution D-values $D_{10}$, $D_{50}$ and $D_{90}$. The $D_{10}$ value from a particle size distribution is defined as a particle size value where 10% of the particles are smaller than the value and 90% of the particles are larger than the value. The $D_{50}$ value from a particle size distribution is defined as a particle size value where 50% of the particles are smaller than the value and 50% of the particles are larger than the value. The $D_{90}$ value from a particle size distribution is defined as a particle size value where 90% of the particles are smaller than the value and 10% of the particles are larger than the value. For purposes of embodiments described herein, particle size measurements for a particular material are made using laser diffraction spectroscopy.

According to certain embodiments, the third filler precursor material may have a particular size distribution $D_{10}$ value. For example, the $D_{10}$ of the third filler precursor material may be at least about 0.2 microns, such as, at least about 0.3 microns or at least about 0.4 microns or at least about 0.5 microns or at least about 0.6 microns or at least about 0.7 microns or at least about 0.8 microns or at least about 0.9 microns or at least about 1.0 microns or at least about 1.1 microns or even at least about 1.2 microns.

According to still other embodiments, the $D_{10}$ of the third filler material may be not greater than about 1.6 microns, such as, not greater than about 1.5 microns or even not greater than about 1.4 microns. It will be appreciated that the $D_{10}$ of the third filler precursor material may be any value between, and including, any of the minimum and maximum values noted above. It will be further appreciated that the $D_{10}$ of the third filler precursor material may be within a range between, and including, any of the minimum and maximum values noted above.

According to other embodiments, the third filler precursor material may have a particular size distribution $D_{50}$ value. For example, the $D_{50}$ of the third filler precursor material may be at least about 0.5 microns, such as, at least about 0.6 microns or at least about 0.7 microns or at least about 0.8 microns or at least about 0.9 microns or at least about 1.0 microns or at least about 1.1 microns or at least about 1.2 microns or at least about 1.3 microns or at least about 1.4 microns or at least about 1.5 microns or at least about 1.6 microns or at least about 1.7 microns or at least about 1.8 microns or at least about 1.9 microns or at least about 2.0 microns or at least about 2.1 microns or even at least about 2.2 microns. According to still other embodiments, the $D_{50}$ of the third filler material may be not greater than about 2.7 microns, such as, not greater than about 2.6 microns or not greater than about 2.5 microns or even not greater than about 2.4. It will be appreciated that the $D_{50}$ of the third filler precursor material may be any value between, and including, any of the minimum and maximum values noted above. It will be further appreciated that the $D_{50}$ of the third filler precursor material may be within a range between, and including, any of the minimum and maximum values noted above.

According to other embodiments, the third filler precursor material may have a particular size distribution $D_{90}$ value. For example, the $D_{90}$ of the third filler precursor material may be at least about 0.8 microns, such as, at least about 0.9 or at least about 1.0 or at least about 1.1 or at least about 1.2 or at least about 1.3 or at least about 1.4 or at least about 1.5 or at least about 1.6 microns or at least about 1.7 microns or at least about 1.8 microns or at least about 1.9 microns or at least about 2.0 microns or at least about 2.1 microns or at least about 2.2 microns or at least about 2.3 microns or at least about 2.4 microns or at least about 2.5 microns or at least about 2.6 microns or even at least about 2.7 microns. According to still other embodiments, the $D_{90}$ of the third filler material may be not greater than about 8.0 microns, such as, not greater than about 7.5 microns or not greater than about 7.0 microns or not greater than about 6.5 microns or not greater than about 6.0 microns or not greater than about 5.5 microns or not greater than about 5.4 microns or not greater than about 5.3 microns or not greater than about 5.2 or even not greater than about 5.1 microns. It will be appreciated that the $D_{90}$ of the third filler precursor material may be any value between, and including, any of the minimum and maximum values noted above. It will be further appreciated that the $D_{90}$ of the third filler precursor material may be within a range between, and including, any of the minimum and maximum values noted above.

According to still other embodiments, the third filler precursor material may have a particular average particle size as measured using laser diffraction spectroscopy. For example, the mean particle size of the third filler precursor material may be not greater than about 10 microns, such as, not greater than about 9 microns or not greater than about 8 microns or not greater than about 7 microns or not greater than about 6 microns or not greater than about 5 microns or not greater than about 4 microns or not greater than about 3 microns or even not greater than about 2 microns. It will be appreciated that the mean particle size of the third filler precursor material may be any value between, and including, any of the values noted above. It will be further appreciated that the mean particle size of the third filler precursor material may be within a range between, and including, any of the values noted above.

According to still other embodiments, the third filler precursor material may be described as having a particular particle size distribution span (PSDS), where the PSDS of the third filler precursor material is equal to $(D_{90}-D_{10})/D_{50}$, where $D_{90}$ is equal to a $D_{90}$ particle size distribution measurement of the third filler precursor material, $D_{10}$ is equal to a $D_{10}$ particle size distribution measurement of the third filler precursor material, and $D_{50}$ is equal to a $D_{50}$ particle size distribution measurement of the third filler precursor material. For example, the PSDS of the third filler precursor material may be not greater than about 5, such as, not greater than about 4.5 or not greater than about 4.0 or not greater than about 3.5 or not greater than about 3.0 or even not greater than about 2.5. It will be appreciated that the PSDS of the third filler precursor material may be any value between, and including, any of the values noted above. It will be further appreciated that the PSDS of the third filler precursor material may be within a range between, and including, any of the values noted above.

According to still other embodiments, the third filler precursor material may be described as having a particular average surface area as measured using Brunauer-Emmett-Teller (BET) surface area analysis (Nitrogen Adsorption). For example, the third filler precursor material may have an average surface area of not greater than about 10 m²/g, such as, not greater than about 7.9 m²/g or not greater than about 7.5 m²/g or not greater than about 7.0 m²/g or not greater than about 6.5 m²/g or not greater than about 6.0 m²/g or not greater than about 5.5 m²/g or not greater than about 5.0 m²/g or not greater than about 4.5 m²/g or not greater than about 4.0 m²/g or even not greater than about 3.5 m²/g. According to still other embodiments, the third filler precursor material may have an average surface area of at least about 1.2 m²/g, such as, at least about 2.4 m²/g. It will be appreciated that the average surface area of the third filler precursor material may be any value between, and including, any of the minimum and maximum values noted above. It will be further appreciated that the average surface area of the third filler precursor material may be within a range between, and including, any of the minimum and maximum values noted above.

According to other embodiments, the third filler precursor material may include a particular material. According to particular embodiments, the third filler precursor material may include a silica based compound. According to still other embodiments, the third filler precursor material may consist of a silica based compound. According to other embodiments, the third filler precursor material may include silica. According to still other embodiments, the third filler precursor material may consist of silica.

According to yet other embodiments, the second forming mixture may include a particular content of the second ceramic filler precursor component. For example, the content of the second ceramic filler precursor component may be at least about 30 vol. % for a total volume of the second forming mixture, such as, at least about 31 vol. % or at least about 32 vol. % or at least about 33 vol. % or at least about 34 vol. % or at least about 35 vol. % or at least about 36 vol. % or at least about 37 vol. % or at least about 38 vol. % or at least about 39 vol. % or at least about 40 vol. % or at least about 41 vol. % or at least about 42 vol. % or at least about 43 vol. % or at least about 44 vol. % or at least about 45 vol. % or at least about 46 vol. % or at least about 47 vol. % or at least about 48 vol. % or at least about 49 vol. % or at least about 50 vol. % or at least about 51 vol. % or at least about 52 vol. % or at least about 53 vol. % or even at least about 54 vol. %. According to still other embodiments, the content of the second ceramic filler precursor component may be not greater than about 57 vol. % for a total volume of the second forming mixture, such as, not greater than about 56 vol. % or even not greater than about 55 vol. %. It will be appreciated that the content of the second ceramic filler precursor component may be any value between, and including, any of the minimum and maximum values noted above. It will be further appreciated that the content of the second ceramic filler precursor component may be within a range between, and including, any of the minimum and maximum values noted above.

According to still other embodiments, the second ceramic filler precursor component may include a particular content of the third filler precursor material. For example, the content of the third filler precursor material may be at least about 80 vol. % for a total volume of the second ceramic filler precursor component, such as, at least about 81 vol. % or at least about 82 vol. % or at least about 83 vol. % or at least about 84 vol. % or at least about 85 vol. % or at least about 86 vol. % or at least about 87 vol. % or at least about 88 vol. % or at least about 89 vol. % or even at least about 90 vol. %. According to still other embodiments, the content of the third filler precursor material may be not greater than about 100 vol. % for a total volume of the second ceramic filler precursor component, such as, not greater than about 99 vol. % or not greater than about 98 vol. % or not greater than about 97 vol. % or not greater than about 96 vol. % or not greater than about 95 vol. % or not greater than about 94 vol. % or not greater than about 93 vol. % or even not greater than about 92 vol. %. It will be appreciated that the content of the third filler precursor material may be any value between, and including, any of the minimum and maximum values noted above. It will be further appreciated that the content of the third filler precursor material may be within a range between, and including, any of the minimum and maximum values noted above.

According to still other embodiments, the second ceramic filler precursor component may include a fourth filler precursor material.

According to yet other embodiments, the fourth filler precursor material may include a particular material. For example, the fourth filler precursor material may include a high dielectric constant ceramic material, such as, a ceramic material having a dielectric constant of at least about 14. According to particular embodiments, the fourth filler precursor material may include any high dielectric constant ceramic material, such as, $TiO_2$, $SrTiO_3$, $ZrTi_2O_6$, $MgTiO_3$, $CaTiO_3$, $BaTiO_4$ or any combination thereof.

According to yet other embodiments, the fourth filler precursor material may include $TiO_2$. According to still other embodiments, the fourth filler precursor material may consist of $TiO_2$.

According to still other embodiments, the second ceramic filler precursor component may include a particular content of the fourth filler precursor material. For example, the content of the fourth filler precursor material may be at least about 1 vol. % for a total volume of the second ceramic filler precursor component, such as, at least about 2 vol. % or at least about 3 vol. % or at least about 4 vol. % or at least about 5 vol. % or at least about 6 vol. % or at least about 7 vol. % or at least about 8 vol. % or at least about 9 vol. % or at least about 10 vol. %. According to still other embodiments, the content of the fourth filler precursor material may be not greater than about 20 vol. % for a total volume of the second ceramic filler precursor component, such as, not greater than about 19 vol. % or not greater than about 18 vol. % or not greater than about 17 vol. % or not greater than about 16 vol. % or not greater than about 15 vol. % or not greater than about 14 vol. % or not greater than about 13 vol. % or not greater than about 12 vol. %. It will be appreciated that the content of the fourth filler precursor material may be any value between, and including, any of the minimum and maximum values noted above. It will be further appreciated that the content of the fourth filler precursor material may be within a range between, and including, any of the minimum and maximum values noted above.

According to yet other embodiments, the second ceramic filler precursor component may include a particular content of amorphous material. For example, the second ceramic filler precursor component may include at least about 97% amorphous material, such as, at least about 98% or even at least about 99%. It will be appreciated that the content of amorphous material may be any value between, and including, any of the values noted above. It will be further appreciated that the content of the content of amorphous material may be within a range between, and including, any of the values noted above.

According to other embodiments, the second resin matrix precursor component may include a particular material. For example, the second resin matrix precursor component may include a perfluoropolymer. According to still other embodiments, the second resin matrix precursor component may consist of a perfluoropolymer.

According to yet other embodiments, the perfluoropolymer of the first resin precursor matrix component may include a copolymer of tetrafluoroethylene (TFE); a copolymer of hexafluoropropylene (HFP); a terpolymer of tetrafluoroethylene (TFE); or any combination thereof. According to other embodiments, the perfluoropolymer of the second resin matrix precursor component may consist of a copolymer of tetrafluoroethylene (TFE); a copolymer of hexafluoropropylene (HFP); a terpolymer of tetrafluoroethylene (TFE); or any combination thereof.

According to yet other embodiments, the perfluoropolymer of the second resin matrix precursor component may include polytetrafluoroethylene (PTFE), perfluoroalkoxy polymer resin (PFA), fluorinated ethylene propylene (FEP), or any combination thereof. According to still other embodiments, the perfluoropolymer of the second resin matrix precursor component may consist of polytetrafluoroethylene (PTFE), perfluoroalkoxy polymer resin (PFA), fluorinated ethylene propylene (FEP), or any combination thereof.

According to yet other embodiments, the second forming mixture may include a particular content of the second resin matrix precursor component. For example, the content of the second resin matrix precursor component may be at least about 45 vol. % for a total volume of the forming mixture, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the second resin matrix precursor component is not greater than about 63 vol. % for a total volume of the second forming mixture or not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the second resin matrix precursor component may be any value between, and including, any of the minimum and maximum values noted above. It will be further appreciated that the content of the second resin matrix precursor component may be within a range between, and including, any of the minimum and maximum values noted above.

According to yet other embodiments, the second forming mixture may include a particular content of the perfluoropolymer. For example, the content of the perfluoropolymer may be at least about 45 vol. % for a total volume of the forming mixture, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the perfluoropolymer may be not greater than about 63 vol. % for a total volume of the second forming mixture, such as, not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the perfluoropolymer may be any value between, and including, any of the minimum and maximum values noted above. It will be further appreciated that the content of the perfluoropolymer may be within a range between, and including, any of the minimum and maximum values noted above.

Figure 2A:
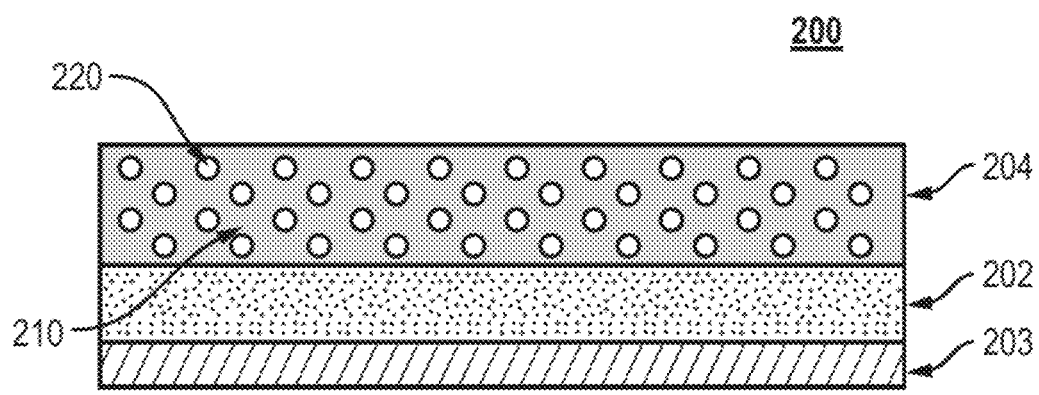
FIGS. 2a and 2b include illustrations showing the configuration of dielectric layers formed according to embodiments described herein.

Referring now to embodiments of the dielectric substrate formed according to forming method 100, FIG. 2a includes diagram of a dielectric substrate 200. As shown in FIG. 2a, the dielectric substrate 200 may include a first fluoropolymer based adhesive layer 203, a polyimide layer 202 and a first filled polymer layer 204 overlying the polyimide layer 202. As shown in FIG. 2a, the first filled polymer layer 204 may include a first resin matrix component 210 and a first ceramic filler component 220.

According to still other embodiments, the first fluoropolymer based adhesive layer 203 may have a particular average thickness. For example, the first fluoropolymer based adhesive layer 203 may be at least about 0.2 microns, such as, at least about 0.5 microns or at least about 1.0 microns or at least about 1.5 microns or at least about 2.0 microns or at least about 2.5 microns or even at least about 3.0 microns. According to yet other embodiments, the average thickness of the first fluoropolymer based adhesive layer 203 may be not greater than about 7 microns, such as, not greater than about 6.5 or not greater than about 6.0 or not greater than about 5.5 or not greater than about 5.0 not greater than about 4.9 microns or not greater than about 4.8 microns or not greater than about 4.7 microns or not greater than about 4.6 microns or not greater than about 4.5 microns or not greater than about 4.4 microns or not greater than about 4.3 microns or not greater than about 4.2 microns or not greater than about 4.1 microns or not greater than about 4.1 microns or not greater than about 4.0 microns or not greater than about 3.9 microns or not greater than about 3.8 microns or not greater than about 3.7 microns or not greater than about 3.6 microns or even not greater than about 3.5 microns. It will be appreciated that the average thickness of the first fluoropolymer based adhesive layer 203 may be any value between, and including, any of the minimum and maximum values noted above. It will be further appreciated that the average thickness of the first fluoropolymer based adhesive layer 203 may be within a range between, and including, any of the minimum and maximum values noted above.

According to still other embodiments, the first fluoropolymer based adhesive layer 203 may include a particular material. For example, the first fluoropolymer based adhesive layer 203 may include fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the first fluoropolymer based adhesive layer 203 may consist of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

According to particular embodiments, the first ceramic filler component 220 may include a first filler material, which may have particular characteristics that may improve performance of the dielectric substrate 200.

According to certain embodiments, the first filler material of the first ceramic filler component 220 may have a particular size distribution. For purposes of embodiments described herein, the particle size distribution of a material, for example, the particle size distribution of a first filler material may be described using any combination of particle size distribution D-values $D_{10}$, $D_{50}$ and $D_{90}$. The $D_{10}$ value from a particle size distribution is defined as a particle size value where 10% of the particles are smaller than the value and 90% of the particles are larger than the value. The $D_{50}$ value from a particle size distribution is defined as a particle size value where 50% of the particles are smaller than the value and 50% of the particles are larger than the value. The $D_{90}$ value from a particle size distribution is defined as a particle size value where 90% of the particles are smaller than the value and 10% of the particles are larger than the value. For purposes of embodiments described herein, particle size measurements for a particular material are made using laser diffraction spectroscopy.

According to certain embodiments, the first filler material of the first ceramic filler component 220 may have a particular size distribution $D_{10}$ value. For example, the $D_{10}$ of the first filler material may be at least about 0.2 microns, such as, at least about 0.3 microns or at least about 0.4 microns or at least about 0.5 microns or at least about 0.6 microns or at least about 0.7 microns or at least about 0.8 microns or at least about 0.9 microns or at least about 1.0 microns or at least about 1.1 microns or even at least about 1.2 microns. According to still other embodiments, the $D_{10}$ of the first filler material may be not greater than about 1.6 microns, such as, not greater than about 1.5 microns or even not greater than about 1.4 microns. It will be appreciated that the $D_{10}$ of the first filler material may be any value between, and including, any of the minimum and maximum values noted above. It will be further appreciated that the $D_{10}$ of the first filler material may be within a range between, and including, any of the minimum and maximum values noted above.

According to other embodiments, the first filler material of the first ceramic filler component 220 may have a particular size distribution $D_{50}$ value. For example, the $D_{50}$ of the first filler material may be at least about 0.5 microns, such as, at least about 0.6 microns or at least about 0.7 microns or at least about 0.8 microns or at least about 0.9 microns or at least about 1.0 microns or at least about 1.1 microns or at least about 1.2 microns or at least about 1.3 microns or at least about 1.4 microns or at least about 1.5 microns or at least about 1.6 microns or at least about 1.7 microns or at least about 1.8 microns or at least about 1.9 microns or at least about 2.0 microns or at least about 2.1 microns or even at least about 2.2 microns. According to still other embodiments, the $D_{50}$ of the first filler material may be not greater than about 2.7 microns, such as, not greater than about 2.6 microns or not greater than about 2.5 microns or even not greater than about 2.4. It will be appreciated that the $D_{50}$ of the first filler material may be any value between, and including, any of the minimum and maximum values noted above. It will be further appreciated that the $D_{50}$ of the first filler material may be within a range between, and including, any of the minimum and maximum values noted above.

According to other embodiments, the first filler material of the first ceramic filler component 220 may have a particular size distribution $D_{90}$ value. For example, the $D_{90}$ of the first filler material may be at least about 0.8 microns, such as, at least about 0.9 or at least about 1.0 or at least about 1.1 or at least about 1.2 or at least about 1.3 or at least about 1.4 or at least about 1.5 or at least about 1.6 microns or at least about 1.7 microns or at least about 1.8 microns or at least about 1.9 microns or at least about 2.0 microns or at least about 2.1 microns or at least about 2.2 microns or at least about 2.3 microns or at least about 2.4 microns or at least about 2.5 microns or at least about 2.6 microns or even at least about 2.7 microns. According to still other embodiments, the $D_{90}$ of the first filler material may be not greater than about 8.0 microns, such as, not greater than about 7.5 microns or not greater than about 7.0 microns or not greater than about 6.5 microns or not greater than about 6.0 microns or not greater than about 5.5 microns or not greater than about 5.4 microns or not greater than about 5.3 microns or not greater than about 5.2 or even not greater than about 5.1 microns. It will be appreciated that the $D_{90}$ of the first filler material may be any value between, and including, any of the minimum and maximum values noted above. It will be further appreciated that the $D_{90}$ of the first filler material may be within a range between, and including, any of the minimum and maximum values noted above.

According to still other embodiments, the first filler material of the first ceramic filler component 220 may have a particular average particle size as measured according to laser diffraction spectroscopy. For example, the mean particle size of the first filler material may be not greater than about 10 microns, such as, not greater than about 9 microns or not greater than about 8 microns or not greater than about 7 microns or not greater than about 6 microns or not greater than about 5 microns or not greater than about 4 microns or not greater than about 3 microns or even not greater than about 2 microns. It will be appreciated that the mean particle size of the first filler material may be any value between, and including, any of the values noted above. It will be further appreciated that the mean particle size of the first filler material may be within a range between, and including, any of the values noted above.

According to still other embodiments, the first filler material of the first ceramic filler component 220 may be described as having a particular particle size distribution span (PSDS), where the PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material. For example, the PSDS of the first filler material may be not greater than about 5, such as, not greater than about 4.5 or not greater than about 4.0 or not greater than about 3.5 or not greater than about 3.0 or even not greater than about 2.5. It will be appreciated that the PSDS of the first filler material may be any value between, and including, any of the values noted above. It will be further appreciated that the PSDS of the first filler material may be within a range between, and including, any of the values noted above.

According to still other embodiments, the first filler material of the first ceramic filler component 220 may be described as having a particular average surface area as measured using Brunauer-Emmett-Teller (BET) surface area analysis (Nitrogen Adsorption). For example, the first filler material may have an average surface area of not greater than about 10 m$^2$/g, such as, not greater than about 7.9 m$^2$/g or not greater than about 7.5 m$^2$/g or not greater than about 7.0 m$^2$/g or not greater than about 6.5 m$^2$/g or not greater than about 6.0 m$^2$/g or not greater than about 5.5 m$^2$/g or not greater than about 5.0 m$^2$/g or not greater than about 4.5 m$^2$/g or not greater than about 4.0 m$^2$/g or even not greater than about 3.5 m$^2$/g. According to still other embodiments, the first filler material may have an average surface area of at least about 1.2 m$^2$/g, such as, at least about 2.4 m$^2$/g. It will be appreciated that the average surface area of the first filler material may be any value between, and including, any of the minimum and maximum values noted above. It will be further appreciated that the average surface area of the first filler material may be within a range between, and including, any of the minimum and maximum values noted above.

According to other embodiments, the first filler material of the first ceramic filler component 220 may include a particular material. According to particular embodiments, the first filler material may include a silica based compound. According to still other embodiments, the first filler material may consist of a silica based compound. According to other embodiments, the first filler material may include silica. According to still other embodiments, the first filler material may consist of silica.

According to yet other embodiments, the first filled polymer layer 204 may include a particular content of the first ceramic filler component 220. For example, the content of the ceramic filler component 220 may be at least about 30 vol. % for a total volume of the first filled polymer layer 204, such as, at least about 31 vol. % or at least about 32 vol. % or at least about 33 vol. % or at least about 34 vol. % or at least about 35 vol. % or at least about 36 vol. % or at least about 37 vol. % or at least about 38 vol. % or at least about 39 vol. % or at least about 40 vol. % or at least about 41 vol. % or at least about 42 vol. % or at least about 43 vol. % or at least about 44 vol. % or at least about 45 vol. % or at least about 46 vol. % or at least about 47 vol. % or at least about 48 vol. % or at least about 49 vol. % or at least about 50 vol. % or at least about 51 vol. % or at least about 52 vol. % or at least about 53 vol. % or even at least about 54 vol. %. According to still other embodiments, the content of the ceramic filler component 220 may be not greater than about 57 vol. % for a total volume of the first filled polymer layer 204, such as, not greater than about 56 vol. % or even not greater than about 55 vol. %. It will be appreciated that the content of the ceramic filler component 220 may be any value between, and including, any of the minimum and maximum values noted above. It will be further appreciated that the content of the ceramic filler component 220 may be within a range between, and including, any of the minimum and maximum values noted above.

According to still other embodiments, the first ceramic filler component 220 may include a particular content of the first filler material. For example, the content of the first filler material may be at least about 80 vol. % for a total volume of the first ceramic filler component 220, such as, at least about 81 vol. % or at least about 82 vol. % or at least about 83 vol. % or at least about 84 vol. % or at least about 85 vol. % or at least about 86 vol. % or at least about 87 vol. % or at least about 88 vol. % or at least about 89 vol. % or even at least about 90 vol. %. According to still other embodiments, the content of the first filler material may be not greater than about 100 vol. % for a total volume of the first ceramic filler component 220, such as, not greater than about 99 vol. % or not greater than about 98 vol. % or not greater than about 97 vol. % or not greater than about 96 vol. % or not greater than about 95 vol. % or not greater than about 94 vol. % or not greater than about 93 vol. % or even not greater than about 92 vol. %. It will be appreciated that the content of the first filler material may be any value between, and including, any of the minimum and maximum values noted above. It will be further appreciated that the content of the first filler material may be within a range between, and including, any of the minimum and maximum values noted above.

According to still other embodiments, the first ceramic filler component 220 may include a second filler material.

According to yet other embodiments, the second filler material of the first ceramic filler component 220 may include a particular material. For example, the second filler material may include a high dielectric constant ceramic material, such as, a ceramic material having a dielectric constant of at least about 14. According to particular embodiments, the second filler material of the first ceramic filler component 220 may include any high dielectric constant ceramic material, such as, $TiO_2$, $SrTiO_3$, $ZrTi_2O_6$, $MgTiO_3$, $CaTiO_3$, $BaTiO_4$ or any combination thereof.

According to yet other embodiments, the second filler material of the first ceramic filler component 220 may include $TiO_2$. According to still other embodiments, the second filler material may consist of $TiO_2$.

According to still other embodiments, the first ceramic filler component 220 may include a particular content of the second filler material. For example, the content of the second filler material may be at least about 1 vol. % for a total volume of the first ceramic filler component 220, such as, at least about 2 vol. % or at least about 3 vol. % or at least about 4 vol. % or at least about 5 vol. % or at least about 6 vol. % or at least about 7 vol. % or at least about 8 vol. % or at least about 9 vol. % or at least about 10 vol. %. According to still other embodiments, the content of the second filler material may be not greater than about 20 vol. % for a total volume of the first ceramic filler component 220, such as, not greater than about 19 vol. % or not greater than about 18 vol. % or not greater than about 17 vol. % or not greater than about 16 vol. % or not greater than about 15 vol. % or not greater than about 14 vol. % or not greater than about 13 vol. % or not greater than about 12 vol. %. It will be appreciated that the content of the second filler material may be any value between, and including, any of the minimum and maximum values noted above. It will be further appreciated that the content of the second filler material may be within a range between, and including, any of the minimum and maximum values noted above.

According to yet other embodiments, the first ceramic filler component 220 may include a particular content of amorphous material. For example, the first ceramic filler component 220 may include at least about 97% amorphous material, such as, at least about 98% or even at least about 99%. It will be appreciated that the content of amorphous material may be any value between, and including, any of the values noted above. It will be further appreciated that the content of the content of amorphous material may be within a range between, and including, any of the values noted above.

According to other embodiments, the first resin matrix component 210 may include a particular material. For example, the first resin matrix component 210 may include a perfluoropolymer. According to still other embodiments, the first resin matrix component 210 may consist of a perfluoropolymer.

According to yet other embodiments, the perfluoropolymer of the first resin matrix component 210 may include a copolymer of tetrafluoroethylene (TFE); a copolymer of hexafluoropropylene (HFP); a terpolymer of tetrafluoroethylene (TFE); or any combination thereof. According to other embodiments, the perfluoropolymer of the first resin matrix component 210 may consist of a copolymer of tetrafluoroethylene (TFE); a copolymer of hexafluoropropylene (HFP); a terpolymer of tetrafluoroethylene (TFE); or any combination thereof.

According to yet other embodiments, the perfluoropolymer of the first resin matrix component 210 may include polytetrafluoroethylene (PTFE), perfluoroalkoxy polymer resin (PFA), fluorinated ethylene propylene (FEP), or any combination thereof. According to still other embodiments, the perfluoropolymer of the first resin matrix component 210 may consist of polytetrafluoroethylene (PTFE), perfluoroalkoxy polymer resin (PFA), fluorinated ethylene propylene (FEP), or any combination thereof.

According to yet other embodiments, the first filled polymer layer 204 may include a particular content of the first resin matrix component 210. For example, the content of the first resin matrix component 210 may be at least about 45 vol. % for a total volume of the first filled polymer layer 204, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the first resin matrix component 210 is not greater than about 63 vol. % for a total volume of the first filled polymer layer 204 or not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the first resin matrix component 210 may be any value between, and including, any of the minimum and maximum values noted above. It will be further appreciated that the content of the first resin matrix component 210 may be within a range between, and including, any of the minimum and maximum values noted above.

According to yet other embodiments, the first filled polymer layer 204 may include a particular content of the perfluoropolymer. For example, the content of the perfluoropolymer may be at least about 45 vol. % for a total volume of the first filled polymer layer 204, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the perfluoropolymer may be not greater than about 63 vol. % for a total volume of the first filled polymer layer 204, such as, not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the perfluoropolymer may be any value between, and including, any of the minimum and maximum values noted above. It will be further appreciated that the content of the perfluoropolymer may be within a range between, and including, any of the minimum and maximum values noted above.

According to still other embodiments, the dielectric substrate 200 may include a particular porosity as measured using x-ray diffraction. For example, the porosity of the substrate 200 may be not greater than about 10 vol. %, such as, not greater than about 9 vol. % or not greater than about 8 vol. % or not greater than about 7 vol. % or not greater than about 6 vol. % or even not greater than about 5 vol. %. It will be appreciated that the porosity of the dielectric substrate 200 may be any value between, and including, any of the values noted above. It will be further appreciated that the porosity of the dielectric substrate 200 may be within a range between, and including, any of the values noted above.

According to yet other embodiments, the dielectric substrate 200 may have a particular average thickness. For example, the average thickness of the dielectric substrate 200 may be at least about 10 microns, such as, at least about 15 microns or at least about 20 microns or at least about 25 microns or at least about 30 microns or at least about 35 microns or at least about 40 microns or at least about 45 microns or at least about 50 microns or at least about 55 microns or at least about 60 microns or at least about 65 microns or at least about 70 microns or even at least about 75 microns. According to yet other embodiments, the average thickness of the dielectric substrate 200 may be not greater than about 2000 microns, such as, not greater than about 1800 microns or not greater than about 1600 microns or not greater than about 1400 microns or not greater than about 1200 microns or not greater than about 1000 microns or not greater than about 800 microns or not greater than about 600 microns or not greater than about 400 microns or not greater than about 200 microns or not greater than about 190 microns or not greater than about 180 microns or not greater than about 170 microns or not greater than about 160 microns or not greater than about 150 microns or not greater than about 140 microns or not greater than about 120 microns or even not greater than about 100 microns. It will be appreciated that the average thickness of the dielectric substrate 200 may be any value between, and including, any of the minimum and maximum values noted above. It will be further appreciated that the average thickness of the dielectric substrate 200 may be within a range between, and including, any of the minimum and maximum values noted above.

According to yet other embodiments, the dielectric substrate 200 may have a particular dissipation factor (Df) as measured in the range between 5 GHz, 20% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 5 GHz, 80% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 10 GHz, 20% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 10 GHz, 80% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 28 GHz, 20% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 28 GHz, 80% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 39 GHz, 20% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 39 GHz, 80% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 76-81 GHz, 20% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 76-81 GHz, 80% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular coefficient of thermal expansion as measured according to IPC-TM-650 2.4.24 Rev. C Glass Transition Temperature and Z-Axis Thermal Expansion by TMA. For example, the dielectric substrate 200 may have a coefficient of thermal expansion of not greater than about 80 ppm/° C.

Figure 2B:
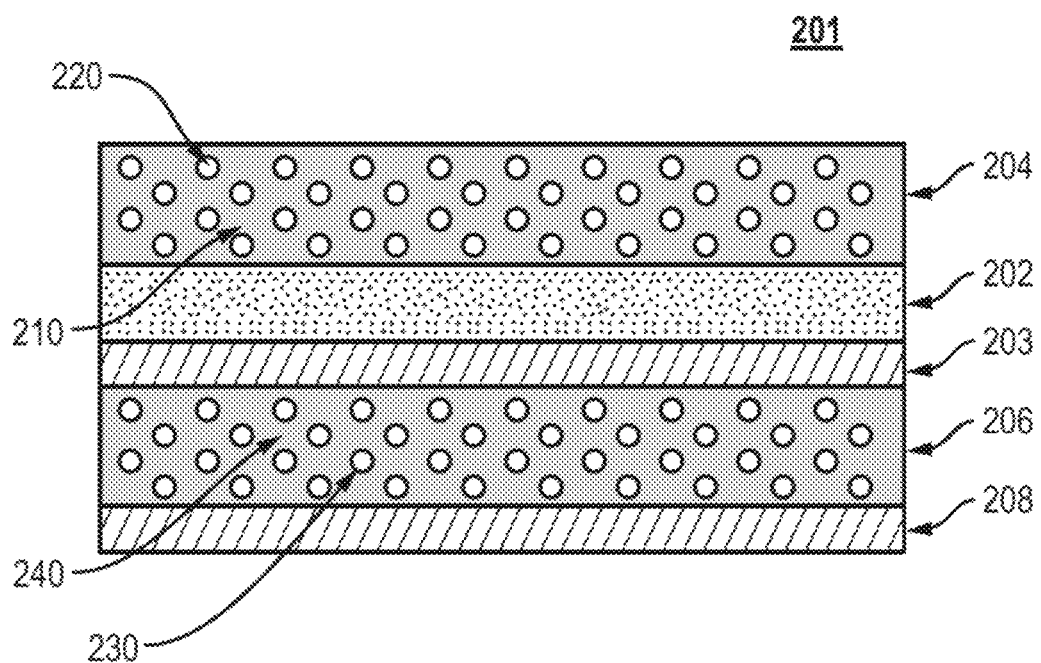

According to other embodiments of a dielectric substrate formed according to forming method 100, FIG. 2b includes diagram of a dielectric substrate 201. As shown in FIG. 2b, the dielectric substrate 201 may include the first fluoropolymer based adhesive layer 203, the polyimide layer 202, the first filled polymer layer 204 overlying the polyimide layer 202, a second filled polymer layer 206 underlying the polyimide layer 202, and a second fluoropolymer based adhesive layer 208 underlying the second filled polymer layer 206. As shown in FIG. 2b, the second filled polymer layer 206 may include a second resin matrix component 230 and a second ceramic filler component 240.

According to still other embodiments, the second fluoropolymer based adhesive layer 208 may have a particular average thickness. For example, the second fluoropolymer based adhesive layer 208 may be at least about 0.2 microns, such as, at least about 0.5 microns or at least about 1.0 microns or at least about 1.5 microns or at least about 2.0 microns or at least about 2.5 microns or even at least about 3.0 microns. According to yet other embodiments, the average thickness of the second fluoropolymer based adhesive layer 208 may be not greater than about 7 microns, such as, not greater than about 6.5 or not greater than about 6.0 or not greater than about 5.5 or not greater than about 5.0 not greater than about 4.9 microns or not greater than about 4.8 microns or not greater than about 4.7 microns or not greater than about 4.6 microns or not greater than about 4.5 microns or not greater than about 4.4 microns or not greater than about 4.3 microns or not greater than about 4.2 microns or not greater than about 4.1 microns or not greater than about 4.1 microns or not greater than about 4.0 microns or not greater than about 3.9 microns or not greater than about 3.8 microns or not greater than about 3.7 microns or not greater than about 3.6 microns or even not greater than about 3.5 microns. It will be appreciated that the average thickness of the second fluoropolymer based adhesive layer 208 may be any value between, and including, any of the minimum and maximum values noted above. It will be further appreciated that the average thickness of the second fluoropolymer based adhesive layer 208 may be within a range between, and including, any of the minimum and maximum values noted above.

According to still other embodiments, the second fluoropolymer based adhesive layer 208 may include a particular material. For example, the second fluoropolymer based adhesive layer 208 may include fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the second fluoropolymer based adhesive layer 208 may consist of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

According to particular embodiments, the second ceramic filler component 240 may include a third filler material, which may have particular characteristics that may improve performance of the dielectric substrate 201.

According to certain embodiments, the third filler material of the second ceramic filler component 240 may have a particular size distribution. For purposes of embodiments described herein, the particle size distribution of a material, for example, the particle size distribution of a third filler material may be described using any combination of particle size distribution D-values $D_{10}$, $D_{50}$ and $D_{90}$. The $D_{10}$ value from a particle size distribution is defined as a particle size value where 10% of the particles are smaller than the value and 90% of the particles are larger than the value. The $D_{50}$ value from a particle size distribution is defined as a particle size value where 50% of the particles are smaller than the value and 50% of the particles are larger than the value. The $D_{90}$ value from a particle size distribution is defined as a particle size value where 90% of the particles are smaller than the value and 10% of the particles are larger than the value. For purposes of embodiments described herein, particle size measurements for a particular material are made using laser diffraction spectroscopy.

According to certain embodiments, the third filler material of the second ceramic filler component 240 may have a particular size distribution $D_{10}$ value. For example, the $D_{10}$ of the third filler material may be at least about 0.2 microns, such as, at least about 0.3 microns or at least about 0.4 microns or at least about 0.5 microns or at least about 0.6 microns or at least about 0.7 microns or at least about 0.8 microns or at least about 0.9 microns or at least about 1.0 microns or at least about 1.1 microns or even at least about 1.2 microns. According to still other embodiments, the $D_{10}$ of the third filler material may be not greater than about 1.6 microns, such as, not greater than about 1.5 microns or even not greater than about 1.4 microns. It will be appreciated that the $D_{10}$ of the third filler material may be any value between, and including, any of the minimum and maximum values noted above. It will be further appreciated that the $D_{10}$ of the third filler material may be within a range between, and including, any of the minimum and maximum values noted above.

According to other embodiments, the third filler material of the second ceramic filler component 240 may have a particular size distribution $D_{50}$ value. For example, the $D_{50}$ of the third filler material may be at least about 0.5 microns, such as, at least about 0.6 microns or at least about 0.7 microns or at least about 0.8 microns or at least about 0.9 microns or at least about 1.0 microns or at least about 1.1 microns or at least about 1.2 microns or at least about 1.3 microns or at least about 1.4 microns or at least about 1.5 microns or at least about 1.6 microns or at least about 1.7 microns or at least about 1.8 microns or at least about 1.9 microns or at least about 2.0 microns or at least about 2.1 microns or even at least about 2.2 microns. According to still other embodiments, the $D_{50}$ of the third filler material may be not greater than about 2.7 microns, such as, not greater than about 2.6 microns or not greater than about 2.5 microns or even not greater than about 2.4. It will be appreciated that the $D_{50}$ of the third filler material may be any value between, and including, any of the minimum and maximum values noted above. It will be further appreciated that the $D_{50}$ of the third filler material may be within a range between, and including, any of the minimum and maximum values noted above.

According to other embodiments, the third filler material of the second ceramic filler component 240 may have a particular size distribution $D_{90}$ value. For example, the $D_{90}$ of the third filler material may be at least about 0.8 microns, such as, at least about 0.9 or at least about 1.0 or at least about 1.1 or at least about 1.2 or at least about 1.3 or at least about 1.4 or at least about 1.5 or at least about 1.6 microns or at least about 1.7 microns or at least about 1.8 microns or at least about 1.9 microns or at least about 2.0 microns or at least about 2.1 microns or at least about 2.2 microns or at least about 2.3 microns or at least about 2.4 microns or at least about 2.5 microns or at least about 2.6 microns or even at least about 2.7 microns. According to still other embodiments, the $D_{90}$ of the third filler material may be not greater than about 8.0 microns, such as, not greater than about 7.5 microns or not greater than about 7.0 microns or not greater than about 6.5 microns or not greater than about 6.0 microns or not greater than about 5.5 microns or not greater than about 5.4 microns or not greater than about 5.3 microns or not greater than about 5.2 or even not greater than about 5.1 microns. It will be appreciated that the $D_{90}$ of the third filler material may be any value between, and including, any of the minimum and maximum values noted above. It will be further appreciated that the $D_{90}$ of the third filler material may be within a range between, and including, any of the minimum and maximum values noted above.

According to still other embodiments, the third filler material of the second ceramic filler component 240 may have a particular average particle size as measured according to laser diffraction spectroscopy. For example, the mean particle size of the third filler material may be not greater than about 10 microns, such as, not greater than about 9 microns or not greater than about 8 microns or not greater than about 7 microns or not greater than about 6 microns or not greater than about 5 microns or not greater than about 4 microns or not greater than about 3 microns or even not greater than about 2 microns. It will be appreciated that the mean particle size of the third filler material may be any value between, and including, any of the values noted above. It will be further appreciated that the mean particle size of the third filler material may be within a range between, and including, any of the values noted above.

According to still other embodiments, the third filler material of the second ceramic filler component 240 may be described as having a particular particle size distribution span (PSDS), where the PSDS is equal to $(D_{90}-D_{10})/D_{50}$, where $D_{90}$ is equal to a $D_{90}$ particle size distribution measurement of the third filler material, $D_{10}$ is equal to a $D_{10}$ particle size distribution measurement of the third filler material, and $D_{50}$ is equal to a $D_{50}$ particle size distribution measurement of the third filler material. For example, the PSDS of the third filler material may be not greater than about 5, such as, not greater than about 4.5 or not greater than about 4.0 or not greater than about 3.5 or not greater than about 3.0 or even not greater than about 2.5. It will be appreciated that the PSDS of the third filler material may be any value between, and including, any of the values noted above. It will be further appreciated that the PSDS of the third filler material may be within a range between, and including, any of the values noted above.

According to still other embodiments, the third filler material of the second ceramic filler component 240 may be described as having a particular average surface area as measured using Brunauer-Emmett-Teller (BET) surface area analysis (Nitrogen Adsorption). For example, the third filler material may have an average surface area of not greater than about 10 m$^2$/g, such as, not greater than about 9.9 m$^2$/g or not greater than about 9.5 m$^2$/g or not greater than about 9.0 m$^2$/g or not greater than about 8.5 m$^2$/g or not greater than about 8.0 m$^2$/g or not greater than about 7.5 m$^2$/g or not greater than about 7.0 m$^2$/g or not greater than about 6.5 m$^2$/g or not greater than about 6.0 m$^2$/g or not greater than about 5.5 m$^2$/g or not greater than about 5.0 m$^2$/g or not greater than about 4.5 m$^2$/g or not greater than about 4.0 m$^2$/g or even not greater than about 3.5 m$^2$/g. According to still other embodiments, the third filler material may have an average surface area of at least about 1.2 m$^2$/g, such as, at least about 2.4 m$^2$/g. It will be appreciated that the average surface area of the third filler material may be any value between, and including, any of the minimum and maximum values noted above. It will be further appreciated that the average surface area of the third filler material may be within a range between, and including, any of the minimum and maximum values noted above.

According to other embodiments, the third filler material of the second ceramic filler component 240 may include a particular material. According to particular embodiments, the third filler material may include a silica based compound. According to still other embodiments, the third filler material may consist of a silica based compound. According to other embodiments, the third filler material may include silica. According to still other embodiments, the third filler material may consist of silica.

According to yet other embodiments, the first filled polymer layer 204 may include a particular content of the second ceramic filler component 240. For example, the content of the second ceramic filler component 240 may be at least about 30 vol. % for a total volume of the second ceramic filler component 240, such as, at least about 31 vol. % or at least about 32 vol. % or at least about 33 vol. % or at least about 34 vol. % or at least about 35 vol. % or at least about 36 vol. % or at least about 37 vol. % or at least about 38 vol. % or at least about 39 vol. % or at least about 40 vol. % or at least about 41 vol. % or at least about 42 vol. % or at least about 43 vol. % or at least about 44 vol. % or at least about 45 vol. % or at least about 46 vol. % or at least about 47 vol. % or at least about 48 vol. % or at least about 49 vol. % or at least about 50 vol. % or at least about 51 vol. % or at least about 52 vol. % or at least about 53 vol. % or even at least about 54 vol. %. According to still other embodiments, the content of the second ceramic filler component 240 may be not greater than about 57 vol. % for a total volume of the first filled polymer layer 204, such as, not greater than about 56 vol. % or even not greater than about 55 vol. %. It will be appreciated that the content of the ceramic filler component 220 may be any value between, and including, any of the minimum and maximum values noted above. It will be further appreciated that the content of the ceramic filler component 220 may be within a range between, and including, any of the minimum and maximum values noted above.

According to still other embodiments, the second ceramic filler component 240 may include a particular content of the third filler material. For example, the content of the third filler material may be at least about 80 vol. % for a total volume of the second ceramic filler component 240, such as, at least about 81 vol. % or at least about 82 vol. % or at least about 83 vol. % or at least about 84 vol. % or at least about 85 vol. % or at least about 86 vol. % or at least about 87 vol. % or at least about 88 vol. % or at least about 89 vol. % or even at least about 90 vol. %. According to still other embodiments, the content of the third filler material may be not greater than about 100 vol. % for a total volume of the second ceramic filler component 240, such as, not greater than about 99 vol. % or not greater than about 98 vol. % or not greater than about 97 vol. % or not greater than about 96 vol. % or not greater than about 95 vol. % or not greater than about 94 vol. % or not greater than about 93 vol. % or even not greater than about 92 vol. %. It will be appreciated that the content of the third filler material may be any value between, and including, any of the minimum and maximum values noted above. It will be further appreciated that the content of the third filler material may be within a range between, and including, any of the minimum and maximum values noted above.

According to still other embodiments, the second ceramic filler component 240 may include a fourth filler material.

According to yet other embodiments, the fourth filler material of the second ceramic filler component 240 may include a particular material. For example, the fourth filler material may include a high dielectric constant ceramic material, such as, a ceramic material having a dielectric constant of at least about 14. According to particular embodiments, the fourth filler material of the second ceramic filler component 240 may include any high dielectric constant ceramic material, such as, TiO$_2$, SrTiO$_3$, ZrTi$_2$O$_6$, MgTiO$_3$, CaTiO$_3$, BaTiO$_4$ or any combination thereof.

According to yet other embodiments, the fourth filler material of the second ceramic filler component 240 may include TiO$_2$. According to still other embodiments, the fourth filler material may consist of TiO$_2$.

According to still other embodiments, the second ceramic filler component 240 may include a particular content of the fourth filler material. For example, the content of the fourth filler material may be at least about 1 vol. % for a total volume of the second ceramic filler component 240, such as, at least about 2 vol. % or at least about 3 vol. % or at least about 4 vol. % or at least about 5 vol. % or at least about 6 vol. % or at least about 7 vol. % or at least about 8 vol. % or at least about 9 vol. % or at least about 10 vol. %. According to still other embodiments, the content of the fourth filler material may be not greater than about 20 vol. % for a total volume of the second ceramic filler component 240, such as, not greater than about 19 vol. % or not greater than about 18 vol. % or not greater than about 17 vol. % or not greater than about 16 vol. % or not greater than about 15 vol. % or not greater than about 14 vol. % or not greater than about 13 vol. % or not greater than about 12 vol. %. It will be appreciated that the content of the fourth filler material may be any value between, and including, any of the minimum and maximum values noted above. It will be further appreciated that the content of the fourth filler material may be within a range between, and including, any of the minimum and maximum values noted above.

According to yet other embodiments, the second ceramic filler component 240 may include a particular content of amorphous material. For example, the second ceramic filler component 240 may include at least about 97% amorphous material, such as, at least about 98% or even at least about 99%. It will be appreciated that the content of amorphous material may be any value between, and including, any of the values noted above. It will be further appreciated that the content of the content of amorphous material may be within a range between, and including, any of the values noted above.

According to other embodiments, the second resin matrix component 230 may include a particular material. For example, the second resin matrix component 230 may include a perfluoropolymer. According to still other embodiments, the second resin matrix component 230 may consist of a perfluoropolymer.

According to yet other embodiments, the perfluoropolymer of the second resin matrix component 230 may include a copolymer of tetrafluoroethylene (TFE); a copolymer of hexafluoropropylene (HFP); a terpolymer of tetrafluoroethylene (TFE); or any combination thereof. According to other embodiments, the perfluoropolymer of the second resin matrix component 230 may consist of a copolymer of tetrafluoroethylene (TFE); a copolymer of hexafluoropropylene (HFP); a terpolymer of tetrafluoroethylene (TFE); or any combination thereof.

According to yet other embodiments, the perfluoropolymer of the second resin matrix component 230 may include polytetrafluoroethylene (PTFE), perfluoroalkoxy polymer resin (PFA), fluorinated ethylene propylene (FEP), or any combination thereof. According to still other embodiments, the perfluoropolymer of the second resin matrix component 230 may consist of polytetrafluoroethylene (PTFE), perfluoroalkoxy polymer resin (PFA), fluorinated ethylene propylene (FEP), or any combination thereof.

According to yet other embodiments, the second filled polymer layer 206 may include a particular content of the second resin matrix component 230. For example, the content of the second resin matrix component 230 may be at least about 45 vol. % for a total volume of the second filled polymer layer 206, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the second resin matrix component 230 is not greater than about 63 vol. % for a total volume of the second filled polymer layer 206 or not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the second resin matrix component 230 may be any value between, and including, any of the minimum and maximum values noted above. It will be further appreciated that the content of the second resin matrix component 230 may be within a range between, and including, any of the minimum and maximum values noted above.

According to yet other embodiments, the second filled polymer layer 206 may include a particular content of the perfluoropolymer. For example, the content of the perfluoropolymer may be at least about 45 vol. % for a total volume of the second filled polymer layer 206, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the perfluoropolymer may be not greater than about 63 vol. % for a total volume of the second filled polymer layer 206, such as, not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the perfluoropolymer may be any value between, and including, any of the minimum and maximum values noted above. It will be further appreciated that the content of the perfluoropolymer may be within a range between, and including, any of the minimum and maximum values noted above.

According to still other embodiments, the dielectric substrate 201 may include a particular porosity as measured using x-ray diffraction. For example, the porosity of the substrate 200 may be not greater than about 10 vol. %, such as, not greater than about 9 vol. % or not greater than about 8 vol. % or not greater than about 7 vol. % or not greater than about 6 vol. % or even not greater than about 5 vol. %. It will be appreciated that the porosity of the dielectric substrate 201 may be any value between, and including, any of the values noted above. It will be further appreciated that the porosity of the dielectric substrate 201 may be within a range between, and including, any of the values noted above.

According to yet other embodiments, the dielectric substrate 201 may have a particular average thickness. For example, the average thickness of the dielectric substrate 201 may be at least about 10 microns, such as, at least about 15 microns or at least about 20 microns or at least about 25 microns or at least about 30 microns or at least about 35 microns or at least about 40 microns or at least about 45 microns or at least about 50 microns or at least about 55 microns or at least about 60 microns or at least about 65 microns or at least about 70 microns or even at least about 75 microns. According to yet other embodiments, the average thickness of the dielectric substrate 201 may be not greater than about 2000 microns, such as, not greater than about 1800 microns or not greater than about 1600 microns or not greater than about 1400 microns or not greater than about 1200 microns or not greater than about 1000 microns or not greater than about 800 microns or not greater than about 600 microns or not greater than about 400 microns or not greater than about 200 microns or not greater than about 190 microns or not greater than about 180 microns or not greater than about 170 microns or not greater than about 160 microns or not greater than about 150 microns or not greater than about 140 microns or not greater than about 120 microns or even not greater than about 100 microns. It will be appreciated that the average thickness of the dielectric substrate 201 may be any value between, and including, any of the minimum and maximum values noted above. It will be further appreciated that the average thickness of the dielectric substrate 201 may be within a range between, and including, any of the minimum and maximum values noted above.

According to yet other embodiments, the dielectric substrate 201 may have a particular dissipation factor (Df) as measured in the range between 5 GHz, 20% RH. For example, the dielectric substrate 201 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 201 may be any value between, and including, any of the values noted above. It will be further appreciated that the dissipation factor of the dielectric substrate 201 may be within a range between, and including, any of the values noted above.

According to yet other embodiments, the dielectric substrate 201 may have a particular dissipation factor (Df) as measured in the range between 5 GHz, 80% RH. For example, the dielectric substrate 201 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 201 may be any value between, and including, any of the values noted above. It will be further appreciated that the dissipation factor of the dielectric substrate 201 may be within a range between, and including, any of the values noted above.

According to yet other embodiments, the dielectric substrate 201 may have a particular dissipation factor (Df) as measured in the range between 10 GHz, 20% RH. For example, the dielectric substrate 201 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 201 may be any value between, and including, any of the values noted above. It will be further appreciated that the dissipation factor of the dielectric substrate 201 may be within a range between, and including, any of the values noted above.

According to yet other embodiments, the dielectric substrate 201 may have a particular dissipation factor (Df) as measured in the range between 10 GHz, 80% RH. For example, the dielectric substrate 201 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 201 may be any value between, and including, any of the values noted above. It will be further appreciated that the dissipation factor of the dielectric substrate 201 may be within a range between, and including, any of the values noted above.

According to yet other embodiments, the dielectric substrate 201 may have a particular dissipation factor (Df) as measured in the range between 28 GHz, 20% RH. For example, the dielectric substrate 201 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 201 may be any value between, and including, any of the values noted above. It will be further appreciated that the dissipation factor of the dielectric substrate 201 may be within a range between, and including, any of the values noted above.

According to yet other embodiments, the dielectric substrate 201 may have a particular dissipation factor (Df) as measured in the range between 28 GHz, 80% RH. For example, the dielectric substrate 201 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 201 may be any value between, and including, any of the values noted above. It will be further appreciated that the dissipation factor of the dielectric substrate 201 may be within a range between, and including, any of the values noted above.

According to yet other embodiments, the dielectric substrate 201 may have a particular dissipation factor (Df) as measured in the range between 39 GHz, 20% RH. For example, the dielectric substrate 201 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 201 may be any value between, and including, any of the values noted above. It will be further appreciated that the dissipation factor of the dielectric substrate 201 may be within a range between, and including, any of the values noted above.

According to yet other embodiments, the dielectric substrate 201 may have a particular dissipation factor (Df) as measured in the range between 39 GHz, 80% RH. For example, the dielectric substrate 201 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 201 may be any value between, and including, any of the values noted above. It will be further appreciated that the dissipation factor of the dielectric substrate 201 may be within a range between, and including, any of the values noted above.

According to yet other embodiments, the dielectric substrate 201 may have a particular dissipation factor (Df) as measured in the range between 76-81 GHz, 20% RH. For example, the dielectric substrate 201 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 201 may be any value between, and including, any of the values noted above. It will be further appreciated that the dissipation factor of the dielectric substrate 201 may be within a range between, and including, any of the values noted above.

According to yet other embodiments, the dielectric substrate 201 may have a particular dissipation factor (Df) as measured in the range between 76-81 GHz, 80% RH. For example, the dielectric substrate 201 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 201 may be any value between, and including, any of the values noted above. It will be further appreciated that the dissipation factor of the dielectric substrate 201 may be within a range between, and including, any of the values noted above.

According to yet other embodiments, the dielectric substrate 201 may have a particular coefficient of thermal expansion as measured according to IPC-TM-650 2.4.24 Rev. C Glass Transition Temperature and Z-Axis Thermal Expansion by TMA. For example, the dielectric substrate 201 may have a coefficient of thermal expansion of not greater than about 80 ppm/° C.

It will be appreciated that the filled polymer layers described in reference to embodiments of dielectric substrates disclosed herein may be directly in contact with the polyimide layer or there may be additional layer in between the filled polymer layers and the polyimide layers. For example, a fluoropolymer layer (filled or unfilled) may be placed between the polyimide layer and the filled polymer layers of the dielectric substrate.

Turning now to embodiments of copper-clad laminates that may include dielectric substrates described herein. Such additional embodiments described herein are generally directed to a copper-clad laminate that may include a copper foil layer and a dielectric substrate overlying the copper foil layer. According to certain embodiments, the dielectric substrate may include a first fluoropolymer based adhesive layer, a polyimide layer overlying the fluoropolymer based adhesive layer, and a first filled polymer layer overlying the polyimide layer, where the first filled polymer layer may include a first resin matrix component, and a first ceramic filler component.

Figure 3:
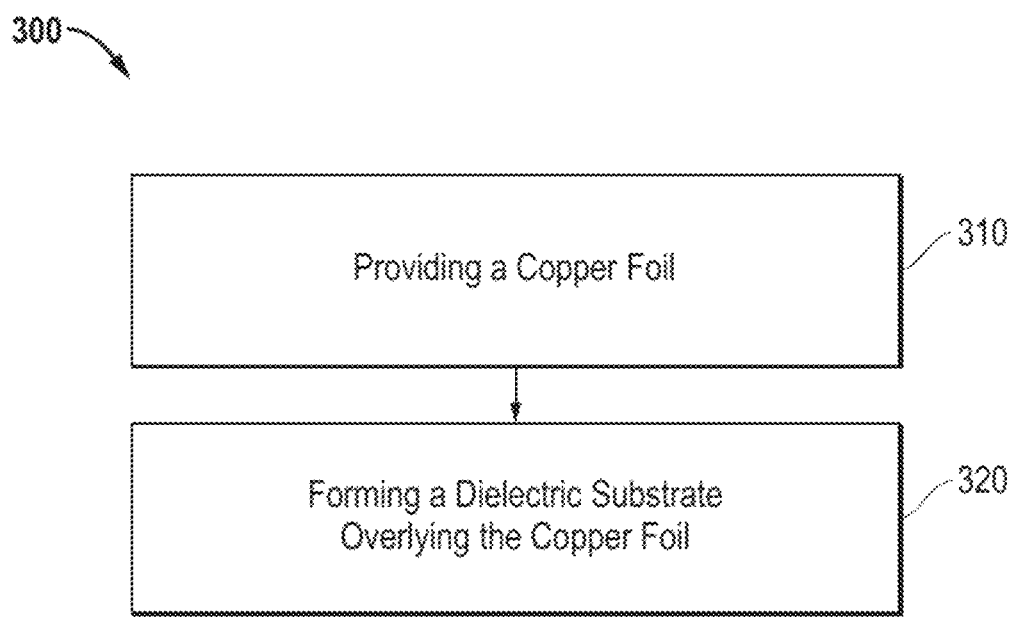
FIG. 3 includes a diagram showing a copper-clad laminate forming method according to embodiments described herein.

Referring next to a method of forming a copper-clad laminate, FIG. 3 includes a diagram showing a forming method 300 for forming a copper-clad laminate according to embodiments described herein. According to particular embodiments, the forming method 300 may include a first step 310 of providing a copper foil layer, and a second step 320 of forming a dielectric substrate overlying the copper foil layer. According to particular embodiments, forming the dielectric substrate may include providing a first fluoropolymer based adhesive layer, providing a polyimide layer overlying the first fluoropolymer based adhesive layer, combining a first resin matrix precursor component and a first ceramic filler precursor component to form a first forming mixture, and forming the first forming mixture into a first filled polymer layer overlying the polyimide layer.

According to particular embodiments, the first ceramic filler precursor component may include a first filler precursor material, which may have particular characteristics that may improve performance of the copper-clad laminate formed by the forming method 300.

According to still other embodiments, the first fluoropolymer based adhesive layer may have a particular average thickness. For example, the first fluoropolymer based adhesive layer may be at least about 0.2 microns, such as, at least about 0.5 microns or at least about 1.0 microns or at least about 1.5 microns or at least about 2.0 microns or at least about 2.5 microns or even at least about 3.0 microns. According to yet other embodiments, the average thickness of the first fluoropolymer based adhesive layer may be not greater than about 7 microns, such as, not greater than about 6.5 or not greater than about 6.0 or not greater than about 5.5 or not greater than about 5.0 not greater than about 4.9 microns or not greater than about 4.8 microns or not greater than about 4.7 microns or not greater than about 4.6 microns or not greater than about 4.5 microns or not greater than about 4.4 microns or not greater than about 4.3 microns or not greater than about 4.2 microns or not greater than about 4.1 microns or not greater than about 4.1 microns or not greater than about 4.0 microns or not greater than about 3.9 microns or not greater than about 3.8 microns or not greater than about 3.7 microns or not greater than about 3.6 microns or even not greater than about 3.5 microns. It will be appreciated that the average thickness of the first fluoropolymer based adhesive layer may be any value between, and including, any of the minimum and maximum values noted above. It will be further appreciated that the average thickness of the first fluoropolymer based adhesive layer may be within a range between, and including, any of the minimum and maximum values noted above.

According to still other embodiments, the first fluoropolymer based adhesive layer 207 may include a particular material. For example, the first fluoropolymer based adhesive layer 207 may include fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the first fluoropolymer based adhesive layer 207 may consist of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

According to certain embodiments, the first filler precursor material may have a particular size distribution. For purposes of embodiments described herein, the particle size distribution of a material, for example, the particle size distribution of a first filler precursor material may be described using any combination of particle size distribution D-values $D_{10}$, $D_{50}$ and $D_{90}$. The $D_{10}$ value from a particle size distribution is defined as a particle size value where 10% of the particles are smaller than the value and 90% of the particles are larger than the value. The $D_{50}$ value from a particle size distribution is defined as a particle size value where 50% of the particles are smaller than the value and 50% of the particles are larger than the value. The $D_{90}$ value from a particle size distribution is defined as a particle size value where 90% of the particles are smaller than the value and 10% of the particles are larger than the value. For purposes of embodiments described herein, particle size measurements for a particular material are made using laser diffraction spectroscopy.

According to certain embodiments, the first filler precursor material may have a particular size distribution $D_{10}$ value. For example, the $D_{10}$ of the first filler precursor material may be at least about 0.2 microns, such as, at least about 0.3 microns or at least about 0.4 microns or at least about 0.5 microns or at least about 0.6 microns or at least about 0.7 microns or at least about 0.8 microns or at least about 0.9 microns or at least about 1.0 microns or at least about 1.1 microns or even at least about 1.2 microns. According to still other embodiments, the $D_{10}$ of the first filler material may be not greater than about 1.6 microns, such as, not greater than about 1.5 microns or even not greater than about 1.4 microns. It will be appreciated that the $D_{10}$ of the first filler precursor material may be any value between, and including, any of the minimum and maximum values noted above. It will be further appreciated that the $D_{10}$ of the first filler precursor material may be within a range between, and including, any of the minimum and maximum values noted above.

According to other embodiments, the first filler precursor material may have a particular size distribution $D_{50}$ value. For example, the $D_{50}$ of the first filler precursor material may be at least about 0.5 microns, such as, at least about 0.6 microns or at least about 0.7 microns or at least about 0.8 microns or at least about 0.9 microns or at least about 1.0 microns or at least about 1.1 microns or at least about 1.2 microns or at least about 1.3 microns or at least about 1.4 microns or at least about 1.5 microns or at least about 1.6 microns or at least about 1.7 microns or at least about 1.8 microns or at least about 1.9 microns or at least about 2.0 microns or at least about 2.1 microns or even at least about 2.2 microns. According to still other embodiments, the $D_{50}$ of the first filler material may be not greater than about 2.7 microns, such as, not greater than about 2.6 microns or not greater than about 2.5 microns or even not greater than about 2.4. It will be appreciated that the $D_{50}$ of the first filler precursor material may be any value between, and including, any of the minimum and maximum values noted above. It will be further appreciated that the $D_{50}$ of the first filler precursor material may be within a range between, and including, any of the minimum and maximum values noted above.

According to other embodiments, the first filler precursor material may have a particular size distribution $D_{90}$ value. For example, the $D_{90}$ of the first filler precursor material may be at least about 0.8 microns, such as, at least about 0.9 or at least about 1.0 or at least about 1.1 or at least about 1.2 or at least about 1.3 or at least about 1.4 or at least about 1.5 or at least about 1.6 microns or at least about 1.7 microns or at least about 1.8 microns or at least about 1.9 microns or at least about 2.0 microns or at least about 2.1 microns or at least about 2.2 microns or at least about 2.3 microns or at least about 2.4 microns or at least about 2.5 microns or at least about 2.6 microns or even at least about 2.7 microns. According to still other embodiments, the $D_{90}$ of the first filler material may be not greater than about 8.0 microns, such as, not greater than about 7.5 microns or not greater than about 7.0 microns or not greater than about 6.5 microns or not greater than about 6.0 microns or not greater than about 5.5 microns or not greater than about 5.4 microns or not greater than about 5.3 microns or not greater than about 5.2 or even not greater than about 5.1 microns. It will be appreciated that the $D_{90}$ of the first filler precursor material may be any value between, and including, any of the minimum and maximum values noted above. It will be further appreciated that the $D_{90}$ of the first filler precursor material may be within a range between, and including, any of the minimum and maximum values noted above.

According to still other embodiments, the first filler precursor material may have a particular average particle size as measured using laser diffraction spectroscopy. For example, the mean particle size of the first filler precursor material may be not greater than about 10 microns, such as, not greater than about 9 microns or not greater than about 8 microns or not greater than about 7 microns or not greater than about 6 microns or not greater than about 5 microns or not greater than about 4 microns or not greater than about 3 microns or even not greater than about 2 microns. It will be appreciated that the mean particle size of the first filler precursor material may be any value between, and including, any of the values noted above. It will be further appreciated that the mean particle size of the first filler precursor material may be within a range between, and including, any of the values noted above.

According to still other embodiments, the first filler precursor material may be described as having a particular particle size distribution span (PSDS), where the PSDS of the first filler precursor material is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material. For example, the PSDS of the first filler precursor material may be not greater than about 5, such as, not greater than about 4.5 or not greater than about 4.0 or not greater than about 3.5 or not greater than about 3.0 or even not greater than about 2.5. It will be appreciated that the PSDS of the first filler precursor material may be any value between, and including, any of the values noted above. It will be further appreciated that the PSDS of the first filler precursor material may be within a range between, and including, any of the values noted above.

According to still other embodiments, the first filler precursor material may be described as having a particular average surface area as measured using Brunauer-Emmett-Teller (BET) surface area analysis (Nitrogen Adsorption). For example, the first filler precursor material may have an average surface area of not greater than about 10 m$^2$/g, such as, not greater than about 9.9 m$^2$/g or not greater than about 9.5 m$^2$/g or not greater than about 9.0 m$^2$/g or not greater than about 8.5 m$^2$/g or not greater than about 8.0 m$^2$/g or not greater than about 7.5 m$^2$/g or not greater than about 7.0 m$^2$/g or not greater than about 6.5 m$^2$/g or not greater than about 6.0 m$^2$/g or not greater than about 5.5 m$^2$/g or not greater than about 5.0 m$^2$/g or not greater than about 4.5 m$^2$/g or not greater than about 4.0 m$^2$/g or even not greater than about 3.5 m$^2$/g. According to still other embodiments, the first filler precursor material may have an average surface area of at least about 1.2 m$^2$/g, such as, at least about 2.4 m$^2$/g. It will be appreciated that the average surface area of the first filler precursor material may be any value between, and including, any of the minimum and maximum values noted above. It will be further appreciated that the average surface area of the first filler precursor material may be within a range between, and including, any of the minimum and maximum values noted above.

According to other embodiments, the first filler precursor material may include a particular material. According to particular embodiments, the first filler precursor material may include a silica based compound. According to still other embodiments, the first filler precursor material may consist of a silica based compound. According to other embodiments, the first filler precursor material may include silica. According to still other embodiments, the first filler precursor material may consist of silica.

According to yet other embodiments, the first forming mixture may include a particular content of the first ceramic filler precursor component. For example, the content of the first ceramic filler precursor component may be at least about 30 vol. % for a total volume of the first forming mixture, such as, at least about 31 vol. % or at least about 32 vol. % or at least about 33 vol. % or at least about 34 vol. % or at least about 35 vol. % or at least about 36 vol. % or at least about 37 vol. % or at least about 38 vol. % or at least about 39 vol. % or at least about 40 vol. % or at least about 41 vol. % or at least about 42 vol. % or at least about 43 vol. % or at least about 44 vol. % or at least about 45 vol. % or 46 vol. % or at least about 47 vol. % or at least about 48 vol. % or at least about 49 vol. % or at least about 50 vol. % or at least about 51 vol. % or at least about 52 vol. % or at least about 53 vol. % or even at least about 54 vol. %. According to still other embodiments, the content of the first ceramic filler precursor component may be not greater than about 57 vol. % for a total volume of the first forming mixture, such as, not greater than about 56 vol. % or even not greater than about 55 vol. %. It will be appreciated that the content of the first ceramic filler precursor component may be any value between, and including, any of the minimum and maximum values noted above. It will be further appreciated that the content of the first ceramic filler precursor component may be within a range between, and including, any of the minimum and maximum values noted above.

According to still other embodiments, the first ceramic filler precursor component may include a particular content of the first filler precursor material. For example, the content of the first filler precursor material may be at least about 80 vol. % for a total volume of the first ceramic filler precursor component, such as, at least about 81 vol. % or at least about 82 vol. % or at least about 83 vol. % or at least about 84 vol. % or at least about 85 vol. % or at least about 86 vol. % or at least about 87 vol. % or at least about 88 vol. % or at least about 89 vol. % or even at least about 90 vol. %. According to still other embodiments, the content of the first filler precursor material may be not greater than about 100 vol. % for a total volume of the first ceramic filler precursor component, such as, not greater than about 99 vol. % or not greater than about 98 vol. % or not greater than about 97 vol. % or not greater than about 96 vol. % or not greater than about 95 vol. % or not greater than about 94 vol. % or not greater than about 93 vol. % or even not greater than about 92 vol. %. It will be appreciated that the content of the first filler precursor material may be any value between, and including, any of the minimum and maximum values noted above. It will be further appreciated that the content of the first filler precursor material may be within a range between, and including, any of the minimum and maximum values noted above.

According to still other embodiments, the first ceramic filler precursor component may include a second filler precursor material.

According to yet other embodiments, the second filler precursor material may include a particular material. For example, the second filler precursor material may include a high dielectric constant ceramic material, such as, a ceramic material having a dielectric constant of at least about 14. According to particular embodiments, the second filler precursor material may include any high dielectric constant ceramic material, such as, $TiO_2$, $SrTiO_3$, $ZrTi_2O_6$, $MgTiO_3$, $CaTiO_3$, $BaTiO_4$ or any combination thereof.

According to yet other embodiments, the second filler precursor material may include $TiO_2$. According to still other embodiments, the second filler precursor material may consist of $TiO_2$.

According to still other embodiments, the first ceramic filler precursor component may include a particular content of the second filler precursor material. For example, the content of the second filler precursor material may be at least about 1 vol. % for a total volume of the first ceramic filler precursor component, such as, at least about 2 vol. % or at least about 3 vol. % or at least about 4 vol. % or at least about 5 vol. % or at least about 6 vol. % or at least about 7 vol. % or at least about 8 vol. % or at least about 9 vol. % or at least about 10 vol. %. According to still other embodiments, the content of the second filler precursor material may be not greater than about 20 vol. % for a total volume of the first ceramic filler precursor component, such as, not greater than about 19 vol. % or not greater than about 18 vol. % or not greater than about 17 vol. % or not greater than about 16 vol. % or not greater than about 15 vol. % or not greater than about 14 vol. % or not greater than about 13 vol. % or not greater than about 12 vol. %. It will be appreciated that the content of the second filler precursor material may be any value between, and including, any of the minimum and maximum values noted above. It will be further appreciated that the content of the second filler precursor material may be within a range between, and including, any of the minimum and maximum values noted above.

According to yet other embodiments, the first ceramic filler precursor component may include a particular content of amorphous material. For example, the first ceramic filler precursor component may include at least about 97% amorphous material, such as, at least about 98% or even at least about 99%. It will be appreciated that the content of amorphous material may be any value between, and including, any of the values noted above. It will be further appreciated that the content of the content of amorphous material may be within a range between, and including, any of the values noted above.

According to other embodiments, the first resin matrix precursor component may include a particular material. For example, the first resin matrix precursor component may include a perfluoropolymer. According to still other embodiments, the first resin matrix precursor component may consist of a perfluoropolymer.

According to yet other embodiments, the perfluoropolymer of the first resin precursor matrix component may include a copolymer of tetrafluoroethylene (TFE); a copolymer of hexafluoropropylene (HFP); a terpolymer of tetrafluoroethylene (TFE); or any combination thereof. According to other embodiments, the perfluoropolymer of the first resin matrix precursor component may consist of a copolymer of tetrafluoroethylene (TFE); a copolymer of hexafluoropropylene (HFP); a terpolymer of tetrafluoroethylene (TFE); or any combination thereof.

According to yet other embodiments, the perfluoropolymer of the first resin matrix precursor component may include polytetrafluoroethylene (PTFE), perfluoroalkoxy polymer resin (PFA), fluorinated ethylene propylene (FEP), or any combination thereof. According to still other embodiments, the perfluoropolymer of the first resin matrix precursor component may consist of polytetrafluoroethylene (PTFE), perfluoroalkoxy polymer resin (PFA), fluorinated ethylene propylene (FEP), or any combination thereof.

According to yet other embodiments, the first forming mixture may include a particular content of the first resin matrix precursor component. For example, the content of the first resin matrix precursor component may be at least about 45 vol. % for a total volume of the first forming mixture, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the first resin matrix precursor component is not greater than about 63 vol. % for a total volume of the first forming mixture or not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the first resin matrix precursor component may be any value between, and including, any of the minimum and maximum values noted above. It will be further appreciated that the content of the first resin matrix precursor component may be within a range between, and including, any of the minimum and maximum values noted above.

According to yet other embodiments, the first forming mixture may include a particular content of the perfluoropolymer. For example, the content of the perfluoropolymer may be at least about 45 vol. % for a total volume of the first forming mixture, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the perfluoropolymer may be not greater than about 63 vol. % for a total volume of the first forming mixture, such as, not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the perfluoropolymer may be any value between, and including, any of the minimum and maximum values noted above. It will be further appreciated that the content of the perfluoropolymer may be within a range between, and including, any of the minimum and maximum values noted above.

According to yet other embodiment, the forming the dielectric substrate may further include combining a second resin matrix precursor component and a second ceramic filler precursor component to for a second forming mixture, and forming the second forming mixture into a second filled polymer layer underlying the polyimide layer, and providing a second fluoropolymer based adhesive layer underlying the second filled polymer layer.

According to still other embodiments, the second fluoropolymer based adhesive layer may have a particular average thickness. For example, the second fluoropolymer based adhesive layer may be at least about 0.2 microns, such as, at least about 0.5 microns or at least about 1.0 microns or at least about 1.5 microns or at least about 2.0 microns or at least about 2.5 microns or even at least about 3.0 microns. According to yet other embodiments, the average thickness of the second fluoropolymer based adhesive layer may be not greater than about 7 microns, such as, not greater than about 6.5 or not greater than about 6.0 or not greater than about 5.5 or not greater than about 5.0 not greater than about 4.9 microns or not greater than about 4.8 microns or not greater than about 4.7 microns or not greater than about 4.6 microns or not greater than about 4.5 microns or not greater than about 4.4 microns or not greater than about 4.3 microns or not greater than about 4.2 microns or not greater than about 4.1 microns or not greater than about 4.1 microns or not greater than about 4.0 microns or not greater than about 3.9 microns or not greater than about 3.8 microns or not greater than about 3.7 microns or not greater than about 3.6 microns or even not greater than about 3.5 microns. It will be appreciated that the average thickness of the second fluoropolymer based adhesive layer may be any value between, and including, any of the minimum and maximum values noted above. It will be further appreciated that the average thickness of the second fluoropolymer based adhesive layer may be within a range between, and including, any of the minimum and maximum values noted above.

According to still other embodiments, the second fluoropolymer based adhesive layer 207 may include a particular material. For example, the second fluoropolymer based adhesive layer 207 may include fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the second fluoropolymer based adhesive layer 207 may consist of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

According to particular embodiments, the second ceramic filler precursor component may include a third filler precursor material, which may have particular characteristics that may improve performance of the copper-clad laminate formed by the forming method 300.

According to certain embodiments, the third filler precursor material may have a particular size distribution. For purposes of embodiments described herein, the particle size distribution of a material, for example, the particle size distribution of a third filler precursor material may be described using any combination of particle size distribution D-values $D_{10}$, $D_{50}$ and $D_{90}$. The $D_{10}$ value from a particle size distribution is defined as a particle size value where 10% of the particles are smaller than the value and 90% of the particles are larger than the value. The $D_{50}$ value from a particle size distribution is defined as a particle size value where 50% of the particles are smaller than the value and 50% of the particles are larger than the value. The $D_{90}$ value from a particle size distribution is defined as a particle size value where 90% of the particles are smaller than the value and 10% of the particles are larger than the value. For purposes of embodiments described herein, particle size measurements for a particular material are made using laser diffraction spectroscopy.

According to certain embodiments, the third filler precursor material may have a particular size distribution $D_{10}$ value. For example, the $D_{10}$ of the third filler precursor material may be at least about 0.2 microns, such as, at least about 0.3 microns or at least about 0.4 microns or at least about 0.5 microns or at least about 0.6 microns or at least about 0.7 microns or at least about 0.8 microns or at least about 0.9 microns or at least about 1.0 microns or at least about 1.1 microns or even at least about 1.2 microns. According to still other embodiments, the $D_{10}$ of the third filler material may be not greater than about 1.6 microns, such as, not greater than about 1.5 microns or even not greater than about 1.4 microns. It will be appreciated that the $D_{10}$ of the third filler precursor material may be any value between, and including, any of the minimum and maximum values noted above. It will be further appreciated that the $D_{10}$ of the third filler precursor material may be within a range between, and including, any of the minimum and maximum values noted above.

According to other embodiments, the third filler precursor material may have a particular size distribution $D_{50}$ value.

For example, the $D_{50}$ of the third filler precursor material may be at least about 0.5 microns, such as, at least about 0.6 microns or at least about 0.7 microns or at least about 0.8 microns or at least about 0.9 microns or at least about 1.0 microns or at least about 1.1 microns or at least about 1.2 microns or at least about 1.3 microns or at least about 1.4 microns or at least about 1.5 microns or at least about 1.6 microns or at least about 1.7 microns or at least about 1.8 microns or at least about 1.9 microns or at least about 2.0 microns or at least about 2.1 microns or even at least about 2.2 microns. According to still other embodiments, the $D_{50}$ of the third filler material may be not greater than about 2.7 microns, such as, not greater than about 2.6 microns or not greater than about 2.5 microns or even not greater than about 2.4. It will be appreciated that the $D_{50}$ of the third filler precursor material may be any value between, and including, any of the minimum and maximum values noted above. It will be further appreciated that the $D_{50}$ of the third filler precursor material may be within a range between, and including, any of the minimum and maximum values noted above.

According to other embodiments, the third filler precursor material may have a particular size distribution $D_{90}$ value. For example, the $D_{90}$ of the third filler precursor material may be at least about 0.8 microns, such as, at least about 0.9 or at least about 1.0 or at least about 1.1 or at least about 1.2 or at least about 1.3 or at least about 1.4 or at least about 1.5 or at least about 1.6 microns or at least about 1.7 microns or at least about 1.8 microns or at least about 1.9 microns or at least about 2.0 microns or at least about 2.1 microns or at least about 2.2 microns or at least about 2.3 microns or at least about 2.4 microns or at least about 2.5 microns or at least about 2.6 microns or even at least about 2.7 microns. According to still other embodiments, the $D_{90}$ of the third filler material may be not greater than about 8.0 microns, such as, not greater than about 7.5 microns or not greater than about 7.0 microns or not greater than about 6.5 microns or not greater than about 6.0 microns or not greater than about 5.5 microns or not greater than about 5.4 microns or not greater than about 5.3 microns or not greater than about 5.2 or even not greater than about 5.1 microns. It will be appreciated that the $D_{90}$ of the third filler precursor material may be any value between, and including, any of the minimum and maximum values noted above. It will be further appreciated that the $D_{90}$ of the third filler precursor material may be within a range between, and including, any of the minimum and maximum values noted above.

According to still other embodiments, the third filler precursor material may have a particular average particle size as measured using laser diffraction spectroscopy. For example, the mean particle size of the third filler precursor material may be not greater than about 10 microns, such as, not greater than about 9 microns or not greater than about 8 microns or not greater than about 7 microns or not greater than about 6 microns or not greater than about 5 microns or not greater than about 4 microns or not greater than about 3 microns or even not greater than about 2 microns. It will be appreciated that the mean particle size of the third filler precursor material may be any value between, and including, any of the values noted above. It will be further appreciated that the mean particle size of the third filler precursor material may be within a range between, and including, any of the values noted above.

According to still other embodiments, the third filler precursor material may be described as having a particular particle size distribution span (PSDS), where the PSDS of the third filler precursor material is equal to $(D_{90}-D_{10})/D_{50}$, where $D_{90}$ is equal to a $D_{90}$ particle size distribution measurement of the third filler precursor material, $D_{10}$ is equal to a $D_{10}$ particle size distribution measurement of the third filler precursor material, and $D_{50}$ is equal to a $D_{50}$ particle size distribution measurement of the third filler precursor material. For example, the PSDS of the third filler precursor material may be not greater than about 5, such as, not greater than about 4.5 or not greater than about 4.0 or not greater than about 3.5 or not greater than about 3.0 or even not greater than about 2.5. It will be appreciated that the PSDS of the third filler precursor material may be any value between, and including, any of the values noted above. It will be further appreciated that the PSDS of the third filler precursor material may be within a range between, and including, any of the values noted above.

According to still other embodiments, the third filler precursor material may be described as having a particular average surface area as measured using Brunauer-Emmett-Teller (BET) surface area analysis (Nitrogen Adsorption). For example, the third filler precursor material may have an average surface area of not greater than about 10 m²/g, such as, not greater than about 9.9 m²/g or not greater than about 9.5 m²/g or not greater than about 9.0 m²/g or not greater than about 8.5 m²/g or not greater than about 8.0 m²/g or not greater than about 7.5 m²/g or not greater than about 7.0 m²/g or not greater than about 6.5 m²/g or not greater than about 6.0 m²/g or not greater than about 5.5 m²/g or not greater than about 5.0 m²/g or not greater than about 4.5 m²/g or not greater than about 4.0 m²/g or even not greater than about 3.5 m²/g. According to still other embodiments, the third filler precursor material may have an average surface area of at least about 1.2 m²/g, such as, at least about 2.4 m²/g. It will be appreciated that the average surface area of the third filler precursor material may be any value between, and including, any of the minimum and maximum values noted above. It will be further appreciated that the average surface area of the third filler precursor material may be within a range between, and including, any of the minimum and maximum values noted above.

According to other embodiments, the third filler precursor material may include a particular material. According to particular embodiments, the third filler precursor material may include a silica based compound. According to still other embodiments, the third filler precursor material may consist of a silica based compound. According to other embodiments, the third filler precursor material may include silica. According to still other embodiments, the third filler precursor material may consist of silica.

According to yet other embodiments, the second forming mixture may include a particular content of the second ceramic filler precursor component. For example, the content of the second ceramic filler precursor component may be at least about 30 vol. % for a total volume of the second forming mixture, such as, at least about 31 vol. % or at least about 32 vol. % or at least about 33 vol. % or at least about 34 vol. % or at least about 35 vol. % or at least about 36 vol. % or at least about 37 vol. % or at least about 38 vol. % or at least about 39 vol. % or at least about 40 vol. % or at least about 41 vol. % or at least about 42 vol. % or at least about 43 vol. % or at least about 44 vol. % or at least about 45 vol. % or 46 vol. % or at least about 47 vol. % or at least about 48 vol. % or at least about 49 vol. % or at least about 50 vol. % or at least about 51 vol. % or at least about 52 vol. % or at least about 53 vol. % or even at least about 54 vol. %. According to still other embodiments, the content of the second ceramic filler precursor component may be not greater than about 57 vol. % for a total volume of the second forming mixture, such as, not greater than about 56 vol. % or even not greater than about 55 vol. %. It will be appreciated that the content of the second ceramic filler precursor component may be any value between, and including, any of the minimum and maximum values noted above. It will be further appreciated that the content of the second ceramic filler precursor component may be within a range between, and including, any of the minimum and maximum values noted above.

According to still other embodiments, the second ceramic filler precursor component may include a particular content of the third filler precursor material. For example, the content of the third filler precursor material may be at least about 80 vol. % for a total volume of the second ceramic filler precursor component, such as, at least about 81 vol. % or at least about 82 vol. % or at least about 83 vol. % or at least about 84 vol. % or at least about 85 vol. % or at least about 86 vol. % or at least about 87 vol. % or at least about 88 vol. % or at least about 89 vol. % or even at least about 90 vol. %. According to still other embodiments, the content of the third filler precursor material may be not greater than about 100 vol. % for a total volume of the second ceramic filler precursor component, such as, not greater than about 99 vol. % or not greater than about 98 vol. % or not greater than about 97 vol. % or not greater than about 96 vol. % or not greater than about 95 vol. % or not greater than about 94 vol. % or not greater than about 93 vol. % or even not greater than about 92 vol. %. It will be appreciated that the content of the third filler precursor material may be any value between, and including, any of the minimum and maximum values noted above. It will be further appreciated that the content of the third filler precursor material may be within a range between, and including, any of the minimum and maximum values noted above.

According to still other embodiments, the second ceramic filler precursor component may include a fourth filler precursor material.

According to yet other embodiments, the fourth filler precursor material may include a particular material. For example, the fourth filler precursor material may include a high dielectric constant ceramic material, such as, a ceramic material having a dielectric constant of at least about 14. According to particular embodiments, the fourth filler precursor material may include any high dielectric constant ceramic material, such as, $TiO_2$, $SrTiO_3$, $ZrTi_2O_6$, $MgTiO_3$, $CaTiO_3$, $BaTiO_4$ or any combination thereof.

According to yet other embodiments, the fourth filler precursor material may include $TiO_2$. According to still other embodiments, the fourth filler precursor material may consist of $TiO_2$.

According to still other embodiments, the second ceramic filler precursor component may include a particular content of the fourth filler precursor material. For example, the content of the fourth filler precursor material may be at least about 1 vol. % for a total volume of the second ceramic filler precursor component, such as, at least about 2 vol. % or at least about 3 vol. % or at least about 4 vol. % or at least about 5 vol. % or at least about 6 vol. % or at least about 7 vol. % or at least about 8 vol. % or at least about 9 vol. % or at least about 10 vol. %. According to still other embodiments, the content of the fourth filler precursor material may be not greater than about 20 vol. % for a total volume of the second ceramic filler precursor component, such as, not greater than about 19 vol. % or not greater than about 18 vol. % or not greater than about 17 vol. % or not greater than about 16 vol. % or not greater than about 15 vol. % or not greater than about 14 vol. % or not greater than about 13 vol. % or not greater than about 12 vol. %. It will be appreciated that the content of the fourth filler precursor material may be any value between, and including, any of the minimum and maximum values noted above. It will be further appreciated that the content of the fourth filler precursor material may be within a range between, and including, any of the minimum and maximum values noted above.

According to yet other embodiments, the second ceramic filler precursor component may include a particular content of amorphous material. For example, the second ceramic filler precursor component may include at least about 97% amorphous material, such as, at least about 98% or even at least about 99%. It will be appreciated that the content of amorphous material may be any value between, and including, any of the values noted above. It will be further appreciated that the content of the content of amorphous material may be within a range between, and including, any of the values noted above.

According to other embodiments, the second resin matrix precursor component may include a particular material. For example, the second resin matrix precursor component may include a perfluoropolymer. According to still other embodiments, the second resin matrix precursor component may consist of a perfluoropolymer.

According to yet other embodiments, the perfluoropolymer of the first resin precursor matrix component may include a copolymer of tetrafluoroethylene (TFE); a copolymer of hexafluoropropylene (HFP); a terpolymer of polymer of tetrafluoroethylene (TFE); or any combination thereof. According to other embodiments, the perfluoropolymer of the second resin matrix precursor component may consist of a copolymer of tetrafluoroethylene (TFE); a copolymer of hexafluoropropylene (HFP); a terpolymer of tetrafluoroethylene (TFE); or any combination thereof.

According to yet other embodiments, the perfluoropolymer of the second resin matrix precursor component may include polytetrafluoroethylene (PTFE), perfluoroalkoxy polymer resin (PFA), fluorinated ethylene propylene (FEP), or any combination thereof. According to still other embodiments, the perfluoropolymer of the second resin matrix precursor component may consist of polytetrafluoroethylene (PTFE), perfluoroalkoxy polymer resin (PFA), fluorinated ethylene propylene (FEP), or any combination thereof.

According to yet other embodiments, the second forming mixture may include a particular content of the second resin matrix precursor component. For example, the content of the second resin matrix precursor component may be at least about 45 vol. % for a total volume of the second forming mixture, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the second resin matrix precursor component is not greater than about 63 vol. % for a total volume of the second forming mixture or not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the second resin matrix precursor component may be any value between, and including, any of the minimum and maximum values noted above. It will be further appreciated that the content of the second resin matrix precursor component may be within a range between, and including, any of the minimum and maximum values noted above.

According to yet other embodiments, the second forming mixture may include a particular content of the perfluoropolymer. For example, the content of the perfluoropolymer may be at least about 45 vol. % for a total volume of the second forming mixture, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the perfluoropolymer may be not greater than about 63 vol. % for a total volume of the second forming mixture, such as, not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the perfluoropolymer may be any value between, and including, any of the minimum and maximum values noted above. It will be further appreciated that the content of the perfluoropolymer may be within a range between, and including, any of the minimum and maximum values noted above.

Figure 4A:
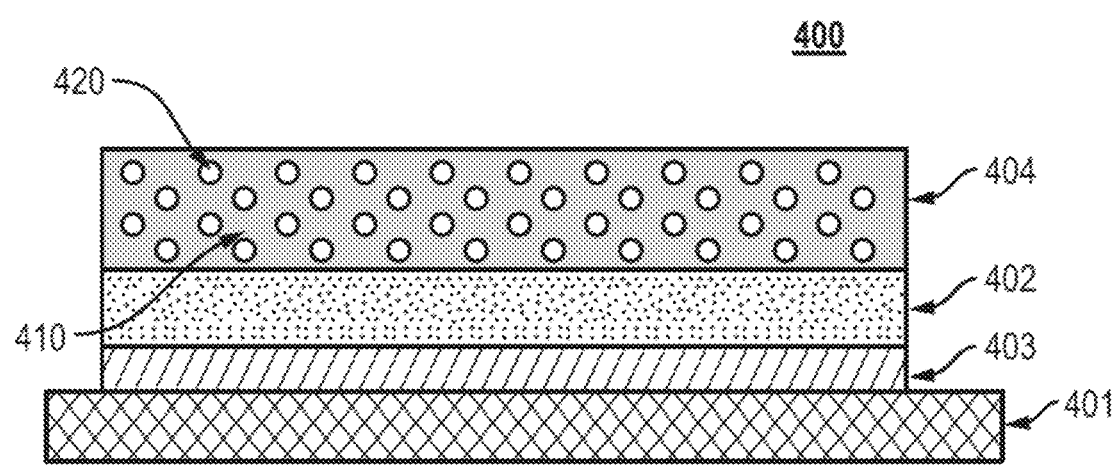
FIGS. 4a and 4b include illustrations showing the configuration of copper-clad laminates formed according to embodiments described herein.

Referring now to embodiments of the copper-clad laminate formed according to forming method 300, FIG. 4a includes diagram of a copper-clad lamination 400. As shown in FIG. 4a, the copper-clad laminate 400 may include a copper foil layer 401, and a dielectric substrate 405 overlying a surface of the copper foil layer 401. As further shown in FIG. 4a, the dielectric substrate 405 may include a first fluoropolymer based adhesive layer 403, a polyimide layer 402 and a first filled polymer layer 404 overlying the polyimide layer 402. As shown in FIG. 4a, the first filled polymer layer 404 may include a first resin matrix component 410 and a first ceramic filler component 420.

According to still other embodiments, the first fluoropolymer based adhesive layer 403 may have a particular average thickness. For example, the first fluoropolymer based adhesive layer 403 may be at least about 0.2 microns, such as, at least about 0.5 microns or at least about 1.0 microns or at least about 1.5 microns or at least about 2.0 microns or at least about 2.5 microns or even at least about 3.0 microns. According to yet other embodiments, the average thickness of the first fluoropolymer based adhesive layer 403 may be not greater than about 7 microns, such as, not greater than about 6.5 or not greater than about 6.0 or not greater than about 5.5 or not greater than about 5.0 not greater than about 4.9 microns or not greater than about 4.8 microns or not greater than about 4.7 microns or not greater than about 4.6 microns or not greater than about 4.5 microns or not greater than about 4.4 microns or not greater than about 4.3 microns or not greater than about 4.2 microns or not greater than about 4.1 microns or not greater than about 4.1 microns or not greater than about 4.0 microns or not greater than about 3.9 microns or not greater than about 3.8 microns or not greater than about 3.7 microns or not greater than about 3.6 microns or even not greater than about 3.5 microns. It will be appreciated that the average thickness of the first fluoropolymer based adhesive layer 403 may be any value between, and including, any of the minimum and maximum values noted above. It will be further appreciated that the average thickness of the first fluoropolymer based adhesive layer 403 may be within a range between, and including, any of the minimum and maximum values noted above.

According to still other embodiments, the first fluoropolymer based adhesive layer 403 may include a particular material. For example, the first fluoropolymer based adhesive layer 403 may include fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the first fluoropolymer based adhesive layer 403 may consist of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

According to particular embodiments, the first ceramic filler component 420 may include a first filler material, which may have particular characteristics that may improve performance of the dielectric substrate 405.

According to certain embodiments, the first filler material of the first ceramic filler component 420 may have a particular size distribution. For purposes of embodiments described herein, the particle size distribution of a material, for example, the particle size distribution of a first filler material may be described using any combination of particle size distribution D-values $D_{10}$, $D_{50}$ and $D_{90}$. The $D_{10}$ value from a particle size distribution is defined as a particle size value where 10% of the particles are smaller than the value and 90% of the particles are larger than the value. The $D_{50}$ value from a particle size distribution is defined as a particle size value where 50% of the particles are smaller than the value and 50% of the particles are larger than the value. The $D_{90}$ value from a particle size distribution is defined as a particle size value where 90% of the particles are smaller than the value and 10% of the particles are larger than the value. For purposes of embodiments described herein, particle size measurements for a particular material are made using laser diffraction spectroscopy.

According to certain embodiments, the first filler material of the first ceramic filler component 420 may have a particular size distribution $D_{10}$ value. For example, the $D_{10}$ of the first filler material may be at least about 0.2 microns, such as, at least about 0.3 microns or at least about 0.4 microns or at least about 0.5 microns or at least about 0.6 microns or at least about 0.7 microns or at least about 0.8 microns or at least about 0.9 microns or at least about 1.0 microns or at least about 1.1 microns or even at least about 1.2 microns. According to still other embodiments, the $D_{10}$ of the first filler material may be not greater than about 1.6 microns, such as, not greater than about 1.5 microns or even not greater than about 1.4 microns. It will be appreciated that the $D_{10}$ of the first filler material may be any value between, and including, any of the minimum and maximum values noted above. It will be further appreciated that the $D_{10}$ of the first filler material may be within a range between, and including, any of the minimum and maximum values noted above.

According to other embodiments, the first filler material of the first ceramic filler component 420 may have a particular size distribution $D_{50}$ value. For example, the $D_{50}$ of the first filler material may be at least about 0.8 microns, such as, at least about 0.9 microns or at least about 1.0 microns or at least about 1.1 microns or at least about 1.2 microns or at least about 1.3 microns or at least about 1.4 microns or at least about 1.5 microns or at least about 1.6 microns or at least about 1.7 microns or at least about 1.8 microns or at least about 1.9 microns or at least about 2.0 microns or at least about 2.1 microns or even at least about 2.2 microns. According to still other embodiments, the $D_{50}$ of the first filler material may be not greater than about 2.7 microns, such as, not greater than about 2.6 microns or not greater than about 2.5 microns or even not greater than about 2.4. It will be appreciated that the $D_{50}$ of the first filler material may be any value between, and including, any of the minimum and maximum values noted above. It will be further appreciated that the $D_{50}$ of the first filler material may be within a range between, and including, any of the minimum and maximum values noted above.

According to other embodiments, the first filler material of the first ceramic filler component 420 may have a particular size distribution $D_{90}$ value. For example, the $D_{90}$ of the first filler material may be at least about 0.8 microns, such as, at least about 0.9 or at least about 1.0 or at least about 1.1 or at least about 1.2 or at least about 1.3 or at least about 1.4 or at least about 1.5 or at least about 1.6 microns or at least about 1.7 microns or at least about 1.8 microns or at least about 1.9 microns or at least about 2.0 microns or at least about 2.1 microns or at least about 2.2 microns or at least about 2.3 microns or at least about 2.4 microns or at least about 2.5 microns or at least about 2.6 microns or even at least about 2.7 microns. According to still other embodiments, the $D_{90}$ of the first filler material may be not greater than about 8.0 microns, such as, not greater than about 7.5 microns or not greater than about 7.0 microns or not greater than about 6.5 microns or not greater than about 6.0 microns or not greater than about 5.5 microns or not greater than about 5.4 microns or not greater than about 5.3 microns or not greater than about 5.2 or even not greater than about 5.1 microns. It will be appreciated that the $D_{90}$ of the first filler material may be any value between, and including, any of the minimum and maximum values noted above. It will be further appreciated that the $D_{90}$ of the first filler material may be within a range between, and including, any of the minimum and maximum values noted above.

According to still other embodiments, the first filler material of the first ceramic filler component 420 may have a particular average particle size as measured according to laser diffraction spectroscopy. For example, the mean particle size of the first filler material may be not greater than about 10 microns, such as, not greater than about 9 microns or not greater than about 8 microns or not greater than about 7 microns or not greater than about 6 microns or not greater than about 5 microns or not greater than about 4 microns or not greater than about 3 microns or even not greater than about 2 microns. It will be appreciated that the mean particle size of the first filler material may be any value between, and including, any of the values noted above. It will be further appreciated that the mean particle size of the first filler material may be within a range between, and including, any of the values noted above.

According to still other embodiments, the first filler material of the first ceramic filler component 420 may be described as having a particular particle size distribution span (PSDS), where the PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material. For example, the PSDS of the first filler material may be not greater than about 5, such as, not greater than about 4.5 or not greater than about 4.0 or not greater than about 3.5 or not greater than about 3.0 or even not greater than about 2.5. It will be appreciated that the PSDS of the first filler material may be any value between, and including, any of the values noted above. It will be further appreciated that the PSDS of the first filler material may be within a range between, and including, any of the values noted above.

According to still other embodiments, the first filler material of the first ceramic filler component 420 may be described as having a particular average surface area as measured using Brunauer-Emmett-Teller (BET) surface area analysis (Nitrogen Adsorption). For example, the first filler material may have an average surface area of not greater than about 10 m$^2$/g, such as, not greater than about 9.9 m$^2$/g or not greater than about 9.5 m$^2$/g or not greater than about 9.0 m$^2$/g or not greater than about 8.5 m$^2$/g or not greater than about 8.0 m$^2$/g or not greater than about 7.5 m$^2$/g or not greater than about 7.0 m$^2$/g or not greater than about 6.5 m$^2$/g or not greater than about 6.0 m$^2$/g or not greater than about 5.5 m$^2$/g or not greater than about 5.0 m$^2$/g or not greater than about 4.5 m$^2$/g or not greater than about 4.0 m$^2$/g or even not greater than about 3.5 m$^2$/g. According to still other embodiments, the first filler material may have an average surface area of at least about 1.2 m$^2$/g, such as, at least about 2.4 m$^2$/g. It will be appreciated that the average surface area of the first filler material may be any value between, and including, any of the minimum and maximum values noted above. It will be further appreciated that the average surface area of the first filler material may be within a range between, and including, any of the minimum and maximum values noted above.

According to other embodiments, the first filler material of the first ceramic filler component 420 may include a particular material. According to particular embodiments, the first filler material may include a silica based compound. According to still other embodiments, the first filler material may consist of a silica based compound. According to other embodiments, the first filler material may include silica. According to still other embodiments, the first filler material may consist of silica.

According to yet other embodiments, the first filled polymer layer 404 may include a particular content of the first ceramic filler component 420. For example, the content of the first ceramic filler component 420 may be at least about 50 vol. % for a total volume of the first filled polymer layer 404, such as, at least about 51 vol. % or at least about 52 vol. % or at least about 53 vol. % or even at least about 54 vol. %. According to still other embodiments, the content of the ceramic filler component 220 may be not greater than about 57 vol. % for a total volume of the first filled polymer layer 404, such as, not greater than about 56 vol. % or even not greater than about 55 vol. %. It will be appreciated that the content of the first ceramic filler component 420 may be any value between, and including, any of the minimum and maximum values noted above. It will be further appreciated that the content of the first ceramic filler component 420 may be within a range between, and including, any of the minimum and maximum values noted above.

According to still other embodiments, the first ceramic filler component 420 may include a particular content of the first filler material. For example, the content of the first filler material may be at least about 80 vol. % for a total volume of the first ceramic filler component 420, such as, at least about 81 vol. % or at least about 82 vol. % or at least about 83 vol. % or at least about 84 vol. % or at least about 85 vol. % or at least about 86 vol. % or at least about 87 vol. % or at least about 88 vol. % or at least about 89 vol. % or even at least about 90 vol. %. According to still other embodiments, the content of the first filler material may be not greater than about 100 vol. % for a total volume of the first ceramic filler component 420, such as, not greater than about 99 vol. % or not greater than about 98 vol. % or not greater than about 97 vol. % or not greater than about 96 vol. % or not greater than about 95 vol. % or not greater than about 94 vol. % or not greater than about 93 vol. % or even not greater than about 92 vol. %. It will be appreciated that the content of the first filler material may be any value between, and including, any of the minimum and maximum values noted above. It will be further appreciated that the content of the first filler material may be within a range between, and including, any of the minimum and maximum values noted above.

According to still other embodiments, the first ceramic filler component 420 may include a second filler material.

According to yet other embodiments, the second filler material of the first ceramic filler component 420 may include a particular material. For example, the second filler material may include a high dielectric constant ceramic material, such as, a ceramic material having a dielectric constant of at least about 14. According to particular embodiments, the second filler material of the first ceramic filler component 420 may include any high dielectric constant ceramic material, such as, $TiO_2$, $SrTiO_3$, $ZrTi_2O_6$, $MgTiO_3$, $CaTiO_3$, $BaTiO_4$ or any combination thereof.

According to yet other embodiments, the second filler material of the first ceramic filler component 420 may include $TiO_2$. According to still other embodiments, the second filler material may consist of $TiO_2$.

According to still other embodiments, the first ceramic filler component 420 may include a particular content of the second filler material. For example, the content of the second filler material may be at least about 1 vol. % for a total volume of the first ceramic filler component 420, such as, at least about 2 vol. % or at least about 3 vol. % or at least about 4 vol. % or at least about 5 vol. % or at least about 6 vol. % or at least about 7 vol. % or at least about 8 vol. % or at least about 9 vol. % or at least about 10 vol. %. According to still other embodiments, the content of the second filler material may be not greater than about 20 vol. % for a total volume of the first ceramic filler component 420, such as, not greater than about 19 vol. % or not greater than about 18 vol. % or not greater than about 17 vol. % or not greater than about 16 vol. % or not greater than about 15 vol. % or not greater than about 14 vol. % or not greater than about 13 vol. % or not greater than about 12 vol. %. It will be appreciated that the content of the second filler material may be any value between, and including, any of the minimum and maximum values noted above. It will be further appreciated that the content of the second filler material may be within a range between, and including, any of the minimum and maximum values noted above.

According to yet other embodiments, the first ceramic filler component 420 may include a particular content of amorphous material. For example, the first ceramic filler component 420 may include at least about 97% amorphous material, such as, at least about 98% or even at least about 99%. It will be appreciated that the content of amorphous material may be any value between, and including, any of the values noted above. It will be further appreciated that the content of the content of amorphous material may be within a range between, and including, any of the values noted above.

According to other embodiments, the first resin matrix component 410 may include a particular material. For example, the first resin matrix component 410 may include a perfluoropolymer. According to still other embodiments, the first resin matrix component 410 may consist of a perfluoropolymer.

According to yet other embodiments, the perfluoropolymer of the first resin matrix component 410 may include a copolymer of tetrafluoroethylene (TFE); a copolymer of hexafluoropropylene (HFP); a terpolymer of tetrafluoroethylene (TFE); or any combination thereof. According to other embodiments, the perfluoropolymer of the first resin matrix component 410 may consist of a copolymer of tetrafluoroethylene (TFE); a copolymer of hexafluoropropylene (HFP); a terpolymer of tetrafluoroethylene (TFE); or any combination thereof.

According to yet other embodiments, the perfluoropolymer of the first resin matrix component 410 may include polytetrafluoroethylene (PTFE), perfluoroalkoxy polymer resin (PFA), fluorinated ethylene propylene (FEP), or any combination thereof. According to still other embodiments, the perfluoropolymer of the first resin matrix component 410 may consist of polytetrafluoroethylene (PTFE), perfluoroalkoxy polymer resin (PFA), fluorinated ethylene propylene (FEP), or any combination thereof.

According to yet other embodiments, the first filled polymer layer 404 may include a particular content of the first resin matrix component 410. For example, the content of the first resin matrix component 410 may be at least about 45 vol. % for a total volume of the first filled polymer layer 404, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the first resin matrix component 410 is not greater than about 63 vol. % for a total volume of the first filled polymer layer 404 or not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the first resin matrix component 410 may be any value between, and including, any of the minimum and maximum values noted above. It will be further appreciated that the content of the first resin matrix component 410 may be within a range between, and including, any of the minimum and maximum values noted above.

According to yet other embodiments, the first filled polymer layer 404 may include a particular content of the perfluoropolymer. For example, the content of the perfluoropolymer may be at least about 45 vol. % for a total volume of the first filled polymer layer 404, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the perfluoropolymer may be not greater than about 63 vol. % for a total volume of the first filled polymer layer 404, such as, not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the perfluoropolymer may be any value between, and including, any of the minimum and maximum values noted above. It will be further appreciated that the content of the perfluoropolymer may be within a range between, and including, any of the minimum and maximum values noted above.

According to still other embodiments, the dielectric substrate 405 may include a particular porosity as measured using x-ray diffraction. For example, the porosity of the substrate 405 may be not greater than about 10 vol. %, such as, not greater than about 9 vol. % or not greater than about 8 vol. % or not greater than about 7 vol. % or not greater than about 6 vol. % or even not greater than about 5 vol. %. It will be appreciated that the porosity of the dielectric substrate 405 may be any value between, and including, any of the values noted above. It will be further appreciated that the porosity of the dielectric substrate 405 may be within a range between, and including, any of the values noted above.

According to yet other embodiments, the dielectric substrate 405 may have a particular average thickness. For example, the average thickness of the dielectric substrate 405 may be at least about 10 microns, such as, at least about 15 microns or at least about 20 microns or at least about 25 microns or at least about 30 microns or at least about 35 microns or at least about 40 microns or at least about 45 microns or at least about 50 microns or at least about 55 microns or at least about 60 microns or at least about 65 microns or at least about 70 microns or even at least about 75 microns. According to yet other embodiments, the average thickness of the dielectric substrate 405 may be not greater than about 2000 microns, such as, not greater than about 1800 microns or not greater than about 1600 microns or not greater than about 1400 microns or not greater than about 1200 microns or not greater than about 1000 microns or not greater than about 800 microns or not greater than about 600 microns or not greater than about 400 microns or not greater than about 200 microns or not greater than about 190 microns or not greater than about 180 microns or not greater than about 170 microns or not greater than about 160 microns or not greater than about 150 microns or not greater than about 140 microns or not greater than about 120 microns or even not greater than about 100 microns. It will be appreciated that the average thickness of the dielectric substrate 405 may be any value between, and including, any of the minimum and maximum values noted above. It will be further appreciated that the average thickness of the dielectric substrate 405 may be within a range between, and including, any of the minimum and maximum values noted above.

According to yet other embodiments, the dielectric substrate 405 may have a particular dissipation factor (Df) as measured in the range between 5 GHz, 20% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 5 GHz, 80% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 10 GHz, 20% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 10 GHz, 80% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 28 GHz, 20% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 28 GHz, 80% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 39 GHz, 20% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 39 GHz, 80% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 76-81 GHz, 20% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 76-81 GHz, 80% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular coefficient of thermal expansion as measured according to IPC-TM-650 2.4.24 Rev. C Glass Transition Temperature and Z-Axis Thermal Expansion by TMA. For example, the dielectric substrate 405 may have a coefficient of thermal expansion of not greater than about 80 ppm/° C.

Figure 4B:
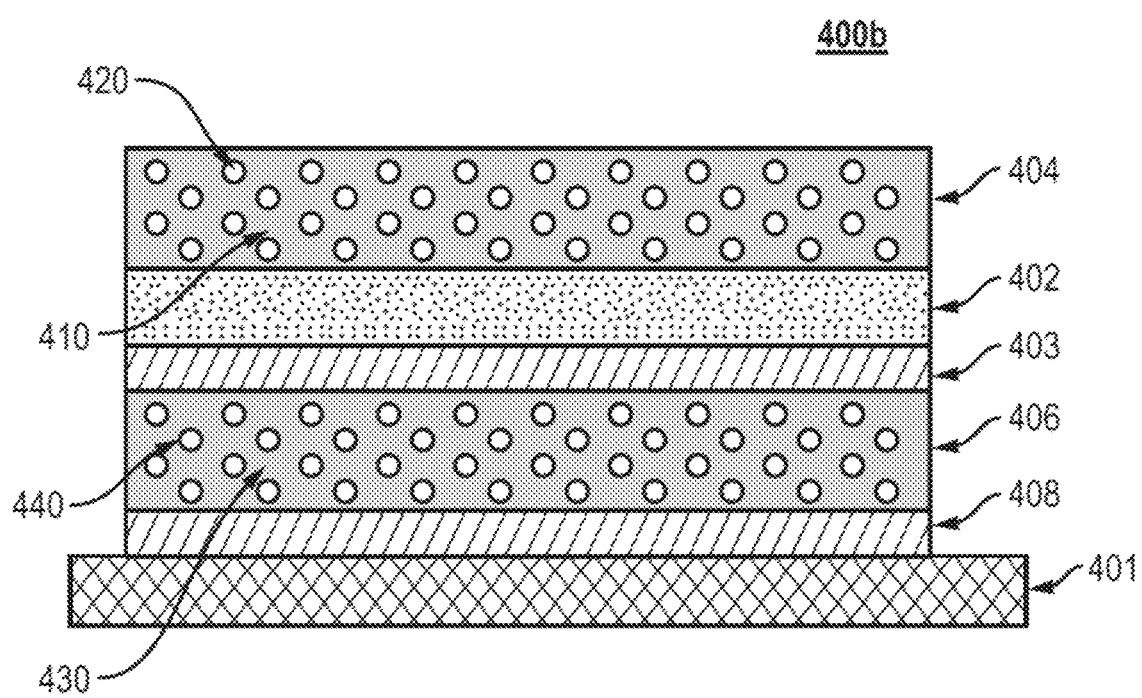

According to other embodiments of a copper-clad laminate formed according to forming method 300, FIG. 4b includes diagram of a copper-clad lamination 401. As shown in FIG. 4b, the copper-clad laminate 400b may include a copper foil layer 401, and a dielectric substrate 405 overlying a surface of the copper foil layer 401. As shown in FIG. 4b, the dielectric substrate 405 may include the first fluoropolymer based adhesive layer 403, the polyimide layer 402, the first filled polymer layer 404 overlying the polyimide layer 402, a second filled polymer layer 406 underlying the polyimide layer 402, and a second fluoropolymer based adhesive layer 408 underlying the second filled polymer layer 406. As shown in FIG. 4b, the second filled polymer layer 406 may include a second resin matrix component 430 and a second ceramic filler component 440.

According to still other embodiments, the second fluoropolymer based adhesive layer 408 may have a particular average thickness. For example, the second fluoropolymer based adhesive layer 408 may be at least about 0.2 microns, such as, at least about 0.5 microns or at least about 1.0 microns or at least about 1.5 microns or at least about 2.0 microns or at least about 2.5 microns or even at least about 3.0 microns. According to yet other embodiments, the average thickness of the second fluoropolymer based adhesive layer 408 may be not greater than about 7 microns, such as, not greater than about 6.5 or not greater than about 6.0 or not greater than about 5.5 or not greater than about 5.0 not greater than about 4.9 microns or not greater than about 4.8 microns or not greater than about 4.7 microns or not greater than about 4.6 microns or not greater than about 4.5 microns or not greater than about 4.4 microns or not greater than about 4.3 microns or not greater than about 4.2 microns or not greater than about 4.1 microns or not greater than about 4.1 microns or not greater than about 4.0 microns or not greater than about 3.9 microns or not greater than about 3.8 microns or not greater than about 3.7 microns or not greater than about 3.6 microns or even not greater than about 3.5 microns. It will be appreciated that the average thickness of the second fluoropolymer based adhesive layer 408 may be any value between, and including, any of the minimum and maximum values noted above. It will be further appreciated that the average thickness of the second fluoropolymer based adhesive layer 408 may be within a range between, and including, any of the minimum and maximum values noted above.

According to still other embodiments, the second fluoropolymer based adhesive layer 408 may include a particular material. For example, the second fluoropolymer based adhesive layer 408 may include fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the second fluoropolymer based adhesive layer 408 may consist of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

According to particular embodiments, the second ceramic filler component 440 may include a third filler material, which may have particular characteristics that may improve performance of the dielectric substrate 405.

According to certain embodiments, the third filler material of the second ceramic filler component 440 may have a particular size distribution. For purposes of embodiments described herein, the particle size distribution of a material, for example, the particle size distribution of a third filler material may be described using any combination of particle size distribution D-values $D_{10}$, $D_{50}$ and $D_{90}$. The $D_{10}$ value from a particle size distribution is defined as a particle size value where 10% of the particles are smaller than the value and 90% of the particles are larger than the value. The $D_{50}$ value from a particle size distribution is defined as a particle size value where 50% of the particles are smaller than the value and 50% of the particles are larger than the value. The $D_{90}$ value from a particle size distribution is defined as a particle size value where 90% of the particles are smaller than the value and 10% of the particles are larger than the value. For purposes of embodiments described herein, particle size measurements for a particular material are made using laser diffraction spectroscopy.

According to certain embodiments, the third filler material of the second ceramic filler component 440 may have a particular size distribution $D_{10}$ value. For example, the $D_{10}$ of the third filler material may be at least about 0.2 microns, such as, at least about 0.3 microns or at least about 0.4 microns or at least about 0.5 microns or at least about 0.6 microns or at least about 0.7 microns or at least about 0.8 microns or at least about 0.9 microns or at least about 1.0 microns or at least about 1.1 microns or even at least about 1.2 microns. According to still other embodiments, the $D_{10}$ of the third filler material may be not greater than about 1.6 microns, such as, not greater than about 1.5 microns or even not greater than about 1.4 microns. It will be appreciated that the $D_{10}$ of the third filler material may be any value between, and including, any of the minimum and maximum values noted above. It will be further appreciated that the $D_{10}$ of the third filler material may be within a range between, and including, any of the minimum and maximum values noted above.

According to other embodiments, the third filler material of the second ceramic filler component 440 may have a particular size distribution $D_{50}$ value. For example, the $D_{50}$ of the third filler material may be at least about 0.8 microns, such as, at least about 0.9 microns or at least about 1.0 microns or at least about 1.1 microns or at least about 1.2 microns or at least about 1.3 microns or at least about 1.4 microns or at least about 1.5 microns or at least about 1.6 microns or at least about 1.7 microns or at least about 1.8 microns or at least about 1.9 microns or at least about 2.0 microns or at least about 2.1 microns or even at least about 2.2 microns. According to still other embodiments, the $D_{50}$ of the third filler material may be not greater than about 2.7 microns, such as, not greater than about 2.6 microns or not greater than about 2.5 microns or even not greater than about 2.4. It will be appreciated that the $D_{50}$ of the third filler material may be any value between, and including, any of the minimum and maximum values noted above. It will be further appreciated that the $D_{50}$ of the third filler material may be within a range between, and including, any of the minimum and maximum values noted above.

According to other embodiments, the third filler material of the second ceramic filler component 440 may have a particular size distribution $D_{90}$ value. For example, the $D_{90}$ of the third filler material may be at least about 0.8 microns, such as, at least about 0.9 or at least about 1.0 or at least about 1.1 or at least about 1.2 or at least about 1.3 or at least about 1.4 or at least about 1.5 or at least about 1.6 microns or at least about 1.7 microns or at least about 1.8 microns or at least about 1.9 microns or at least about 2.0 microns or at least about 2.1 microns or at least about 2.2 microns or at least about 2.3 microns or at least about 2.4 microns or at least about 2.5 microns or at least about 2.6 microns or even at least about 2.7 microns. According to still other embodiments, the $D_{90}$ of the third filler material may be not greater than about 8.0 microns, such as, not greater than about 7.5 microns or not greater than about 7.0 microns or not greater than about 6.5 microns or not greater than about 6.0 microns or not greater than about 5.5 microns or not greater than about 5.4 microns or not greater than about 5.3 microns or not greater than about 5.2 or even not greater than about 5.1 microns. It will be appreciated that the $D_{90}$ of the third filler material may be any value between, and including, any of the minimum and maximum values noted above. It will be further appreciated that the $D_{90}$ of the third filler material may be within a range between, and including, any of the minimum and maximum values noted above.

According to still other embodiments, the third filler material of the second ceramic filler component 440 may have a particular average particle size as measured according to laser diffraction spectroscopy. For example, the mean particle size of the third filler material may be not greater than about 10 microns, such as, not greater than about 9 microns or not greater than about 8 microns or not greater than about 7 microns or not greater than about 6 microns or not greater than about 5 microns or not greater than about 4 microns or not greater than about 3 microns or even not greater than about 2 microns. It will be appreciated that the mean particle size of the third filler material may be any value between, and including, any of the values noted above. It will be further appreciated that the mean particle size of the third filler material may be within a range between, and including, any of the values noted above.

According to still other embodiments, the third filler material of the second ceramic filler component 440 may be described as having a particular particle size distribution span (PSDS), where the PSDS is equal to $(D_{90}-D_{10})/D_{50}$, where $D_{90}$ is equal to a $D_{90}$ particle size distribution measurement of the third filler material, $D_{10}$ is equal to a $D_{10}$ particle size distribution measurement of the third filler material, and $D_{50}$ is equal to a $D_{50}$ particle size distribution measurement of the third filler material. For example, the PSDS of the third filler material may be not greater than about 5, such as, not greater than about 4.5 or not greater than about 4.0 or not greater than about 3.5 or not greater than about 3.0 or even not greater than about 2.5. It will be appreciated that the PSDS of the third filler material may be any value between, and including, any of the values noted above. It will be further appreciated that the PSDS of the third filler material may be within a range between, and including, any of the values noted above.

According to still other embodiments, the third filler material of the second ceramic filler component 440 may be described as having a particular average surface area as measured using Brunauer-Emmett-Teller (BET) surface area analysis (Nitrogen Adsorption). For example, the third filler material may have an average surface area of not greater than about 10 m²/g, such as, not greater than about 9.9 m²/g or not greater than about 9.5 m²/g or not greater than about 9.0 m²/g or not greater than about 8.5 m²/g or not greater than about 8.0 m²/g or not greater than about 7.5 m²/g or not greater than about 7.0 m²/g or not greater than about 6.5 m²/g or not greater than about 6.0 m²/g or not greater than about 5.5 m²/g or not greater than about 5.0 m²/g or not greater than about 4.5 m²/g or not greater than about 4.0 m²/g or even not greater than about 3.5 m²/g. According to still other embodiments, the third filler material may have an average surface area of at least about 1.2 m²/g, such as, at least about 2.4 m²/g. It will be appreciated that the average surface area of the third filler material may be any value between, and including, any of the minimum and maximum values noted above. It will be further appreciated that the average surface area of the third filler material may be within a range between, and including, any of the minimum and maximum values noted above.

According to other embodiments, the third filler material of the second ceramic filler component 440 may include a particular material. According to particular embodiments, the third filler material may include a silica based compound. According to still other embodiments, the third filler material may consist of a silica based compound. According to other embodiments, the third filler material may include silica. According to still other embodiments, the third filler material may consist of silica.

According to yet other embodiments, the first filled polymer layer 404 may include a particular content of the second ceramic filler component 440. For example, the content of the second ceramic filler component 440 may be at least about 30 vol. % for a total volume of the first filled polymer layer 404, such as, at least about 31 vol. % or at least about 32 vol. % or at least about 33 vol. % or at least about 34 vol. % or at least about 35 vol. % or at least about 36 vol. % or at least about 37 vol. % or at least about 38 vol. % or at least about 39 vol. % or at least about 40 vol. % or at least about 41 vol. % or at least about 42 vol. % or at least about 43 vol. % or at least about 44 vol. % or at least about 45 vol. % or 46 vol. % or at least about 47 vol. % or at least about 48 vol. % or at least about 49 vol. % or at least about 50 vol. % or at least about 51 vol. % or at least about 52 vol. % or at least about 53 vol. % or even at least about 54 vol. %. According to still other embodiments, the content of the second ceramic filler component 440 may be not greater than about 57 vol. % for a total volume of the first filled polymer layer 404, such as, not greater than about 56 vol. % or even not greater than about 55 vol. %. It will be appreciated that the content of the ceramic filler component 220 may be any value between, and including, any of the minimum and maximum values noted above. It will be further appreciated that the content of the ceramic filler component 220 may be within a range between, and including, any of the minimum and maximum values noted above.

According to still other embodiments, the second ceramic filler component 440 may include a particular content of the third filler material. For example, the content of the third filler material may be at least about 80 vol. % for a total volume of the second ceramic filler component 440, such as, at least about 81 vol. % or at least about 82 vol. % or at least about 83 vol. % or at least about 84 vol. % or at least about 85 vol. % or at least about 86 vol. % or at least about 87 vol. % or at least about 88 vol. % or at least about 89 vol. % or even at least about 90 vol. %. According to still other embodiments, the content of the third filler material may be not greater than about 100 vol. % for a total volume of the second ceramic filler component 440, such as, not greater than about 99 vol. % or not greater than about 98 vol. % or not greater than about 97 vol. % or not greater than about 96 vol. % or not greater than about 95 vol. % or not greater than about 94 vol. % or not greater than about 93 vol. % or even not greater than about 92 vol. %. It will be appreciated that the content of the third filler material may be any value between, and including, any of the minimum and maximum values noted above. It will be further appreciated that the content of the third filler material may be within a range between, and including, any of the minimum and maximum values noted above.

According to still other embodiments, the second ceramic filler component 440 may include a fourth filler material.

According to yet other embodiments, the fourth filler material of the second ceramic filler component 440 may include a particular material. For example, the fourth filler material may include a high dielectric constant ceramic material, such as, a ceramic material having a dielectric constant of at least about 14. According to particular embodiments, the fourth filler material of the second ceramic filler component 440 may include any high dielectric constant ceramic material, such as, $TiO_2$, $SrTiO_3$, $ZrTi_2O_6$, $MgTiO_3$, $CaTiO_3$, $BaTiO_4$ or any combination thereof.

According to yet other embodiments, the fourth filler material of the second ceramic filler component 440 may include $TiO_2$. According to still other embodiments, the fourth filler material may consist of $TiO_2$.

According to still other embodiments, the second ceramic filler component 440 may include a particular content of the fourth filler material. For example, the content of the fourth filler material may be at least about 1 vol. % for a total volume of the second ceramic filler component 440, such as, at least about 2 vol. % or at least about 3 vol. % or at least about 4 vol. % or at least about 5 vol. % or at least about 6 vol. % or at least about 7 vol. % or at least about 8 vol. % or at least about 9 vol. % or at least about 10 vol. %. According to still other embodiments, the content of the fourth filler material may be not greater than about 20 vol. % for a total volume of the second ceramic filler component 440, such as, not greater than about 19 vol. % or not greater than about 18 vol. % or not greater than about 17 vol. % or not greater than about 16 vol. % or not greater than about 15 vol. % or not greater than about 14 vol. % or not greater than about 13 vol. % or not greater than about 12 vol. %. It will be appreciated that the content of the fourth filler material may be any value between, and including, any of the minimum and maximum values noted above. It will be further appreciated that the content of the fourth filler material may be within a range between, and including, any of the minimum and maximum values noted above.

According to yet other embodiments, the second ceramic filler component 440 may include a particular content of amorphous material. For example, the second ceramic filler component 440 may include at least about 97% amorphous material, such as, at least about 98% or even at least about 99%. It will be appreciated that the content of amorphous material may be any value between, and including, any of the values noted above. It will be further appreciated that the content of the content of amorphous material may be within a range between, and including, any of the values noted above.

According to other embodiments, the second resin matrix component 430 may include a particular material. For example, the second resin matrix component 430 may include a perfluoropolymer. According to still other embodiments, the second resin matrix component 430 may consist of a perfluoropolymer.

According to yet other embodiments, the perfluoropolymer of the second resin matrix component 430 may include a copolymer of tetrafluoroethylene (TFE); a copolymer of hexafluoropropylene (HFP); a terpolymer of tetrafluoroethylene (TFE); or any combination thereof. According to other embodiments, the perfluoropolymer of the second resin matrix component 430 may consist of a copolymer of tetrafluoroethylene (TFE); a copolymer of hexafluoropropylene (HFP); a terpolymer of tetrafluoroethylene (TFE); or any combination thereof.

According to yet other embodiments, the perfluoropolymer of the second resin matrix component 430 may include polytetrafluoroethylene (PTFE), perfluoroalkoxy polymer resin (PFA), fluorinated ethylene propylene (FEP), or any combination thereof. According to still other embodiments, the perfluoropolymer of the second resin matrix component 430 may consist of polytetrafluoroethylene (PTFE), perfluoroalkoxy polymer resin (PFA), fluorinated ethylene propylene (FEP), or any combination thereof.

According to yet other embodiments, the first filled polymer layer 404 may include a particular content of the second resin matrix component 430. For example, the content of the second resin matrix component 430 may be at least about 30 vol. % for a total volume of the first filled polymer layer 404, such as, at least about 31 vol. % or at least about 32 vol. % or at least about 33 vol. % or at least about 34 vol. % or at least about 35 vol. % or at least about 36 vol. % or at least about 37 vol. % or at least about 38 vol. % or at least about 39 vol. % or at least about 40 vol. % or at least about 41 vol. % or at least about 42 vol. % or at least about 43 vol. % or at least about 44 vol. % or at least about 45 vol. % or 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the first resin matrix component 410 is not greater than about 63 vol. % for a total volume of the first filled polymer layer 404 or not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the second resin matrix component 430 may be any value between, and including, any of the minimum and maximum values noted above. It will be further appreciated that the content of the second resin matrix component 430 may be within a range between, and including, any of the minimum and maximum values noted above.

According to yet other embodiments, the second filled polymer layer 406 may include a particular content of the perfluoropolymer. For example, the content of the perfluoropolymer may be at least about 45 vol. % for a total volume of the second filled polymer layer 406, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the perfluoropolymer may be not greater than about 63 vol. % for a total volume of the second filled polymer layer 406, such as, not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the perfluoropolymer may be any value between, and including, any of the minimum and maximum values noted above. It will be further appreciated that the content of the perfluoropolymer may be within a range between, and including, any of the minimum and maximum values noted above.

According to still other embodiments, the dielectric substrate 405 may include a particular porosity as measured using x-ray diffraction. For example, the porosity of the substrate 200 may be not greater than about 10 vol. %, such as, not greater than about 9 vol. % or not greater than about 8 vol. % or not greater than about 7 vol. % or not greater than about 6 vol. % or even not greater than about 5 vol. %. It will be appreciated that the porosity of the dielectric substrate 405 may be any value between, and including, any of the values noted above. It will be further appreciated that the porosity of the dielectric substrate 405 may be within a range between, and including, any of the values noted above.

According to yet other embodiments, the dielectric substrate 405 may have a particular average thickness. For example, the average thickness of the dielectric substrate 405 may be at least about 10 microns, such as, at least about 15 microns or at least about 20 microns or at least about 25 microns or at least about 30 microns or at least about 35 microns or at least about 40 microns or at least about 45 microns or at least about 50 microns or at least about 55 microns or at least about 60 microns or at least about 65 microns or at least about 70 microns or even at least about 75 microns. According to yet other embodiments, the average thickness of the dielectric substrate 405 may be not greater than about 2000 microns, such as, not greater than about 1800 microns or not greater than about 1600 microns or not greater than about 1400 microns or not greater than about 1200 microns or not greater than about 1000 microns or not greater than about 800 microns or not greater than about 600 microns or not greater than about 400 microns or not greater than about 200 microns or not greater than about 190 microns or not greater than about 180 microns or not greater than about 170 microns or not greater than about 160 microns or not greater than about 150 microns or not greater than about 140 microns or not greater than about 120 microns or even not greater than about 100 microns. It will be appreciated that the average thickness of the dielectric substrate 405 may be any value between, and including, any of the minimum and maximum values noted above. It will be further appreciated that the average thickness of the dielectric substrate 405 may be within a range between, and including, any of the minimum and maximum values noted above.

According to yet other embodiments, the dielectric substrate 405 may have a particular dissipation factor (Df) as measured in the range between 5 GHz, 20% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 5 GHz, 80% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 10 GHz, 20% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 10 GHz, 80% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 28 GHz, 20% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 28 GHz, 80% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 39 GHz, 20% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 39 GHz, 80% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 76-81 GHz, 20% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 76-81 GHz, 80% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular coefficient of thermal expansion as measured according to IPC-TM-650 2.4.24 Rev. C Glass Transition Temperature and Z-Axis Thermal Expansion by TMA. For example, the dielectric substrate 405 may have a coefficient of thermal expansion of not greater than about 80 ppm/° C.

Figure 5:
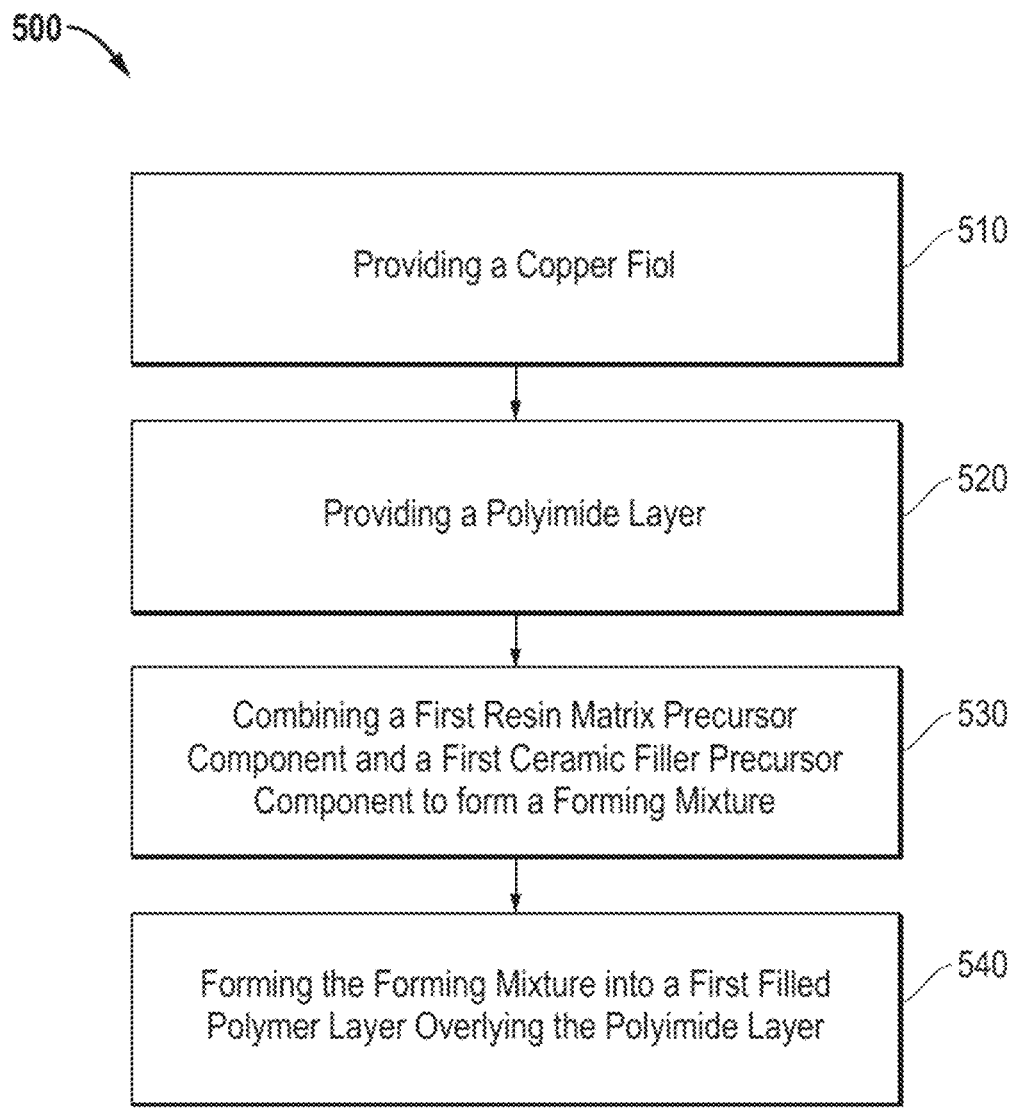
FIG. 5 includes a diagram showing a printed circuit board forming method according to embodiments described herein.

Referring next to a method of forming a printed circuit board, FIG. 5 includes a diagram showing a forming method 500 for forming a printed circuit board according to embodiments described herein. According to particular embodiments, the forming method 500 may include a first step 510 of providing a copper foil layer, a second step 520 of forming a dielectric substrate overlying the copper foil layer. According to particular embodiments, forming the dielectric substrate may include combining a first resin matrix precursor component and a first ceramic filler precursor component to form a first forming mixture, and forming the first forming mixture into a first filled polymer layer overlying the polyimide layer to form the dielectric substrate.

It will be appreciated that all description, details and characteristics provided herein in reference to forming method 100 and/or forming method 300 may further apply to or describe correspond aspects of forming method 500.

Figure 6A:
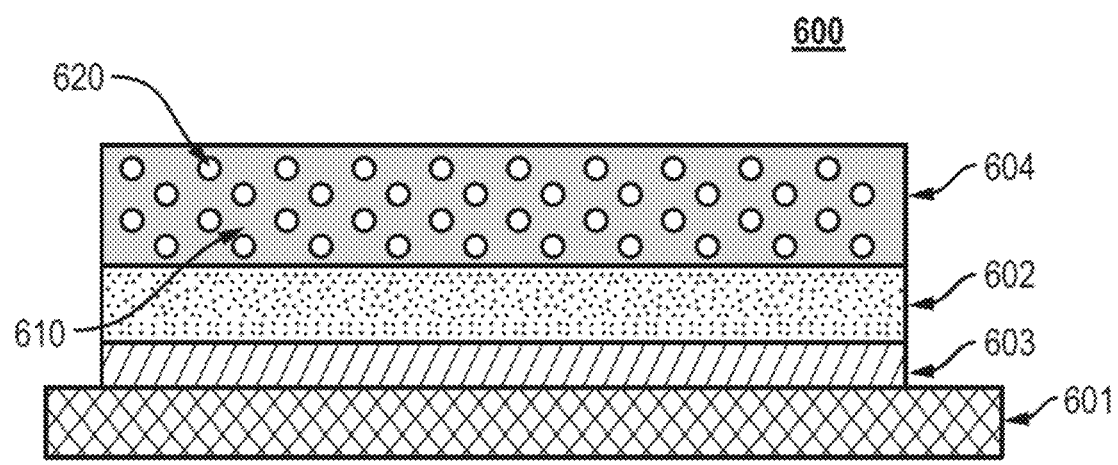
FIGS. 6a and 6b include illustrations showing the configuration of printed circuit boards formed according to embodiments described herein.

Referring now to embodiments of the printed circuit board formed according to forming method 500, FIG. 6a includes diagram of a printed circuit board 600. As shown in FIG. 6a, the printed circuit board 600 may include a copper foil layer 601, and a dielectric substrate 605 overlying a surface of the copper foil layer 601. As further shown in FIG. 6a, the dielectric substrate 605 may include a polyimide layer 602 and a first filled polymer layer 604 overlying the polyimide layer 602. As shown in FIG. 6a, the first filled polymer layer 604 may include a first resin matrix component 610 and a first ceramic filler component 620.

Again, it will be appreciated that all description provided herein in reference to dielectric substrate 200 (405) and/or copper-clad laminate 400 may further apply to correcting aspects of the printed circuit board 600, including all component of printed circuit board 600.

Figure 6B:
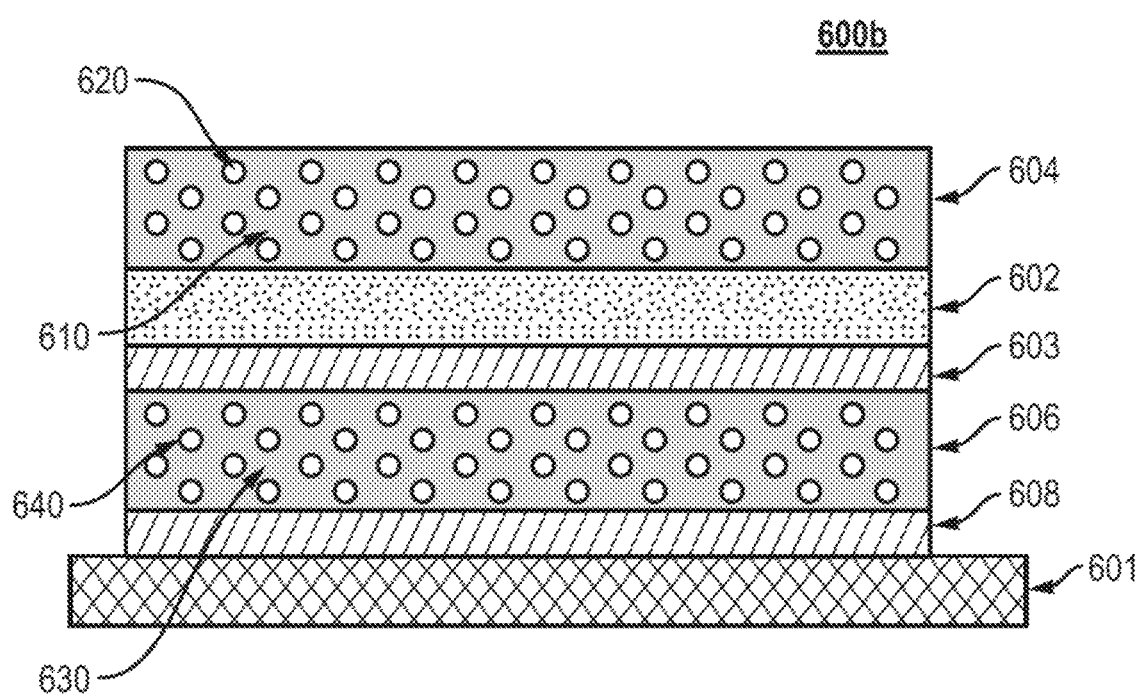

According to other embodiments of a printed circuit board formed according to forming method 500, FIG. 6b includes diagram of a printed circuit board 600b. As shown in FIG. 6b, the printed circuit board 600b may include a copper foil layer 601, and a dielectric substrate 605 overlying a surface of the copper foil layer 601. As shown in FIG. 6b, the dielectric substrate 605 may include the polyimide layer 602, the first filled polymer layer 604 overlying the polyimide layer 602, and a second filled polymer layer 606 underlying the polyimide layer 602. As shown in FIG. 6b, the second filled polymer layer 606 may include a second resin matrix component 630 and a second ceramic filler component 640.

Again, it will be appreciated that all description provided herein in reference to dielectric substrate 200 (405) and/or copper-clad laminate 400 may further apply to correcting aspects of the printed circuit board 600b, including all component of printed circuit board 600b.

Many different aspects and embodiments are possible. Some of those aspects and embodiments are described herein. After reading this specification, skilled artisans will appreciate that those aspects and embodiments are only illustrative and do not limit the scope of the present invention. Embodiments may be in accordance with any one or more of the embodiments as listed below.

Embodiment 1. A dielectric substrate comprising: a first fluoropolymer based adhesive layer, a polyimide layer overlying the fluoropolymer based adhesive layer, and a first filled polymer layer overlying the polyimide layer, wherein the first filled polymer layer comprises a first resin matrix component; and a first ceramic filler component, wherein the first ceramic filler component comprises a first filler material, and wherein the first filler material further comprises a mean particle size of at not greater than about 10 microns.

Embodiment 2. The dielectric substrate of embodiment 1, wherein the first fluoropolymer based adhesive layer has an average thickness of at least about 0.2 microns.

Embodiment 3. The dielectric substrate of embodiment 1, wherein the first fluoropolymer based adhesive layer has an average thickness of not greater than about 7 microns.

Embodiment 4. The dielectric substrate of embodiment 1, wherein the first fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 5. The dielectric substrate of embodiment 1, wherein the first fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 6. The dielectric substrate of embodiment 1, wherein the first fluoropolymer based adhesive layer is a PFA layer.

Embodiment 7. The dielectric substrate of embodiment 1, wherein a particle size distribution of the silica filler material of the first ceramic filler component comprises: a $D_{10}$ of at least about 0.2 microns and not greater than about 1.6, a $D_{50}$ of at least about 0.5 microns and not greater than about 2.7 microns, and a $D_{90}$ of at least about 0.8 microns and not greater than about 4.7 microns.

Embodiment 8. The dielectric substrate of embodiment 1, wherein the silica filler material of the first ceramic filler component comprises a particle size distribution span (PSDS) of not greater than about 8, where PSDS is equal to $(D_{90}-D_{10})/D_{50}$, where $D_{90}$ is equal to a $D_{90}$ particle size distribution measurement of the silica filler material, $D_{10}$ is equal to a $D_{10}$ particle size distribution measurement of the first filler material, and $D_{50}$ is equal to a $D_{50}$ particle size distribution measurement of the first filler material.

Embodiment 9. The dielectric substrate of embodiment 1, wherein the first filler material further comprises an average surface area of not greater than about 10 m²/g.

Embodiment 10. The dielectric substrate of embodiment 1, wherein the first filler material comprises a silica based compound.

Embodiment 11. The dielectric substrate of embodiment 1, wherein the first filler material comprises silica.

Embodiment 12. The dielectric substrate of embodiment 1, wherein the first resin matrix component comprises a perfluoropolymer.

Embodiment 13. The dielectric substrate of embodiment 12, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 14. The dielectric substrate of embodiment 12, wherein the perfluoropolymer comprises polytetrafluoroethylene (PTFE), perfluoroalkoxy polymer resin (PFA), fluorinated ethylene propylene (FEP), or any combination thereof.

Embodiment 15. The dielectric substrate of embodiment 12, wherein the perfluoropolymer consists of polytetrafluoroethylene (PTFE), perfluoroalkoxy polymer resin (PFA), fluorinated ethylene propylene (FEP), or any combination thereof.

Embodiment 16. The dielectric substrate of embodiment 1, wherein the content of the first resin matrix component is at least about 45 vol. % for a total volume of the first filled polymer layer.

Embodiment 17. The dielectric substrate of embodiment 1, wherein the content of the first resin matrix component is not greater than about 63 vol. % for a total volume of the first filled polymer layer.

Embodiment 18. The dielectric substrate of embodiment 12, wherein the content of the perfluoropolymer is at least about 45 vol. % for a total volume of the first filled polymer layer.

Embodiment 19. The dielectric substrate of embodiment 12, wherein the content of the perfluoropolymer is not greater than about 63 vol. % for a total volume of the first filled polymer layer.

Embodiment 20. The dielectric substrate of embodiment 1, wherein the content of the first ceramic filler component is at least about 30 vol. % for a total volume of the first filled polymer layer.

Embodiment 21. The dielectric substrate of embodiment 1, wherein the content of the first ceramic filler component is not greater than about 57 vol. % for a total volume of the first filled polymer layer.

Embodiment 22. The dielectric substrate of embodiment 1, wherein the content of the first filler material is at least about 80 vol. % for a total volume of the first ceramic filler component.

Embodiment 23. The dielectric substrate of embodiment 1, wherein the content of the first filler material is not greater than about 100 vol. % for a total volume of the first ceramic filler component.

Embodiment 24. The dielectric substrate of embodiment 1, wherein the first ceramic filler component further comprises a second filler material.

Embodiment 25. The dielectric substrate of embodiment 24, wherein the second filler material of the first ceramic filler component comprises a high dielectric constant ceramic material.

Embodiment 26. The dielectric substrate of embodiment 25, wherein the high dielectric constant ceramic material has a dielectric constant of at least about 14.

Embodiment 27. The dielectric substrate of embodiment 25, wherein the second ceramic filler component further comprises $TiO_2$, $SrTiO_3$, $ZrTi_2O_6$, $MgTiO_3$, $CaTiO_3$, $BaTiO_4$ or any combination thereof.

Embodiment 28. The dielectric substrate of embodiment 24, wherein the content of the second filler material of the first ceramic filler component is at least about 1 vol. % for a total volume of the first ceramic filler component.

Embodiment 29. The dielectric substrate of embodiment 24, wherein the content of the second filler material of the first ceramic filler component is not greater than about 20 vol. % for a total volume of the first ceramic filler component.

Embodiment 30. The dielectric substrate of embodiment 27, wherein the content of the $TiO_2$ filler material in the first ceramic filler component is at least about 1 vol. % for a total volume of the first ceramic filler component.

Embodiment 31. The dielectric substrate of embodiment 27, wherein the content of the $TiO_2$ filler material in the first ceramic filler component is not greater than about 20 vol. % for a total volume of the first ceramic filler component.

Embodiment 32. The dielectric substrate of embodiment 1, wherein the first ceramic filler component is at least about 97%.

Embodiment 33. The dielectric substrate of embodiment 1, wherein the dielectric substrate further comprises a second filled polymer layer underlying the polyimide layer, and a second fluoropolymer based adhesive layer underlying the second filled polymer layer, wherein the second filled polymer layer comprises a second resin matrix component; and a second ceramic filler component, wherein the second ceramic filler component comprises a silica filler material, and wherein the first filler material further comprises a mean particle size of at not greater than about 10 microns.

Embodiment 34. The dielectric substrate of embodiment 33, wherein the second fluoropolymer based adhesive layer has an average thickness of at least about 0.2 microns.

Embodiment 35. The dielectric substrate of embodiment 33, wherein the second fluoropolymer based adhesive layer has an average thickness of not greater than about 7 microns.

Embodiment 36. The dielectric substrate of embodiment 33, wherein the second fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 37. The dielectric substrate of embodiment 33, wherein the second fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 38. The dielectric substrate of embodiment 33, wherein the second fluoropolymer based adhesive layer is a PFA layer.

Embodiment 39. The dielectric substrate of embodiment 33, wherein a particle size distribution of the silica filler material of the second ceramic filler component comprises: a $D_{10}$ of at least about 0.2 microns and not greater than about 1.6, a $D_{50}$ of at least about 0.5 microns and not greater than about 2.7 microns, and a $D_{90}$ of at least about 0.8 microns and not greater than about 4.7 microns.

Embodiment 40. The dielectric substrate of embodiment 33, wherein the silica filler material of the second ceramic filler component comprises a particle size distribution span (PSDS) of not greater than about 8, where PSDS is equal to $(D_{90}-D_{10})/D_{50}$, where $D_{90}$ is equal to a $D_{90}$ particle size distribution measurement of the silica filler material, $D_{10}$ is equal to a $D_{10}$ particle size distribution measurement of the first filler material, and $D_{50}$ is equal to a $D_{50}$ particle size distribution measurement of the first filler material.

Embodiment 41. The dielectric substrate of embodiment 33, wherein the first filler material further comprises an average surface area of not greater than about 10 m²/g.

Embodiment 42. The dielectric substrate of embodiment 33, wherein the second filler material comprises a silica based compound.

Embodiment 43. The dielectric substrate of embodiment 33, wherein the second filler material comprises silica.

Embodiment 44. The dielectric substrate of embodiment 33, wherein the second resin matrix comprises a perfluoropolymer.

Embodiment 45. The dielectric substrate of embodiment 44, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 46. The dielectric substrate of embodiment 44, wherein the perfluoropolymer comprises polytetrafluoroethylene (PTFE), perfluoroalkoxy polymer resin (PFA), fluorinated ethylene propylene (FEP), or any combination thereof.

Embodiment 47. The dielectric substrate of embodiment 44, wherein the perfluoropolymer consists of polytetrafluoroethylene (PTFE), perfluoroalkoxy polymer resin (PFA), fluorinated ethylene propylene (FEP), or any combination thereof.

Embodiment 48. The dielectric substrate of embodiment 33, wherein the content of the second resin matrix component is at least about 45 vol. % for a total volume of the second filled polymer layer.

Embodiment 49. The dielectric substrate of embodiment 33, wherein the content of the second resin matrix component is not greater than about 63 vol. % for a total volume of the second filled polymer layer.

Embodiment 50. The dielectric substrate of embodiment 33, wherein the content of the perfluoropolymer is at least about 45 vol. % for a total volume of the second filled polymer layer.

Embodiment 51. The dielectric substrate of embodiment 33, wherein the content of the perfluoropolymer is not greater than about 63 vol. % for a total volume of the second filled polymer layer.

Embodiment 52. The dielectric substrate of embodiment 33, wherein the content of the second ceramic filler component is at least about 30 vol. % for a total volume of the second filled polymer layer.

Embodiment 53. The dielectric substrate of embodiment 33, wherein the content of the second ceramic filler component is not greater than about 57 vol. % for a total volume of the second filled polymer layer.

Embodiment 54. The dielectric substrate of embodiment 33, wherein the content of the second filler material is at least about 80 vol. % for a total volume of the second ceramic filler component.

Embodiment 55. The dielectric substrate of embodiment 33, wherein the content of the second filler material is not greater than about 100 vol. % for a total volume of the second ceramic filler component.

Embodiment 56. The dielectric substrate of embodiment 33, wherein the second ceramic filler component further comprises a $TiO_2$ filler material.

Embodiment 57. The dielectric substrate of embodiment 56, wherein the content of the $TiO_2$ filler material is at least about 1 vol. % for a total volume of the second ceramic filler component.

Embodiment 58. The dielectric substrate of embodiment 56, wherein the content of the $TiO_2$ filler material is not greater than about 20 vol. % for a total volume of the second ceramic filler component.

Embodiment 59. The dielectric substrate of embodiment 33, wherein the second ceramic filler component is at least about 97% amorphous.

Embodiment 60. The dielectric substrate of any one of embodiments 1 and 33, wherein the dielectric substrate comprises a porosity of not greater than about 10 vol. %.

Embodiment 61. The dielectric substrate of any one of embodiments 1 and 33, wherein the dielectric substrate comprises an average thickness of at least about 10 microns.

Embodiment 62. The dielectric substrate of any one of embodiments 1 and 33, wherein the dielectric substrate comprises an average thickness of not greater than about 200 microns.

Embodiment 63. The dielectric substrate of any one of embodiments 1 and 33, wherein the dielectric substrate comprises a dissipation factor (5 GHz, 20% RH) of not greater than about 0.005.

Embodiment 64. The dielectric substrate of any one of embodiments 1 and 33, wherein the dielectric substrate comprises a dissipation factor (5 GHz, 20% RH) of not greater than about 0.0014.

Embodiment 65. The dielectric substrate of any one of embodiments 1 and 33, wherein the dielectric substrate comprises a coefficient of thermal expansion (x/y axe) of not greater than about 80 ppm/° C.

Embodiment 66. The dielectric substrate of any one of embodiments 1 and 33, wherein the dielectric substrate comprises a peel strength between the first filled polymer layer and the polyimide layer of at least about 5 lb/in.

Embodiment 67. The dielectric substrate of any one of embodiments 1 and 33, wherein the dielectric substrate comprises a peel strength between the second filled polymer layer and the polyimide layer of at least about 5 lb/in.

Embodiment 68. The dielectric substrate of any one of embodiments 1 and 33, wherein the dielectric substrate comprises a moisture absorption of not greater than about 1.2%.

Embodiment 69. A copper clad laminate comprising a copper foil layer, and a dielectric substrate overlying the copper foil layer, wherein the dielectric substrate comprises: a first fluoropolymer based adhesive layer, a polyimide layer overlying the fluoropolymer based adhesive layer, and a first filled polymer layer overlying the polyimide layer, wherein the first filled polymer layer comprises a first resin matrix component; and a first ceramic filler component, wherein the first ceramic filler component comprises a first filler material, and wherein the first filler material further comprises a mean particle size of at not greater than about 10 microns.

Embodiment 70. The copper clad laminate of embodiment 69, wherein the first fluoropolymer based adhesive layer has an average thickness of at least about 0.2 microns.

Embodiment 71. The copper clad laminate of embodiment 69, wherein the first fluoropolymer based adhesive layer has an average thickness of not greater than about 7 microns.

Embodiment 72. The copper clad laminate of embodiment 69, wherein the first fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 73. The copper clad laminate of embodiment 69, wherein the first fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 74. The copper clad laminate of embodiment 69, wherein the first fluoropolymer based adhesive layer is a PFA layer.

Embodiment 75. The copper clad laminate of embodiment 69, wherein a particle size distribution of the silica filler material of the first ceramic filler component comprises: a $D_{10}$ of at least about 0.2 microns and not greater than about 1.6, a $D_{50}$ of at least about 0.5 microns and not greater than about 2.7 microns, and a $D_{90}$ of at least about 0.8 microns and not greater than about 4.7 microns.

Embodiment 76. The copper clad laminate of embodiment 69, wherein the silica filler material of the first ceramic filler component comprises a particle size distribution span (PSDS) of not greater than about 8, where PSDS is equal to $(D_{90}-D_{10})/D_{50}$, where $D_{90}$ is equal to a $D_{90}$ particle size distribution measurement of the silica filler material, $D_{10}$ is equal to a $D_{10}$ particle size distribution measurement of the first filler material, and $D_{50}$ is equal to a $D_{50}$ particle size distribution measurement of the first filler material.

Embodiment 77. The copper clad laminate of embodiment 69, wherein the first filler material further comprises an average surface area of not greater than about 10 $m^2/g$.

Embodiment 78. The copper clad laminate of embodiment 69, wherein the first filler material comprises a silica based compound.

Embodiment 79. The copper clad laminate of embodiment 69, wherein the first filler material comprises silica.

Embodiment 80. The copper clad laminate of embodiment 69, wherein the first resin matrix component comprises a perfluoropolymer.

Embodiment 81. The copper clad laminate of embodiment 80, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 82. The copper clad laminate of embodiment 80, wherein the perfluoropolymer comprises polytetrafluoroethylene (PTFE), perfluoroalkoxy polymer resin (PFA), fluorinated ethylene propylene (FEP), or any combination thereof.

Embodiment 83. The copper clad laminate of embodiment 80, wherein the perfluoropolymer consists of polytetrafluoroethylene (PTFE), perfluoroalkoxy polymer resin (PFA), fluorinated ethylene propylene (FEP), or any combination thereof.

Embodiment 84. The copper clad laminate of embodiment 69, wherein the content of the first resin matrix component is at least about 45 vol. % for a total volume of the first filled polymer layer.

Embodiment 85. The copper clad laminate of embodiment 69, wherein the content of the first resin matrix component is not greater than about 63 vol. % for a total volume of the first filled polymer layer.

Embodiment 86. The copper clad laminate of embodiment 80, wherein the content of the perfluoropolymer is at least about 45 vol. % for a total volume of the first filled polymer layer.

Embodiment 87. The copper clad laminate of embodiment 80, wherein the content of the perfluoropolymer is not greater than about 63 vol. % for a total volume of the first filled polymer layer.

Embodiment 88. The copper clad laminate of embodiment 69, wherein the content of the first ceramic filler component is at least about 50 vol. % for a total volume of the first filled polymer layer.

Embodiment 89. The copper clad laminate of embodiment 69, wherein the content of the first ceramic filler component is not greater than about 57 vol. % for a total volume of the first filled polymer layer.

Embodiment 90. The copper clad laminate of embodiment 69, wherein the content of the first filler material is at least about 80 vol. % for a total volume of the first ceramic filler component.

Embodiment 91. The copper clad laminate of embodiment 69, wherein the content of the first filler material is not greater than about 100 vol. % for a total volume of the first ceramic filler component.

Embodiment 92. The copper clad laminate of embodiment 69, wherein the first ceramic filler component further comprises a second filler material.

Embodiment 93. The copper clad laminate of embodiment 92, wherein the second filler material of the first ceramic filler component comprises a high dielectric constant ceramic material.

Embodiment 94. The copper clad laminate of embodiment 93, wherein the high dielectric constant ceramic material has a dielectric constant of at least about 14.

Embodiment 95. The copper clad laminate of embodiment 93, wherein the first ceramic filler component further comprises $TiO_2$, $SrTiO_3$, $ZrTi_2O_6$, $MgTiO_3$, $CaTiO_3$, $BaTiO_4$ or any combination thereof.

Embodiment 96. The copper clad laminate of embodiment 92, wherein the content of the second filler material of the first ceramic filler component is at least about 1 vol. % for a total volume of the first ceramic filler component.

Embodiment 97. The copper clad laminate of embodiment 92, wherein the content of the second filler material of the first ceramic filler component is not greater than about 20 vol. % for a total volume of the first ceramic filler component.

Embodiment 98. The copper clad laminate of embodiment 95, wherein the content of the $TiO_2$ filler material in the first ceramic filler component is at least about 1 vol. % for a total volume of the first ceramic filler component.

Embodiment 99. The copper clad laminate of embodiment 95, wherein the content of the $TiO_2$ filler material in the first ceramic filler component is not greater than about 20 vol. % for a total volume of the first ceramic filler component.

Embodiment 100. The copper clad laminate of embodiment 69, wherein the first ceramic filler component is at least about 97% amorphous.

Embodiment 101. The copper clad laminate of embodiment 69, wherein the dielectric substrate further comprises a second filled polymer layer underlying the polyimide layer, and a second fluoropolymer based adhesive layer underlying the second filled polymer layer, wherein the second filled polymer layer comprises a second resin matrix component; and a second ceramic filler component, wherein the second ceramic filler component comprises a silica filler material, and wherein the first filler material further comprises a mean particle size of at not greater than about 10 microns.

Embodiment 102. The copper clad laminate of embodiment 101, wherein the second fluoropolymer based adhesive layer has an average thickness of at least about 0.2 microns.

Embodiment 103. The copper clad laminate of embodiment 101, wherein the second fluoropolymer based adhesive layer has an average thickness of not greater than about 7 microns.

Embodiment 104. The copper clad laminate of embodiment 101, wherein the second fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 105. The copper clad laminate of embodiment 101, wherein the second fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 106. The copper clad laminate of embodiment 101, wherein the second fluoropolymer based adhesive layer is a PFA layer.

Embodiment 107. The copper clad laminate of embodiment 101, wherein a particle size distribution of the silica filler material of the second ceramic filler component comprises: a $D_{10}$ of at least about 0.2 microns and not greater than about 1.6, a $D_{50}$ of at least about 0.5 microns and not greater than about 2.7 microns, and a $D_{90}$ of at least about 0.8 microns and not greater than about 4.7 microns.

Embodiment 108. The copper clad laminate of embodiment 101, wherein the second filler material of the second ceramic filler component comprises a particle size distribution span (PSDS) of not greater than about 8, where PSDS is equal to $(D_{90}-D_{10})/D_{50}$, where $D_{90}$ is equal to a $D_{90}$ particle size distribution measurement of the silica filler material, $D_{10}$ is equal to a $D_{10}$ particle size distribution measurement of the first filler material, and $D_{50}$ is equal to a $D_{50}$ particle size distribution measurement of the first filler material.

Embodiment 109. The copper clad laminate of embodiment 101, wherein the second filler material further comprises an average surface area of not greater than about 10 $m^2/g$.

Embodiment 110. The copper clad laminate of embodiment 101, wherein the second filler material comprises a silica based compound.

Embodiment 111. The copper clad laminate of embodiment 101, wherein the second filler material comprises silica.

Embodiment 112. The copper clad laminate of embodiment 101, wherein the second resin matrix comprises a perfluoropolymer.

Embodiment 113. The copper clad laminate of embodiment 112, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 114. The copper clad laminate of embodiment 112, wherein the perfluoropolymer comprises polytetrafluoroethylene (PTFE), perfluoroalkoxy polymer resin (PFA), fluorinated ethylene propylene (FEP), or any combination thereof.

Embodiment 115. The copper clad laminate of embodiment 112, wherein the perfluoropolymer consists of polytetrafluoroethylene (PTFE), perfluoroalkoxy polymer resin (PFA), fluorinated ethylene propylene (FEP), or any combination thereof.

Embodiment 116. The copper clad laminate of embodiment 101, wherein the content of the second resin matrix component is at least about 45 vol. % for a total volume of the second filled polymer layer.

Embodiment 117. The copper clad laminate of embodiment 101, wherein the content of the second resin matrix component is not greater than about 63 vol. % for a total volume of the second filled polymer layer.

Embodiment 118. The copper clad laminate of embodiment 101, wherein the content of the perfluoropolymer is at least about 45 vol. % for a total volume of the second filled polymer layer.

Embodiment 119. The copper clad laminate of embodiment 101, wherein the content of the perfluoropolymer is not greater than about 63 vol. % for a total volume of the second filled polymer layer.

Embodiment 120. The copper clad laminate of embodiment 101, wherein the content of the second ceramic filler component is at least about 50 vol. % for a total volume of the second filled polymer layer.

Embodiment 121. The copper clad laminate of embodiment 101, wherein the content of the second ceramic filler component is not greater than about 57 vol. % for a total volume of the second filled polymer layer.

Embodiment 122. The copper clad laminate of embodiment 101, wherein the content of the second filler material is at least about 80 vol. % for a total volume of the second ceramic filler component.

Embodiment 123. The copper clad laminate of embodiment 101, wherein the content of the second filler material is not greater than about 100 vol. % for a total volume of the second ceramic filler component.

Embodiment 124. The copper clad laminate of embodiment 101, wherein the second ceramic filler component further comprises a $TiO_2$ filler material.

Embodiment 125. The copper clad laminate of embodiment 124, wherein the content of the $TiO_2$ filler material is at least about 1 vol. % for a total volume of the second ceramic filler component.

Embodiment 126. The copper clad laminate of embodiment 124, wherein the content of the $TiO_2$ filler material is not greater than about 20 vol. % for a total volume of the second ceramic filler component.

Embodiment 127. The copper clad laminate of embodiment 101, wherein the second ceramic filler component is at least about 97% amorphous.

Embodiment 128. The copper clad laminate of any one of embodiments 69 and 101, wherein the dielectric substrate comprises a porosity of not greater than about 10 vol. %.

Embodiment 129. The copper clad laminate of any one of embodiments 69 and 101, wherein the dielectric substrate comprises an average thickness of at least about 10 microns.

Embodiment 130. The copper clad laminate of any one of embodiments 69 and 101, wherein the dielectric substrate comprises an average thickness of not greater than about 200 microns.

Embodiment 131. The copper clad laminate of any one of embodiments 69 and 101, wherein the dielectric substrate comprises a dissipation factor (5 GHz, 20% RH) of not greater than about 0.005.

Embodiment 132. The copper clad laminate of any one of embodiments 69 and 101, wherein the dielectric substrate comprises a dissipation factor (5 GHz, 20% RH) of not greater than about 0.0014.

Embodiment 133. The copper clad laminate of any one of embodiments 69 and 101, wherein the dielectric substrate comprises a coefficient of thermal expansion (x/y axe) of not greater than about 80 ppm/° C.

Embodiment 134. The copper clad laminate of any one of embodiments 69 and 101, wherein the dielectric substrate comprises a peel strength between the first filled polymer layer and the polyimide layer of at least about 5 lb/in.

Embodiment 135. The copper clad laminate of any one of embodiments 69 and 101, wherein the dielectric substrate comprises a peel strength between the second filled polymer layer and the polyimide layer of at least about 5 lb/in.

Embodiment 136. The copper clad laminate of any one of embodiments 69 and 101, wherein the copper clad laminate comprises a peel strength between the copper foil layer and the dielectric substrate of at least about 6 lb/in.

Embodiment 137. The copper clad laminate of any one of embodiments 69 and 101, wherein the dielectric substrate comprises a tensile strength of at least about 60 MPa.

Embodiment 138. The copper clad laminate of any one of embodiments 69 and 101, wherein the dielectric substrate comprises a modulus of at least about 1.3 GPa.

Embodiment 139. The copper clad laminate of any one of embodiments 69 and 101, wherein the dielectric substrate comprises a moisture absorption of not greater than about 1.2%.

Embodiment 140. The copper clad laminate of any one of embodiments 69 and 101, wherein the copper clad laminate comprises a porosity of not greater than about 10 vol. %.

Embodiment 141. A printed circuit board comprising a copper-clad laminate, wherein the copper-clad laminate comprises: a copper foil layer, and a dielectric substrate overlying the copper foil layer, wherein the dielectric substrate comprises: a first fluoropolymer based adhesive layer, a polyimide layer overlying the fluoropolymer based adhesive layer, and a first filled polymer layer overlying the polyimide layer, wherein the first filled polymer layer comprises a first resin matrix component; and a first ceramic filler component, wherein the first ceramic filler component comprises a first filler material, and wherein the first filler material further comprises a mean particle size of at not greater than about 10 microns.

Embodiment 142. The printed circuit board of embodiment 141, wherein the first fluoropolymer based adhesive layer has an average thickness of at least about 0.2 microns.

Embodiment 143. The printed circuit board of embodiment 141, wherein the first fluoropolymer based adhesive layer has an average thickness of not greater than about 7 microns.

Embodiment 144. The printed circuit board of embodiment 141, wherein the first fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 145. The printed circuit board of embodiment 141, wherein the first fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 146. The printed circuit board of embodiment 141, wherein the first fluoropolymer based adhesive layer is a PFA layer.

Embodiment 147. The printed circuit board of embodiment 141, wherein a particle size distribution of the silica filler material of the first ceramic filler component comprises: a $D_{10}$ of at least about 0.2 microns and not greater than about 1.6, a $D_{50}$ of at least about 0.5 microns and not greater than about 2.7 microns, and a $D_{90}$ of at least about 0.8 microns and not greater than about 4.7 microns.

Embodiment 148. The printed circuit board of embodiment 141, wherein the silica filler material of the first ceramic filler component comprises a particle size distribution span (PSDS) of not greater than about 8, where PSDS is equal to $(D_{90}-D_{10})/D_{50}$, where $D_{90}$ is equal to a $D_{90}$ particle size distribution measurement of the silica filler material, $D_{10}$ is equal to a $D_{10}$ particle size distribution measurement of the first filler material, and $D_{50}$ is equal to a $D_{50}$ particle size distribution measurement of the first filler material.

Embodiment 149. The printed circuit board of embodiment 141, wherein the first filler material further comprises an average surface area of not greater than about 10 m²/g.

Embodiment 150. The printed circuit board of embodiment 141, wherein the first filler material comprises a silica based compound.

Embodiment 151. The printed circuit board of embodiment 141, wherein the first filler material comprises silica.

Embodiment 152. The printed circuit board of embodiment 141, wherein the first resin matrix component comprises a perfluoropolymer.

Embodiment 153. The printed circuit board of embodiment 152, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 154. The printed circuit board of embodiment 152, wherein the perfluoropolymer comprises polytetrafluoroethylene (PTFE), perfluoroalkoxy polymer resin (PFA), fluorinated ethylene propylene (FEP), or any combination thereof.

Embodiment 155. The printed circuit board of embodiment 152, wherein the perfluoropolymer consists of polytetrafluoroethylene (PTFE), perfluoroalkoxy polymer resin (PFA), fluorinated ethylene propylene (FEP), or any combination thereof.

Embodiment 156. The printed circuit board of embodiment 141, wherein the content of the first resin matrix component is at least about 45 vol. % for a total volume of the dielectric substrate.

Embodiment 157. The printed circuit board of embodiment 141, wherein the content of the first resin matrix component is not greater than about 63 vol. % for a total volume of the first filled polymer layer.

Embodiment 158. The printed circuit board of embodiment 152, wherein the content of the perfluoropolymer is at least about 45 vol. % for a total volume of the first filled polymer layer.

Embodiment 159. The printed circuit board of embodiment 152, wherein the content of the perfluoropolymer is not greater than about 63 vol. % for a total volume of the first filled polymer layer.

Embodiment 160. The printed circuit board of embodiment 141, wherein the content of the first ceramic filler component is at least about 30 vol. % for a total volume of the first filled polymer layer.

Embodiment 161. The printed circuit board of embodiment 141, wherein the content of the first ceramic filler component is not greater than about 57 vol. % for a total volume of the first filled polymer layer.

Embodiment 162. The printed circuit board of embodiment 141, wherein the content of the first filler material is at least about 80 vol. % for a total volume of the first ceramic filler component.

Embodiment 163. The printed circuit board of embodiment 141, wherein the content of the first filler material is not greater than about 100 vol. % for a total volume of the first ceramic filler component.

Embodiment 164. The printed circuit board of embodiment 141, wherein the first ceramic filler component further comprises a second filler material.

Embodiment 165. The printed circuit board of embodiment 164, wherein the second filler material of the first ceramic filler component comprises a high dielectric constant ceramic material.

Embodiment 166. The printed circuit board of embodiment 165, wherein the high dielectric constant ceramic material has a dielectric constant of at least about 14.

Embodiment 167. The printed circuit board of embodiment 165, wherein the first ceramic filler component further comprises $TiO_2$, $SrTiO_3$, $ZrTi_2O_6$, $MgTiO_3$, $CaTiO_3$, $BaTiO_4$ or any combination thereof.

Embodiment 168. The printed circuit board of embodiment 164, wherein the content of the second filler material of the first ceramic filler component is at least about 1 vol. % for a total volume of the first ceramic filler component.

Embodiment 169. The printed circuit board of embodiment 164, wherein the content of the second filler material of the first ceramic filler component is not greater than about 20 vol. % for a total volume of the first ceramic filler component.

Embodiment 170. The printed circuit board of embodiment 167, wherein the content of the $TiO_2$ filler material in the first ceramic filler component is at least about 1 vol. % for a total volume of the first ceramic filler component.

Embodiment 171. The printed circuit board of embodiment 167, wherein the content of the $TiO_2$ filler material in the first ceramic filler component is not greater than about 20 vol. % for a total volume of the first ceramic filler component.

Embodiment 172. The printed circuit board of embodiment 141, wherein the first ceramic filler component is at least about 97% amorphous.

Embodiment 173. The printed circuit board of embodiment 141, wherein the dielectric substrate further comprises a second filled polymer layer underlying the polyimide layer, and a second fluoropolymer based adhesive layer underlying the second filled polymer layer, wherein the second filled polymer layer comprises a second resin matrix component; and a second ceramic filler component, wherein the second ceramic filler component comprises a silica filler material, and wherein the first filler material further comprises a mean particle size of at not greater than about 10 microns.

Embodiment 174. The printed circuit board of embodiment 173, wherein the second fluoropolymer based adhesive layer has an average thickness of at least about 0.2 microns.

Embodiment 175. The printed circuit board of embodiment 173, wherein the second fluoropolymer based adhesive layer has an average thickness of not greater than about 7 microns.

Embodiment 176. The printed circuit board of embodiment 173, wherein the second fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 177. The printed circuit board of embodiment 173, wherein the second fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 178. The printed circuit board of embodiment 173, wherein the second fluoropolymer based adhesive layer is a PFA layer.

Embodiment 179. The printed circuit board of embodiment 173, wherein a particle size distribution of the silica filler material of the second ceramic filler component comprises: a $D_{10}$ of at least about 0.2 microns and not greater than about 1.6, a $D_{50}$ of at least about 0.5 microns and not greater than about 2.7 microns, and a $D_{90}$ of at least about 0.8 microns and not greater than about 4.7 microns.

Embodiment 180. The printed circuit board of embodiment 173, wherein the second filler material of the second ceramic filler component comprises a particle size distribution span (PSDS) of not greater than about 8, where PSDS is equal to $(D_{90}-D_{10})/D_{50}$, where $D_{90}$ is equal to a $D_{90}$ particle size distribution measurement of the silica filler material, $D_{10}$ is equal to a $D_{10}$ particle size distribution measurement of the first filler material, and $D_{50}$ is equal to a $D_{50}$ particle size distribution measurement of the first filler material.

Embodiment 181. The printed circuit board of embodiment 173, wherein the second filler material further comprises an average surface area of not greater than about 10 $m^2/g$.

Embodiment 182. The printed circuit board of embodiment 173, wherein the second filler material comprises a silica based compound.

Embodiment 183. The printed circuit board of embodiment 173, wherein the second filler material comprises silica.

Embodiment 184. The printed circuit board of embodiment 173, wherein the second resin matrix comprises a perfluoropolymer.

Embodiment 185. The printed circuit board of embodiment 184, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 186. The printed circuit board of embodiment 184, wherein the perfluoropolymer comprises polytetrafluoroethylene (PTFE), perfluoroalkoxy polymer resin (PFA), fluorinated ethylene propylene (FEP), or any combination thereof.

Embodiment 187. The printed circuit board of embodiment 184, wherein the perfluoropolymer consists of polytetrafluoroethylene (PTFE), perfluoroalkoxy polymer resin (PFA), fluorinated ethylene propylene (FEP), or any combination thereof.

Embodiment 188. The printed circuit board of embodiment 173, wherein the content of the second resin matrix component is at least about 45 vol. % for a total volume of the second filled polymer layer.

Embodiment 189. The printed circuit board of embodiment 173, wherein the content of the second resin matrix component is not greater than about 63 vol. % for a total volume of the second filled polymer layer.

Embodiment 190. The printed circuit board of embodiment 173, wherein the content of the perfluoropolymer is at least about 45 vol. % for a total volume of the second filled polymer layer.

Embodiment 191. The printed circuit board of embodiment 173, wherein the content of the perfluoropolymer is not greater than about 63 vol. % for a total volume of the second filled polymer layer.

Embodiment 192. The printed circuit board of embodiment 173, wherein the content of the second ceramic filler component is at least about 30 vol. % for a total volume of the second filled polymer layer.

Embodiment 193. The printed circuit board of embodiment 173, wherein the content of the second ceramic filler component is not greater than about 57 vol. % for a total volume of the second filled polymer layer.

Embodiment 194. The printed circuit board of embodiment 173, wherein the content of the second filler material is at least about 80 vol. % for a total volume of the second ceramic filler component.

Embodiment 195. The printed circuit board of embodiment 173, wherein the content of the second filler material is not greater than about 100 vol. % for a total volume of the second ceramic filler component.

Embodiment 196. The printed circuit board of embodiment 173, wherein the second ceramic filler component further comprises a $TiO_2$ filler material.

Embodiment 197. The printed circuit board of embodiment 196, wherein the content of the $TiO_2$ filler material is at least about 1 vol. % for a total volume of the second ceramic filler component.

Embodiment 198. The printed circuit board of embodiment 196, wherein the content of the $TiO_2$ filler material is not greater than about 20 vol. % for a total volume of the second ceramic filler component.

Embodiment 199. The printed circuit board of embodiment 173, wherein the second ceramic filler component is at least about 97% amorphous.

Embodiment 200. The printed circuit board of any one of embodiments 141 and 173, wherein the dielectric substrate comprises a porosity of not greater than about 10 vol. %.

Embodiment 201. The printed circuit board of any one of embodiments 141 and 173, wherein the dielectric substrate comprises an average thickness of at least about 10 microns.

Embodiment 202. The printed circuit board of any one of embodiments 141 and 173, wherein the dielectric substrate comprises an average thickness of not greater than about 200 microns.

Embodiment 203. The printed circuit board of any one of embodiments 141 and 173, wherein the dielectric substrate comprises a dissipation factor (5 GHz, 20% RH) of not greater than about 0.005.

Embodiment 204. The printed circuit board of any one of embodiments 141 and 173, wherein the dielectric substrate comprises a dissipation factor (5 GHz, 20% RH)) of not greater than about 0.0014.

Embodiment 205. The printed circuit board of any one of embodiments 141 and 173, wherein the dielectric substrate comprises a coefficient of thermal expansion (x/y axe) of not greater than about 80 ppm/° C.

Embodiment 206. The printed circuit board of any one of embodiments 141 and 173, wherein the dielectric substrate comprises a peel strength between the first filled polymer layer and the polyimide layer of at least about 5 lb/in.

Embodiment 207. The printed circuit board of any one of embodiments 141 and 173, wherein the dielectric substrate comprises a peel strength between the second filled polymer layer and the polyimide layer of at least about 5 lb/in.

Embodiment 208. The printed circuit board of any one of embodiments 141 and 173, wherein the printed circuit board comprises a peel strength between the copper foil layer and the dielectric substrate of at least about 5 lb/in.

Embodiment 209. The printed circuit board of any one of embodiments 141 and 173, wherein the dielectric substrate comprises a tensile strength of at least about 60 MPa.

Embodiment 210. The printed circuit board of any one of embodiments 141 and 173, wherein the dielectric substrate comprises a modulus of at least about 1.3 GPa.

Embodiment 211. The printed circuit board of any one of embodiments 141 and 173, wherein the dielectric substrate comprises a moisture absorption of not greater than about 1.2%.

Embodiment 212. The printed circuit board of any one of embodiments 141 and 173, wherein the printed circuit board comprises a porosity of not greater than about 10 vol. %.

Embodiment 213. A method of forming a dielectric substrate, wherein the method comprises: providing a first fluoropolymer based adhesive layer; providing a polyimide layer overlying the first fluoropolymer based adhesive layer; combining a first resin matrix precursor component and a first ceramic filler precursor component to form a forming mixture; and forming the forming mixture into a first filled polymer layer overlying the polyimide layer, wherein the first ceramic filler precursor component comprises a first filler precursor material, and wherein the first filler precursor material further comprises a mean particle size of not greater than about 10 microns.

Embodiment 214. The method of embodiment 213, wherein the first fluoropolymer based adhesive layer has an average thickness of at least about 0.2 microns.

Embodiment 215. The method of embodiment 213, wherein the first fluoropolymer based adhesive layer has an average thickness of not greater than about 7 microns.

Embodiment 216. The method of embodiment 213, wherein the first fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 217. The method of embodiment 213, wherein the first fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 218. The method of embodiment 213, wherein the first fluoropolymer based adhesive layer is a PFA layer.

Embodiment 219. The method of embodiment 213, wherein a particle size distribution of the first filler precursor material of the first ceramic filler precursor component comprises: a $D_{10}$ of at least about 0.2 microns and not greater than about 1.6, a $D_{50}$ of at least about 0.5 microns and not greater than about 2.7 microns, and a $D_{90}$ of at least about 0.8 microns and not greater than about 4.7 microns.

Embodiment 220. The method of embodiment 213, wherein the first filler precursor material of the first ceramic filler precursor component comprises a particle size distribution span (PSDS) of not greater than about 8, where PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material.

Embodiment 221. The method of embodiment 213, wherein the first filler precursor material further comprises an average surface area of not greater than about 10 m²/g.

Embodiment 222. The method of embodiment 213, wherein the first filler precursor material comprises a silica based compound.

Embodiment 223. The method of embodiment 213, wherein the first filler precursor material comprises silica.

Embodiment 224. The method of embodiment 213, wherein the first resin matrix precursor component comprises a perfluoropolymer.

Embodiment 225. The method of embodiment 224, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 226. The method of embodiment 224, wherein the perfluoropolymer comprises polytetrafluoroethylene (PTFE), perfluoroalkoxy polymer resin (PFA), fluorinated ethylene propylene (FEP), or any combination thereof.

Embodiment 227. The method of embodiment 224, wherein the perfluoropolymer consists of polytetrafluoroethylene (PTFE), perfluoroalkoxy polymer resin (PFA), fluorinated ethylene propylene (FEP), or any combination thereof.

Embodiment 228. The method of embodiment 213, wherein the content of the first resin matrix precursor component is at least about 45 vol. % for a total volume of the first filled polymer layer.

Embodiment 229. The method of embodiment 213, wherein the content of the first resin matrix precursor component is not greater than about 63 vol. % for a total volume of the first filled polymer layer.

Embodiment 230. The method of embodiment 224, wherein the content of the perfluoropolymer is at least about 45 vol. % for a total volume of the first filled polymer layer.

Embodiment 231. The method of embodiment 224, wherein the content of the perfluoropolymer is not greater than about 63 vol. % for a total volume of the first filled polymer layer.

Embodiment 232. The method of embodiment 213, wherein the content of the first ceramic filler precursor component is at least about 30 vol. % for a total volume of the first filled polymer layer.

Embodiment 233. The method of embodiment 213, wherein the content of the first ceramic filler precursor component is not greater than about 57 vol. % for a total volume of the first filled polymer layer.

Embodiment 234. The method of embodiment 213, wherein the content of the first filler precursor material is at least about 80 vol. % for a total volume of the first ceramic filler precursor component.

Embodiment 235. The method of embodiment 213, wherein the content of the first filler precursor material is not greater than about 100 vol. % for a total volume of the first ceramic filler precursor component.

Embodiment 236. The method of embodiment 213, wherein the first ceramic filler precursor component further comprises a second filler precursor material.

Embodiment 237. The method of embodiment 236, wherein the second filler precursor material of the first ceramic filler precursor component comprises a high dielectric constant ceramic material.

Embodiment 238. The method of embodiment 237, wherein the high dielectric constant ceramic material has a dielectric constant of at least about 14.

Embodiment 239. The method of embodiment 237, wherein the first ceramic filler component further comprises $TiO_2$, $SrTiO_3$, $ZrTi_2O_6$, $MgTiO_3$, $CaTiO_3$, $BaTiO_4$ or any combination thereof.

Embodiment 240. The method of embodiment 236, wherein the content of the second filler precursor material of the first ceramic filler precursor component is at least about 1 vol. % for a total volume of the first ceramic filler precursor component.

Embodiment 241. The method of embodiment 236, wherein the content of the second filler precursor material of the first ceramic filler precursor component is not greater than about 20 vol. % for a total volume of the first ceramic filler precursor component.

Embodiment 242. The method of embodiment 239, wherein the content of the $TiO_2$ filler material in the first ceramic filler precursor component is at least about 1 vol. % for a total volume of the first ceramic filler precursor component.

Embodiment 243. The method of embodiment 239, wherein the content of the $TiO_2$ filler material in the first ceramic filler precursor component is not greater than about 20 vol. % for a total volume of the first ceramic filler precursor component.

Embodiment 244. The method of embodiment 213, wherein the first ceramic filler precursor component is at least about 97% amorphous.

Embodiment 245. The method of embodiment 213, wherein the dielectric substrate further comprises a second filled polymer layer underlying the polyimide layer, and a second fluoropolymer based adhesive layer underlying the second filled polymer layer, wherein the second filled polymer layer comprises a second resin matrix precursor component; and a second ceramic filler precursor component, wherein the second ceramic filler precursor component comprises a third filler precursor material, and wherein the third filler precursor material further comprises a mean particle size of at not greater than about 10 microns.

Embodiment 246. The method of embodiment 245, wherein the second fluoropolymer based adhesive layer has an average thickness of at least about 0.2 microns.

Embodiment 247. The method of embodiment 245, wherein the second fluoropolymer based adhesive layer has an average thickness of not greater than about 7 microns.

Embodiment 248. The method of embodiment 245, wherein the second fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 249. The method of embodiment 245, wherein the second fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 250. The method of embodiment 245, wherein the second fluoropolymer based adhesive layer is a PFA layer.

Embodiment 251. The method of embodiment 245, wherein a particle size distribution of the third filler precursor material of the second ceramic filler component comprises: a $D_{10}$ of at least about 0.2 microns and not greater than about 1.6, a $D_{50}$ of at least about 0.5 microns and not greater than about 2.7 microns, and a $D_{90}$ of at least about 0.8 microns and not greater than about 4.7 microns.

Embodiment 252. The method of embodiment 245, wherein the third filler precursor material of the second ceramic filler component comprises a particle size distribution span (PSDS) of not greater than about 8, where PSDS is equal to $(D_{90}-D_{10})/D_{50}$, where $D_{90}$ is equal to a $D_{90}$ particle size distribution measurement of the third filler precursor material, $D_{10}$ is equal to a $D_{10}$ particle size distribution measurement of the third filler precursor material, and $D_{50}$ is equal to a $D_{50}$ particle size distribution measurement of the third filler precursor material.

Embodiment 253. The method of embodiment 245, wherein the third filler precursor material further comprises an average surface area of not greater than about 10 m²/g.

Embodiment 254. The method of embodiment 245, wherein the third filler precursor material comprises a silica based compound.

Embodiment 255. The method of embodiment 245, wherein the third filler precursor material comprises silica.

Embodiment 256. The method of embodiment 245, wherein the third filler precursor material comprises a perfluoropolymer.

Embodiment 257. The method of embodiment 256, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 258. The method of embodiment 256, wherein the perfluoropolymer comprises polytetrafluoroethylene (PTFE), perfluoroalkoxy polymer resin (PFA), fluorinated ethylene propylene (FEP), or any combination thereof.

Embodiment 259. The method of embodiment 256, wherein the perfluoropolymer consists of polytetrafluoroethylene (PTFE), perfluoroalkoxy polymer resin (PFA), fluorinated ethylene propylene (FEP), or any combination thereof.

Embodiment 260. The method of embodiment 245, wherein the content of the second resin matrix precursor component is at least about 45 vol. % for a total volume of the second filled polymer layer.

Embodiment 261. The method of embodiment 245, wherein the content of the second resin matrix precursor component is not greater than about 63 vol. % for a total volume of the second filled polymer layer.

Embodiment 262. The method of embodiment 245, wherein the content of the perfluoropolymer is at least about 45 vol. % for a total volume of the second filled polymer layer.

Embodiment 263. The method of embodiment 245, wherein the content of the perfluoropolymer is not greater than about 63 vol. % for a total volume of the second filled polymer layer.

Embodiment 264. The method of embodiment 245, wherein the content of the second ceramic filler precursor component is at least about 30 vol. % for a total volume of the second filled polymer layer.

Embodiment 265. The method of embodiment 245, wherein the content of the second ceramic filler precursor component is not greater than about 57 vol. % for a total volume of the second filled polymer layer.

Embodiment 266. The method of embodiment 245, wherein the content of the third filler precursor material is at least about 80 vol. % for a total volume of the second ceramic filler component.

Embodiment 267. The method of embodiment 245, wherein the content of the third filler precursor material is not greater than about 100 vol. % for a total volume of the second ceramic filler component.

Embodiment 268. The method of embodiment 245, wherein the second ceramic filler precursor component further comprises a $TiO_2$ filler material.

Embodiment 269. The method of embodiment 268, wherein the content of the $TiO_2$ filler material is at least about 1 vol. % for a total volume of the second ceramic filler precursor component.

Embodiment 270. The method of embodiment 268, wherein the content of the $TiO_2$ filler material is not greater than about 20 vol. % for a total volume of the second ceramic filler precursor component.

Embodiment 271. The method of embodiment 268, wherein the second ceramic filler precursor component is at least about 97% amorphous.

Embodiment 272. The method of any one of embodiments 213 and 245, wherein the dielectric substrate comprises a porosity of not greater than about 10 vol. %.

Embodiment 273. The method of any one of embodiments 213 and 245, wherein the dielectric substrate comprises an average thickness of at least about 10 microns.

Embodiment 274. The method of any one of embodiments 213 and 245, wherein the dielectric substrate comprises an average thickness of not greater than about 200 microns.

Embodiment 275. The method of any one of embodiments 213 and 245, wherein the dielectric substrate comprises a dissipation factor (5 GHz, 20% RH) of not greater than about 0.005.

Embodiment 276. The method of any one of embodiments 213 and 245, wherein the dielectric substrate comprises a dissipation factor (5 GHz, 20% RH)) of not greater than about 0.0014.

Embodiment 277. The method of any one of embodiments 213 and 245, wherein the dielectric substrate comprises a coefficient of thermal expansion (x/y axe) of not greater than about 80 ppm/° C.

Embodiment 278. The method of any one of embodiments 213 and 245, wherein the dielectric substrate comprises a peel strength between the first filled polymer layer and the polyimide layer of at least about 5 lb/in.

Embodiment 279. The method of any one of embodiments 213 and 245, wherein the dielectric substrate comprises a peel strength between the second filled polymer layer and the polyimide layer of at least about 5 lb/in.

Embodiment 280. The method of any one of embodiments 213 and 245, wherein the dielectric substrate comprises a moisture absorption of not greater than about 1.2%.

Embodiment 281. A method of forming a copper-clad laminate, wherein the method comprises providing a copper foil layer, and forming a dielectric substrate overlying the copper foil layer, wherein forming the dielectric substrate comprises: providing a first fluoropolymer based adhesive layer; providing a polyimide layer overlying the first fluoropolymer based adhesive layer; combining a first resin matrix precursor component and a first ceramic filler precursor component to form a forming mixture; and forming the forming mixture into a first filled polymer layer overlying the polyimide layer, wherein the first ceramic filler precursor component comprises a first filler precursor material, and wherein the first filler precursor material further comprises a mean particle size of not greater than about 10 microns.

Embodiment 282. The method of embodiment 281, wherein the first fluoropolymer based adhesive layer has an average thickness of at least about 0.2 microns.

Embodiment 283. The method of embodiment 281, wherein the first fluoropolymer based adhesive layer has an average thickness of not greater than about 7 microns.

Embodiment 284. The method of embodiment 281, wherein the first fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 285. The method of embodiment 281, wherein the first fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 286. The method of embodiment 281, wherein the first fluoropolymer based adhesive layer is a PFA layer.

Embodiment 287. The method of embodiment 281, wherein a particle size distribution of the first filler precursor material of the first ceramic filler precursor component comprises: a $D_{10}$ of at least about 0.2 microns and not greater than about 1.6, a $D_{50}$ of at least about 0.5 microns and not greater than about 2.7 microns, and a $D_{90}$ of at least about 0.8 microns and not greater than about 4.7 microns.

Embodiment 288. The method of embodiment 281, wherein the first filler precursor material of the first ceramic filler precursor component comprises a particle size distribution span (PSDS) of not greater than about 8, where PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material.

Embodiment 289. The method of embodiment 281, wherein the first filler precursor material further comprises an average surface area of not greater than about 10 $m^2/g$.

Embodiment 290. The method of embodiment 281, wherein the first filler precursor material comprises a silica based compound.

Embodiment 291. The method of embodiment 281, wherein the first filler precursor material comprises silica.

Embodiment 292. The method of embodiment 281, wherein the first resin matrix precursor component comprises a perfluoropolymer.

Embodiment 293. The method of embodiment 292, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 294. The method of embodiment 292, wherein the perfluoropolymer comprises polytetrafluoroethylene (PTFE), perfluoroalkoxy polymer resin (PFA), fluorinated ethylene propylene (FEP), or any combination thereof.

Embodiment 295. The method of embodiment 292, wherein the perfluoropolymer consists of polytetrafluoroethylene (PTFE), perfluoroalkoxy polymer resin (PFA), fluorinated ethylene propylene (FEP), or any combination thereof.

Embodiment 296. The method of embodiment 281, wherein the content of the first resin matrix precursor component is at least about 45 vol. % for a total volume of the first filled polymer layer.

Embodiment 297. The method of embodiment 281, wherein the content of the first resin matrix precursor component is not greater than about 63 vol. % for a total volume of the first filled polymer layer.

Embodiment 298. The method of embodiment 292, wherein the content of the perfluoropolymer is at least about 45 vol. % for a total volume of the first filled polymer layer.

Embodiment 299. The method of embodiment 292, wherein the content of the perfluoropolymer is not greater than about 63 vol. % for a total volume of the first filled polymer layer.

Embodiment 300. The method of embodiment 281, wherein the content of the first ceramic filler precursor component is at least about 30 vol. % for a total volume of the first filled polymer layer.

Embodiment 301. The method of embodiment 281, wherein the content of the first ceramic filler precursor component is not greater than about 57 vol. % for a total volume of the first filled polymer layer.

Embodiment 302. The method of embodiment 281, wherein the content of the first filler precursor material is at least about 80 vol. % for a total volume of the first ceramic filler precursor component.

Embodiment 303. The method of embodiment 281, wherein the content of the first filler precursor material is not greater than about 100 vol. % for a total volume of the first ceramic filler precursor component.

Embodiment 304. The method of embodiment 281, wherein the first ceramic filler precursor component further comprises a second filler precursor material.

Embodiment 305. The method of embodiment 304, wherein the second filler precursor material of the first ceramic filler precursor component comprises a high dielectric constant ceramic material.

Embodiment 306. The method of embodiment 305, wherein the high dielectric constant ceramic material has a dielectric constant of at least about 14.

Embodiment 307. The method of embodiment 305, wherein the first ceramic filler component further comprises $TiO_2$, $SrTiO_3$, $ZrTi_2O_6$, $MgTiO_3$, $CaTiO_3$, $BaTiO_4$ or any combination thereof.

Embodiment 308. The method of embodiment 304, wherein the content of the second filler precursor material of the first ceramic filler precursor component is at least about 1 vol. % for a total volume of the first ceramic filler precursor component.

Embodiment 309. The method of embodiment 304, wherein the content of the second filler precursor material of the first ceramic filler precursor component is not greater than about 20 vol. % for a total volume of the first ceramic filler precursor component.

Embodiment 310. The method of embodiment 307, wherein the content of the $TiO_2$ filler material in the first ceramic filler precursor component is at least about 1 vol. % for a total volume of the first ceramic filler precursor component.

Embodiment 311. The method of embodiment 307, wherein the content of the $TiO_2$ filler material in the first ceramic filler precursor component is not greater than about 20 vol. % for a total volume of the first ceramic filler precursor component.

Embodiment 312. The method of embodiment 281, wherein the first ceramic filler precursor component is at least about 97% amorphous.

Embodiment 313. The method of embodiment 281, wherein the dielectric substrate further comprises a second filled polymer layer underlying the polyimide layer, and a second fluoropolymer based adhesive layer underlying the second filled polymer layer, wherein the second filled polymer layer comprises a second resin matrix precursor component; and a second ceramic filler precursor component, wherein the second ceramic filler precursor component comprises a third filler precursor material, and wherein the third filler precursor material further comprises a mean particle size of at not greater than about 10 microns.

Embodiment 314. The method of embodiment 304, wherein the second fluoropolymer based adhesive layer has an average thickness of at least about 0.2 microns.

Embodiment 315. The method of embodiment 304, wherein the second fluoropolymer based adhesive layer has an average thickness of not greater than about 7 microns.

Embodiment 316. The method of embodiment 304, wherein the second fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 317. The method of embodiment 304, wherein the second fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 318. The method of embodiment 304, wherein the second fluoropolymer based adhesive layer is a PFA layer.

Embodiment 319. The method of embodiment 304, wherein a particle size distribution of the third filler precursor material of the second ceramic filler component comprises: a $D_{10}$ of at least about 0.2 microns and not greater than about 1.6, a $D_{50}$ of at least about 0.5 microns and not greater than about 2.7 microns, and a $D_{90}$ of at least about 0.8 microns and not greater than about 4.7 microns.

Embodiment 320. The method of embodiment 304, wherein the third filler precursor material of the second ceramic filler component comprises a particle size distribution span (PSDS) of not greater than about 8, where PSDS is equal to $(D_{90}-D_{10})/D_{50}$, where $D_{90}$ is equal to a $D_{90}$ particle size distribution measurement of the third filler precursor material, $D_{10}$ is equal to a $D_{10}$ particle size distribution measurement of the third filler precursor material, and $D_{50}$ is equal to a $D_{50}$ particle size distribution measurement of the third filler precursor material.

Embodiment 321. The method of embodiment 304, wherein the third filler precursor material further comprises an average surface area of not greater than about 10 $m^2/g$.

Embodiment 322. The method of embodiment 304, wherein the third filler precursor material comprises a silica based compound.

Embodiment 323. The method of embodiment 304, wherein the third filler precursor material comprises silica.

Embodiment 324. The method of embodiment 304, wherein the third filler precursor material comprises a perfluoropolymer.

Embodiment 325. The method of embodiment 324, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 326. The method of embodiment 324, wherein the perfluoropolymer comprises polytetrafluoroethylene (PTFE), perfluoroalkoxy polymer resin (PFA), fluorinated ethylene propylene (FEP), or any combination thereof.

Embodiment 327. The method of embodiment 324, wherein the perfluoropolymer consists of polytetrafluoroethylene (PTFE), perfluoroalkoxy polymer resin (PFA), fluorinated ethylene propylene (FEP), or any combination thereof.

Embodiment 328. The method of embodiment 304, wherein the content of the second resin matrix precursor component is at least about 45 vol. % for a total volume of the second filled polymer layer.

Embodiment 329. The method of embodiment 304, wherein the content of the second resin matrix precursor component is not greater than about 63 vol. % for a total volume of the second filled polymer layer.

Embodiment 330. The method of embodiment 304, wherein the content of the perfluoropolymer is at least about 45 vol. % for a total volume of the second filled polymer layer.

Embodiment 331. The method of embodiment 304, wherein the content of the perfluoropolymer is not greater than about 63 vol. % for a total volume of the second filled polymer layer.

Embodiment 332. The method of embodiment 304, wherein the content of the second ceramic filler precursor component is at least about 30 vol. % for a total volume of the second filled polymer layer.

Embodiment 333. The method of embodiment 304, wherein the content of the second ceramic filler precursor component is not greater than about 57 vol. % for a total volume of the second filled polymer layer.

Embodiment 334. The method of embodiment 304, wherein the content of the third filler precursor material is at least about 80 vol. % for a total volume of the second ceramic filler component.

Embodiment 335. The method of embodiment 304, wherein the content of the third filler precursor material is not greater than about 100 vol. % for a total volume of the second ceramic filler component.

Embodiment 336. The method of embodiment 304, wherein the second ceramic filler precursor component further comprises a $TiO_2$ filler material.

Embodiment 337. The method of embodiment 336, wherein the content of the $TiO_2$ filler material is at least about 1 vol. % for a total volume of the second ceramic filler precursor component.

Embodiment 338. The method of embodiment 336, wherein the content of the $TiO_2$ filler material is not greater than about 20 vol. % for a total volume of the second ceramic filler precursor component.

Embodiment 339. The method of embodiment 336, wherein the second ceramic filler precursor component is at least about 97% amorphous.

Embodiment 340. The method of any one of embodiments 281 and 304, wherein the dielectric substrate comprises a porosity of not greater than about 10 vol. %.

Embodiment 341. The method of any one of embodiments 281 and 304, wherein the dielectric substrate comprises an average thickness of at least about 10 microns.

Embodiment 342. The method of any one of embodiments 281 and 304, wherein the dielectric substrate comprises an average thickness of not greater than about 200 microns.

Embodiment 343. The method of any one of embodiments 281 and 304, wherein the dielectric substrate comprises a dissipation factor (5 GHz, 20% RH) of not greater than about 0.005.

Embodiment 344. The method of any one of embodiments 281 and 304, wherein the dielectric substrate comprises a dissipation factor (5 GHz, 20% RH) of not greater than about 0.0014.

Embodiment 345. The method of any one of embodiments 281 and 304, wherein the dielectric substrate comprises a coefficient of thermal expansion (x/y axe) of not greater than about 80 ppm/° C.

Embodiment 346. The method of any one of embodiments 281 and 304, wherein the dielectric substrate comprises a peel strength between the first filled polymer layer and the polyimide layer of at least about 5 lb/in.

Embodiment 347. The method of any one of embodiments 281 and 304, wherein the dielectric substrate comprises a peel strength between the second filled polymer layer and the polyimide layer of at least about 5 lb/in.

Embodiment 348. The method of any one of embodiments 281 and 304, wherein the dielectric substrate comprises a moisture absorption of not greater than about 1.2%.

Embodiment 349. A method of forming a printed circuit board, wherein the method comprises providing a copper foil layer, and forming a dielectric substrate overlying the copper foil layer, wherein forming the dielectric substrate comprises: providing a first fluoropolymer based adhesive layer; providing a polyimide layer overlying the first fluoropolymer based adhesive layer; combining a first resin matrix precursor component and a first ceramic filler precursor component to form a forming mixture; and forming the forming mixture into a first filled polymer layer overlying the polyimide layer, wherein the first ceramic filler precursor component comprises a first filler precursor material, and wherein the first filler precursor material further comprises a mean particle size of not greater than about 10 microns.

Embodiment 350. The method of embodiment 349, wherein the first fluoropolymer based adhesive layer has an average thickness of at least about 0.2 microns.

Embodiment 351. The method of embodiment 349, wherein the first fluoropolymer based adhesive layer has an average thickness of not greater than about 7 microns.

Embodiment 352. The method of embodiment 349, wherein the first fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 353. The method of embodiment 349, wherein the first fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 354. The method of embodiment 349, wherein the first fluoropolymer based adhesive layer is a PFA layer.

Embodiment 355. The method of embodiment 349, wherein a particle size distribution of the first filler precursor material of the first ceramic filler precursor component comprises: a $D_{10}$ of at least about 0.2 microns and not greater than about 1.6, a $D_{50}$ of at least about 0.5 microns and not greater than about 2.7 microns, and a $D_{90}$ of at least about 0.8 microns and not greater than about 4.7 microns.

Embodiment 356. The method of embodiment 349, wherein the first filler precursor material of the first ceramic filler precursor component comprises a particle size distribution span (PSDS) of not greater than about 8, where PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material.

Embodiment 357. The method of embodiment 349, wherein the first filler precursor material further comprises an average surface area of not greater than about 10 $m^2/g$.

Embodiment 358. The method of embodiment 349, wherein the first filler precursor material comprises a silica based compound.

Embodiment 359. The method of embodiment 349, wherein the first filler precursor material comprises silica.

Embodiment 360. The method of embodiment 349, wherein the first resin matrix precursor component comprises a perfluoropolymer.

Embodiment 361. The method of embodiment 360, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 362. The method of embodiment 360, wherein the perfluoropolymer comprises polytetrafluoroethylene (PTFE), perfluoroalkoxy polymer resin (PFA), fluorinated ethylene propylene (FEP), or any combination thereof.

Embodiment 363. The method of embodiment 360, wherein the perfluoropolymer consists of polytetrafluoroethylene (PTFE), perfluoroalkoxy polymer resin (PFA), fluorinated ethylene propylene (FEP), or any combination thereof.

Embodiment 364. The method of embodiment 349, wherein the content of the first resin matrix precursor component is at least about 45 vol. % for a total volume of the first filled polymer layer.

Embodiment 365. The method of embodiment 349, wherein the content of the first resin matrix precursor component is not greater than about 63 vol. % for a total volume of the first filled polymer layer.

Embodiment 366. The method of embodiment 360, wherein the content of the perfluoropolymer is at least about 45 vol. % for a total volume of the first filled polymer layer.

Embodiment 367. The method of embodiment 360, wherein the content of the perfluoropolymer is not greater than about 63 vol. % for a total volume of the first filled polymer layer.

Embodiment 368. The method of embodiment 349, wherein the content of the first ceramic filler precursor component is at least about 30 vol. % for a total volume of the first filled polymer layer.

Embodiment 369. The method of embodiment 349, wherein the content of the first ceramic filler precursor component is not greater than about 57 vol. % for a total volume of the first filled polymer layer.

Embodiment 370. The method of embodiment 349, wherein the content of the first filler precursor material is at least about 80 vol. % for a total volume of the first ceramic filler precursor component.

Embodiment 371. The method of embodiment 349, wherein the content of the first filler precursor material is not greater than about 100 vol. % for a total volume of the first ceramic filler precursor component.

Embodiment 372. The method of embodiment 349, wherein the first ceramic filler precursor component further comprises a second filler precursor material.

Embodiment 373. The method of embodiment 372, wherein the second filler precursor material of the first ceramic filler precursor component comprises a high dielectric constant ceramic material.

Embodiment 374. The method of embodiment 373, wherein the high dielectric constant ceramic material has a dielectric constant of at least about 14.

Embodiment 375. The method of embodiment 373, wherein the first ceramic filler component further comprises $TiO_2$, $SrTiO_3$, $ZrTi_2O_6$, $MgTiO_3$, $CaTiO_3$, $BaTiO_4$ or any combination thereof.

Embodiment 376. The method of embodiment 372, wherein the content of the second filler precursor material of the first ceramic filler precursor component is at least about 1 vol. % for a total volume of the first ceramic filler precursor component.

Embodiment 377. The method of embodiment 372, wherein the content of the second filler precursor material of the first ceramic filler precursor component is not greater than about 20 vol. % for a total volume of the first ceramic filler precursor component.

Embodiment 378. The method of embodiment 373, wherein the content of the $TiO_2$ filler material in the first ceramic filler precursor component is at least about 1 vol. % for a total volume of the first ceramic filler precursor component.

Embodiment 379. The method of embodiment 373, wherein the content of the $TiO_2$ filler material in the first ceramic filler precursor component is not greater than about 20 vol. % for a total volume of the first ceramic filler precursor component.

Embodiment 380. The method of embodiment 349, wherein the first ceramic filler precursor component is at least about 97% amorphous.

Embodiment 381. The method of embodiment 349, wherein the dielectric substrate further comprises a second filled polymer layer underlying the polyimide layer, and a second fluoropolymer based adhesive layer underlying the second filled polymer layer, wherein the second filled polymer layer comprises a second resin matrix precursor component; and a second ceramic filler precursor component, wherein the second ceramic filler precursor component comprises a third filler precursor material, and wherein the third filler precursor material further comprises a mean particle size of at not greater than about 10 microns.

Embodiment 382. The method of embodiment 372, wherein the second fluoropolymer based adhesive layer has an average thickness of at least about 0.2 microns.

Embodiment 383. The method of embodiment 372, wherein the second fluoropolymer based adhesive layer has an average thickness of not greater than about 7 microns.

Embodiment 384. The method of embodiment 372, wherein the second fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 385. The method of embodiment 372, wherein the second fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 386. The method of embodiment 372, wherein the second fluoropolymer based adhesive layer is a PFA layer.

Embodiment 387. The method of embodiment 372, wherein a particle size distribution of the third filler precursor material of the second ceramic filler component comprises: a $D_{10}$ of at least about 0.2 microns and not greater than about 1.6, a $D_{50}$ of at least about 0.5 microns and not greater than about 2.7 microns, and a $D_{90}$ of at least about 0.8 microns and not greater than about 4.7 microns.

Embodiment 388. The method of embodiment 372, wherein the third filler precursor material of the second ceramic filler component comprises a particle size distribution span (PSDS) of not greater than about 8, where PSDS is equal to $(D_{90}-D_{10})/D_{50}$, where $D_{90}$ is equal to a $D_{90}$ particle size distribution measurement of the third filler precursor material, $D_{10}$ is equal to a $D_{10}$ particle size distribution measurement of the third filler precursor material, and $D_{50}$ is equal to a $D_{50}$ particle size distribution measurement of the third filler precursor material.

Embodiment 389. The method of embodiment 372, wherein the third filler precursor material further comprises an average surface area of not greater than about 10 $m^2/g$.

Embodiment 390. The method of embodiment 372, wherein the third filler precursor material comprises a silica based compound.

Embodiment 391. The method of embodiment 372, wherein the third filler precursor material comprises silica.

Embodiment 392. The method of embodiment 372, wherein the third filler precursor material comprises a perfluoropolymer.

Embodiment 393. The method of embodiment 392, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 394. The method of embodiment 392, wherein the perfluoropolymer comprises polytetrafluoroethylene (PTFE), perfluoroalkoxy polymer resin (PFA), fluorinated ethylene propylene (FEP), or any combination thereof.

Embodiment 395. The method of embodiment 392, wherein the perfluoropolymer consists of polytetrafluoroethylene (PTFE), perfluoroalkoxy polymer resin (PFA), fluorinated ethylene propylene (FEP), or any combination thereof.

Embodiment 396. The method of embodiment 372, wherein the content of the second resin matrix precursor component is at least about 50 vol. % for a total volume of the second filled polymer layer.

Embodiment 397. The method of embodiment 372, wherein the content of the second resin matrix precursor component is not greater than about 63 vol. % for a total volume of the second filled polymer layer.

Embodiment 398. The method of embodiment 372, wherein the content of the perfluoropolymer is at least about 45 vol. % for a total volume of the second filled polymer layer.

Embodiment 399. The method of embodiment 372, wherein the content of the perfluoropolymer is not greater than about 63 vol. % for a total volume of the second filled polymer layer.

Embodiment 400. The method of embodiment 372, wherein the content of the second ceramic filler precursor component is at least about 30 vol. % for a total volume of the second filled polymer layer.

Embodiment 401. The method of embodiment 372, wherein the content of the second ceramic filler precursor component is not greater than about 57 vol. % for a total volume of the second filled polymer layer.

Embodiment 402. The method of embodiment 372, wherein the content of the third filler precursor material is at least about 80 vol. % for a total volume of the second ceramic filler component.

Embodiment 403. The method of embodiment 372, wherein the content of the third filler precursor material is not greater than about 100 vol. % for a total volume of the second ceramic filler component.

Embodiment 404. The method of embodiment 372, wherein the second ceramic filler precursor component further comprises a $TiO_2$ filler material.

Embodiment 405. The method of embodiment 404, wherein the content of the $TiO_2$ filler material is at least about 1 vol. % for a total volume of the second ceramic filler precursor component.

Embodiment 406. The method of embodiment 404, wherein the content of the $TiO_2$ filler material is not greater than about 20 vol. % for a total volume of the second ceramic filler precursor component.

Embodiment 407. The method of embodiment 404, wherein the second ceramic filler precursor component is at least about 97% amorphous or at least about 98% or at least about 99%.

Embodiment 408. The method of any one of embodiments 349 and 372, wherein the dielectric substrate comprises a porosity of not greater than about 10 vol. %.

Embodiment 409. The method of any one of embodiments 349 and 372, wherein the dielectric substrate comprises an average thickness of at least about 10 microns.

Embodiment 410. The method of any one of embodiments 349 and 372, wherein the dielectric substrate comprises an average thickness of not greater than about 200 microns.

Embodiment 411. The method of any one of embodiments 349 and 372, wherein the dielectric substrate comprises a dissipation factor (5 GHz, 20% RH) of not greater than about 0.005.

Embodiment 412. The method of any one of embodiments 349 and 372, wherein the dielectric substrate comprises a dissipation factor (5 GHz, 20% RH) of not greater than about 0.0014.

Embodiment 413. The method of any one of embodiments 349 and 372, wherein the dielectric substrate comprises a coefficient of thermal expansion (x/y axe) of not greater than about 80 ppm/° C.

Embodiment 414. The method of any one of embodiments 349 and 372, wherein the dielectric substrate comprises a peel strength between the first filled polymer layer and the polyimide layer of at least about 5 lb/in.

Embodiment 415. The method of any one of embodiments 349 and 372, wherein the dielectric substrate comprises a peel strength between the second filled polymer layer and the polyimide layer of at least about 5 lb/in.

Embodiment 416. The method of any one of embodiments 349 and 372, wherein the dielectric substrate comprises a moisture absorption of not greater than about 1.2%.

EXAMPLES

The concepts described herein will be further described in the following Examples, which do not limit the scope of the invention described in the claims.

Example 1

Sample dielectric substrates S1-S12 were configured and formed according to certain embodiments described herein.

Each sample dielectric substrate was formed using a cast film process where a fluoropolymer pre-treated polyimide carrier belt is passed through a dip pan containing an aqueous forming mixture (i.e. the combination of the resin matrix component and the ceramic filler component) at the base of the coating tower. The coated carrier belt then passes through a metering zone in which metering bars remove excess dispersion from the coated carrier belt. After the metering zone, the coated carrier belt passes into a drying zone maintained at a temperature between 82° C. and 121° C. to evaporate the water. The coated carrier belt with the dried film then passes through a bake zone maintained at a temperature between 315° C. and 343° C. Finally, the carrier belt passes through a fusing zone maintained at a temperature between 349° C. and 399° C. to sinter, i.e. coalesce, the resin matrix material. The coated carrier belt then passes through a cooling plenum from which it can be directed either to a subsequent dip pan to begin formation of a further layer of the film or to a stripping apparatus. When the desired film thickness is achieved, the films are stripped off of the carrier belt.

The resin matrix component for each sample dielectric substrates S1-S12 is polytetrafluoroethylene (PTFE). Further configuration and composition details of each dielectric substrate S1-S12 are summarized in Table 1 below.

TABLE 1

Sample Dielectric Substrate Configuration and Composition

| | | | Dielectric Substrate Composition | | | |
|---|---|---|---|---|---|---|
| Sample No. | Sample Thickness (mil) | Silica Based Component Type | Ceramic Filler Component (vol. % of dielectric substrate) | Resin Matrix Component (vol. % of dielectric substrate) | First Filler Material-Silica Based Component (vol. % of Ceramic Filler Component) | Second Ceramic Filler Material (TiO$_2$) (vol. % of Ceramic Filler Component) |
| S1 | 5 | A | 54.4 | 45.6 | 96.1 | 3.9 |
| S2 | 5 | A | 54.4 | 45.6 | 96.1 | 3.9 |
| S3 | 5 | A | 54.4 | 45.6 | 96.1 | 3.9 |
| S4 | 3 | A | 54.4 | 45.6 | 96.1 | 3.9 |
| 55 | 4 | A | 54.4 | 45.6 | 100.00 | 0.0 |
| S6 | 4 | A | 54.4 | 45.6 | 100.0 | 0.0 |
| S7 | 4 | A | 54.4 | 45.6 | 100.0 | 0.0 |
| S8 | 4 | A | 54.4 | 45.6 | 100.0 | 0.0 |
| S9 | 2 | A | 55.0 | 45.0 | 100.0 | 0.0 |
| S10 | 2 | B | 54.4 | 45.6 | 100.0 | 0.0 |
| S11 | 4 | A | 48.0 | 52.0 | 100.0 | 0.0 |
| S12 | 4 | A | 48.0 | 52.0 | 100.0 | 0.0 |

Characteristics, including particle size distribution measurements (i.e. $D_{10}$, $D_{50}$ & $D_{90}$), particle size distribution span, mean particle size, and BET surface area, of the silica based component types used in the sample dielectric substrates S1-S12 are summarized in Table 2 below.

TABLE 2

Silica Based Component Characteristics

| Silica Based Component Type | $D_{10}$(μm) | $D_{50}$(μm) | $D_{90}$(μm) | PSDS ($D_{90} - D_{10}$)/$D_{50}$ | Mean Particle Size (μm) | BET Surface Area (m$^2$/g) |
|---|---|---|---|---|---|---|
| A | 1.3 | 2.3 | 3.9 | 1.13 | 2.3-3.0 | 2.2-2.5 |
| B | 0.5 | 1.1 | 1.6 | 1.0 | 1.0-1.9 | 6.1 |

Performance properties of each sample dielectric substrates S1-S12 are summarized in Table 3 below. The summarized performance properties include the permittivity of the sample dielectric substrate measured at 5GHz ("Dk (5GHz)"), the dissipation factor of the substrate measured at 5 GHz, 20% RH ("Df (5GHz, 20% RH)"), the dissipation factor of the sample dielectric substrate measured at 5 GHz, 80% RH ("Df (5GHz, 80% RH)"), and the coefficient of thermal expansion of the sample dielectric substrate ("CTE").

TABLE 3

Performance Properties

| Sample No. | Dk (5 GHz) | Df (5 GHz, 20% RH) | Df (5 GHz, 80% RH) | CTE (ppm/° C.) |
|---|---|---|---|---|
| S1 | 3.02 | 0.0005 | 0.0006 | 29 |
| S2 | 3.00 | 0.0005 | 0.0007 | 28 |
| S3 | 3.02 | 0.0005 | 0.0006 | 25 |
| S4 | 2.95 | 0.0004 | 0.0006 | 20 |
| S5 | 2.76 | 0.0004 | 0.0005 | 29 |
| S6 | 2.78 | 0.0004 | 0.0005 | 19 |
| S7 | 2.73 | 0.0005 | 0.0006 | 26 |
| S8 | 2.75 | 0.0004 | 0.0006 | 31 |
| S9 | 2.78 | 0.0005 | 0.0006 | 30 |
| S10 | 2.70 | 0.0007 | 0.0010 | 34 |
| S11 | 2.68 | 0.0005 | 0.0006 | 54 |
| S12 | 2.72 | 0.0004 | 0.0007 | 58 |

Example 2

For purposes of comparison, comparative sample dielectric substrates CS1-CS10 were configured and formed.

Each comparative sample dielectric substrate was formed using a cast film process where a fluoropolymer pre-treated polyimide carrier belt is passed through a dip pan containing an aqueous forming mixture (i.e. the combination of the resin matrix component and the ceramic filler component) at the base of the coating tower. The coated carrier belt then passes through a metering zone in which metering bars remove excess dispersion from the coated carrier belt. After the metering zone, the coated carrier belt passes into a drying zone maintained at a temperature between 82° C. and 121° C. to evaporate the water. The coated carrier belt with the dried film then passes through a bake zone maintained at a temperature between 315° C. and 343° C. Finally, the carrier belt passes through a fusing zone maintained at a temperature between 349° C. and 399° C. to sinter, i.e. coalesce, the resin matrix material. The coated carrier belt then passes through a cooling plenum from which it can be directed either to a subsequent dip pan to begin formation of a further layer of the film or to a stripping apparatus. When the desired film thickness is achieved, the films are stripped off of the carrier belt.

The resin matrix component for each comparative sample dielectric substrates CS1-CS10 is polytetrafluoroethylene (PTFE). Further configuration and composition details of each dielectric substrate CS1-CS10 are summarized in Table 4 below.

TABLE 4

Comparative Sample Dielectric Substrate Configuration and Composition

| | | | Dielectric Substrate Composition | | | |
|---|---|---|---|---|---|---|
| Sample No. | Sample Thickness (mil) | Silica Based Component Type | Ceramic Filler Component (vol. % of dielectric substrate) | Resin Matrix Component (vol. % of dielectric substrate) | First Filler Material-Silica Based Component (vol. % of Ceramic Filler Component) | Second Ceramic Filler Material ($TiO_2$) (vol. % of Ceramic Filler Component) |
| CS1 | 5 | CA | 55.0 | 45.0 | 100.0 | 0.0 |
| CS2 | 5 | CB | 50.0 | 50.0 | 100.0 | 0.0 |
| CS3 | 5 | CA | 50.0 | 50.0 | 100.0 | 0.0 |
| CS4 | 5 | CC | 54.4 | 45.6 | 96.1 | 3.9 |
| CS5 | 5 | CA | 50.0 | 50.0 | 98.0 | 2.0 |
| CS6 | 5 | CA | 50.0 | 50.0 | 90.0 | 10.0 |
| CS7 | 5 | CA | 52.0 | 48.0 | 96.2 | 3.8 |
| CS8 | 5 | CA | 53.0 | 47.0 | 93.4 | 6.6 |
| CS9 | 5 | CA | 54.0 | 46.0 | 95.9 | 4.1 |

*Characteristics, including particle size distribution measurements (i.e. $D_{10}$, $D_{50}$, & $D_{90}$), particle size distribution span, mean particle size, and BET surface area, of the silica based component types used in the sample dielectric substrates CS1-CS9 are summarized in Table 2 below.*

TABLE 5

Silica Based Component Characteristics

| Silica Based Component Type | $D_{10}(\mu m)$ | $D_{50}(\mu m)$ | $D_{90}(\mu m)$ | PSDS ($D_{90}$ - $D_{10}$)/$D_{50}$ | Mean Particle Size ($\mu m$) | BET Surface Area ($m^2/g$) |
|---|---|---|---|---|---|---|
| CA | 4.9 | 13.9 | 30.4 | 1.83 | 16.3 | 3.3 |
| CB | 4.1 | 7.3 | 12.6 | 1.16 | 7.9 | 4.6 |
| CC | 4.6 | 6.9 | 11.1 | 0.94 | 7.5 | 2.6 |

*Performance properties of each sample dielectric substrates CS1-S9 are summarized in Table 6 below. The summarized performance properties include the permittivity of the sample dielectric substrate measured at 5GHz ("Dk (5GHz)"), the dissipation factor of the substrate measured at 5 GHz, 20% RH ("Df (5GHz, 20% RH)"), the dissipation factor of the sample dielectric substrate measured at 5 GHz, 80% RH ("Df (5GHz, 80% RH)"), and the coefficient of thermal expansion of the sample dielectric substrate ("CTE").*

TABLE 6

Performance Properties

| Sample No. | Dk (5 GHz) | Df (5 GHz, 20% RH) | Df (5 GHz, 80% RH) | CTE (ppm/° C.) |
|---|---|---|---|---|
| CS1 | 2.55 | 0.0006 | 0.0009 | 25 |
| CS2 | 2.60 | 0.0008 | 0.0009 | 24 |
| CS3 | 2.53 | 0.0008 | 0.0018 | 31 |
| CS4 | 3.02 | 0.0005 | 0.0005 | 56 |
| CS5 | 2.64 | 0.0012 | 0.0026 | 30 |
| CS6 | 3.04 | 0.0017 | 0.0025 | 40 |
| CS7 | 2.71 | 0.0008 | 0.0013 | 36 |
| CS8 | 2.83 | 0.0015 | 0.0026 | 42 |
| CS9 | 2.82 | 0.0007 | 0.0014 | 31 |

Example 3

Sample dielectric substrates S13-S28 were configured and formed according to certain embodiments described herein.

Each sample dielectric substrate was formed using a cast film process where a fluoropolymer pre-treated polyimide carrier belt is passed through a dip pan containing an aqueous forming mixture (i.e. the combination of the resin matrix component and the ceramic filler component) at the base of the coating tower. The coated carrier belt then passes through a metering zone in which metering bars remove excess dispersion from the coated carrier belt. After the metering zone, the coated carrier belt passes into a drying zone maintained at a temperature between 82° C. and 121° C. to evaporate the water. The coated carrier belt with the dried film then passes through a bake zone maintained at a temperature between 315° C. and 343° C. Finally, the carrier belt passes through a fusing zone maintained at a temperature between 349° C. and 399° C. to sinter, i.e. coalesce, the resin matrix material. The coated carrier belt then passes through a cooling plenum from which it can be directed either to a subsequent dip pan to begin formation of a further layer of the film or to a stripping apparatus. When the desired film thickness is achieved, the films are stripped off of the carrier belt.

The resin matrix component for each sample dielectric substrates S13-S28 is polytetrafluoroethylene (PTFE). Further configuration and composition details of each dielectric substrate S13-S28, including details regarding the bonding layer type, thickness and percent, are summarized in Table 7 below.

TABLE 7

Sample Dielectric Substrate Configuration and Composition

| | | | Dielectric Substrate Composition | | | | | | |
|---|---|---|---|---|---|---|---|---|---|
| Sample No. | Sample Thickness (mil) | Silica Based Component Type | Ceramic Filler Component (vol. % of dielectric substrate) | Resin Matrix Component (vol. % of dielectric substrate) | First Filler Material Silica Based Component (vol. % of Ceramic Filler Component) | Second Ceramic Filler Material ($TiO_2$) (vol. % of Ceramic Filler Component) | Bonding Layer Type | Thickness (μm) | Percent (%) |
| S13 | 4 | A | 54.0 | 46.0 | 100.0 | 0.0 | PFA | 1.5 | 3.0 |
| S14 | 6 | A | 54.0 | 46.0 | 100.0 | 0.0 | PFA | 1.4 | 1.8 |
| S15 | 4 | A | 54.0 | 46.0 | 100.0 | 0.0 | PFA | 1.6 | 3.1 |
| S16 | 6 | A | 54.0 | 46.0 | 96.3 | 3.7 | PFA | — | — |
| S17 | 4 | A | 50.0 | 50.0 | 100.0 | 0.0 | PFA | 0.5 | 1.0 |
| S18 | 4 | A | 50.0 | 50.0 | 100.0 | 0.0 | PFA | 2.4 | 4.7 |
| S19 | 4 | A | 54.0 | 46.0 | 100.0 | 0.0 | PFA | 2.8 | 5.5 |
| S20 | 6 | A | 54.0 | 46.0 | 100.0 | 0.0 | PFA | 2.7 | 3.5 |
| S21 | 6 | A | 54.0 | 46.0 | 100.0 | 0.0 | PFA | 2.5 | 3.3 |
| S22 | 4 | A | 54.0 | 46.0 | 100.0 | 0.0 | PFA | 2.0 | 3.9 |
| S23 | 4 | A | 54.0 | 46.0 | 100.0 | 0.0 | PFA | 1.5 | 3.0 |
| S24 | 4 | A | 54.0 | 46.0 | 100.0 | 0.0 | PFA | 1.6 | 3.1 |
| S25 | 6 | A | 54.0 | 46.0 | 100.0 | 0.0 | PFA | 1.6 | 2.1 |
| S26 | 4 | A | 54.0 | 46.0 | 100.0 | 0.0 | PFA | 1.8 | 3.5 |
| S27 | 4 | A | 54.0 | 46.0 | 100.0 | 0.0 | PFA | 1.0 | 2.0 |
| S28 | 6 | A | 54.0 | 46.0 | 96.3 | 3.7 | PFA | 1.0 | 1.3 |

*Characteristics, including particle size distribution measurements (i.e. $D_{10}$, $D_{50}$ & $D_{90}$), particle size distribution span, mean particle size, and BET surface area, of the silica based component types used in the sample dielectric substrates* S13-S28 *are summarized in Table 2 above.*

*Performance properties of each sample dielectric substrates* S13-S28 *are summarized in Table 8 below. The summarized performance properties include the permittivity of the sample dielectric substrate measured at 5GHz ("Dk (5GHz)"), the dissipation factor of the substrate measured at 5 GHz, 20% RH ("Df (5GHz, 20% RH)"), the dissipation factor of the sample dielectric substrate measured at 5 GHz, 80% RH ("Df (5GHz, 80% RH)"), and the coefficient of thermal expansion of the sample dielectric substrate ("CTE").*

TABLE 8

| | Performance Properties | | | |
|---|---|---|---|---|
| Sample No. | Dk (5 GHz) | Df (5 GHz, 20% RH) | Df (5 GHz, 80% RH) | CTE (ppm/° C.) |
| S13 | 2.74 | 0.0004 | 0.0005 | 53 |
| S14 | 2.77 | 0.0005 | 0.0006 | 54 |
| S15 | 2.78 | 0.0004 | 0.0006 | 58 |
| S16 | 2.92 | 0.0006 | 0.0007 | 46 |
| S17 | 2.72 | 0.0004 | 0.0007 | 64 |
| S18 | 2.68 | 0.0005 | 0.0005 | 69 |
| S19 | 2.70 | 0.0005 | 0.0007 | 61 |
| S20 | 2.69 | 0.0005 | 0.0005 | 57 |
| S21 | 2.72 | 0.0005 | 0.0005 | 63 |
| S22 | 2.76 | 0.0005 | 0.0006 | 58 |
| S23 | 2.71 | 0.0004 | 0.0006 | 51 |
| S24 | 2.71 | 0.0004 | 0.0006 | 64 |
| S25 | 2.73 | 0.0004 | 0.0006 | 58 |
| S26 | 2.73 | 0.0005 | 0.0006 | 61 |
| S27 | 2.72 | 0.0004 | 0.0005 | 62 |
| S28 | 2.98 | 0.0006 | 0.0007 | 52 |

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A copper clad laminate comprising a copper foil layer, and a dielectric substrate overlying the copper foil layer, wherein the dielectric substrate comprises:
a first fluoropolymer based adhesive layer, a polyimide layer in direct contact with the fluoropolymer based adhesive layer, and a first filled polymer layer overlying the polyimide layer,
wherein the first filled polymer layer comprises a first resin matrix component comprising a perfluoropolymer; and
a first ceramic filler component,
wherein the first ceramic filler component comprises a first filler material comprising a silica filler material,
wherein the silica filler material further comprises a mean particle size of at not greater than about 10 microns,
wherein a particle size distribution of the silica filler material comprises a $D_{10}$ of at least about 0.2 microns and not greater than about 1.6 microns, and
wherein a particle size distribution of the silica filler material comprises a $D_{50}$ of at least about 0.5 microns and not greater than about 2.7 microns.

2. The copper-clad laminate of claim 1, wherein the first fluoropolymer based adhesive layer has an average thickness of at least about 0.2 microns and not greater than about 7 microns.

3. The copper-clad laminate of claim 1, wherein the first filler material of the first ceramic filler component comprises a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

4. The copper-clad laminate of claim 1, wherein the first filler material further comprises an average surface area of not greater than about 10 m$^2$/g.

5. The copper-clad laminate of claim 1, wherein the perfluoropolymer comprises a copolymer of tetrafluoroethylene (TFE); a copolymer of hexafluoropropylene (HFP); a terpolymer of tetrafluoroethylene (TFE); polytetrafluoroethylene (PTFE), perfluoroalkoxy polymer resin (PFA), fluorinated ethylene propylene (FEP), or any combination thereof.

6. The copper-clad laminate of claim 1, wherein the content of the first resin matrix component is at least about 45 vol. % and not greater than about 63 vol. % for a total volume of the first filled polymer layer.

7. The copper-clad laminate of claim 1, wherein the content of the ceramic filler component is at least about 30 vol. % and not greater than about 57 vol. % for a total volume of the dielectric substrate.

8. The copper-clad laminate of claim 1, wherein the content of the first filler material is at least about 80 vol. % and not greater than about 100 vol. % for a total volume of the first ceramic filler component.

9. The copper-clad laminate of claim 1, wherein the dielectric substrate comprises a dissipation factor (5 GHz, 20% RH) of not greater than about 3.5.

10. The copper-clad laminate of claim 1, wherein the dielectric substrate comprises a coefficient of thermal expansion (all axes) of not greater than about 80 ppm/° C.

11. The copper-clad laminate of claim 1, wherein the copper-clad laminate comprises a peel strength between the copper foil layer and the dielectric substrate of at least about 6 lb/in.

12. A printed circuit board comprising a copper-clad laminate, wherein the copper-clad laminate comprises:
a copper foil layer, and a dielectric substrate overlying the copper foil layer, wherein the dielectric substrate comprises:
a first fluoropolymer based adhesive layer, a polyimide layer in direct contact with the fluoropolymer based adhesive layer, and a first filled polymer layer the polyimide layer,
wherein the first filled polymer layer comprises a first resin matrix component comprising a perfluoropolymer; and a first ceramic filler component, wherein the first ceramic filler component comprises a first filler material comprising a silica filler material, and wherein the silica filler material further comprises a mean particle size of at not greater than about 10 microns,
wherein a particle size distribution of the silica filler material comprises a $D_{10}$ of at least about 0.2 microns and not greater than about 1.6 microns, and
wherein a particle size distribution of the silica filler material comprises a $D_{50}$ of at least about 0.5 microns and not greater than about 2.7 microns.

13. The printed circuit board of claim 12, wherein the first fluoropolymer based adhesive layer has an average thickness of at least about 0.2 microns and not greater than about 7 microns.

14. The printed circuit board of claim 12, wherein the first filler material of the first ceramic filler component comprises a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

15. The printed circuit board of claim 12, wherein the first filler material further comprises an average surface area of not greater than about 10 m$^2$/g.

16. The printed circuit board of claim 12, wherein the first filler material comprises a silica based compound.

17. A method of forming a dielectric substrate, wherein the method comprises:
providing a first fluoropolymer based adhesive layer;
providing a polyimide layer in direct contact with the first fluoropolymer based adhesive layer;
combining a first resin matrix precursor component comprising a perfluoropolymer and a first ceramic filler precursor component to form a forming mixture; and
forming the forming mixture into a first filled polymer layer overlying the polyimide layer, wherein the first ceramic filler precursor component comprises a silica filler material,
wherein the silica filler material further comprises a mean particle size of not greater than about 10 microns,
wherein a particle size distribution of the silica filler material comprises a $D_{10}$ of at least about 0.2 microns and not greater than about 1.6 microns, and wherein a particle size distribution of the silica filler material comprises a $D_{50}$ of at least about 0.5 microns and not greater than about 2.7 microns.

* * * * *